(12) United States Patent
Hitomi et al.

(10) Patent No.: US 10,989,846 B2
(45) Date of Patent: Apr. 27, 2021

(54) NEAR INFRARED ABSORBING COMPOSITION, NEAR INFRARED CUT FILTER, METHOD OF MANUFACTURING NEAR INFRARED CUT FILTER, SOLID IMAGE PICKUP ELEMENT, CAMERA MODULE, AND IMAGE DISPLAY DEVICE

(71) Applicant: FUJIFILM Corporation, Tokyo (JP)

(72) Inventors: Seiichi Hitomi, Haibara-gun (JP); Takashi Kawashima, Haibara-gun (JP); Keisuke Arimura, Haibara-gun (JP); Takahiro Okawara, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 16/008,209

(22) Filed: Jun. 14, 2018

(65) Prior Publication Data
US 2018/0292586 A1   Oct. 11, 2018

Related U.S. Application Data

(63) Continuation of application No. PCT/JP2016/087338, filed on Dec. 15, 2016.

(30) Foreign Application Priority Data

Dec. 18, 2015   (JP) .............................. JP2015-247488

(51) Int. Cl.
| | | |
|---|---|---|
| C08K 5/29 | (2006.01) | |
| G02B 5/22 | (2006.01) | |
| C08L 33/10 | (2006.01) | |
| C08L 43/04 | (2006.01) | |
| C08L 101/02 | (2006.01) | |
| C08K 5/00 | (2006.01) | |
| C08L 101/10 | (2006.01) | |
| C08K 5/52 | (2006.01) | |
| H01L 27/146 | (2006.01) | |
| G02B 5/20 | (2006.01) | |
| C08L 101/12 | (2006.01) | |
| C08K 5/3437 | (2006.01) | |
| G02B 5/00 | (2006.01) | |
| H01L 27/14 | (2006.01) | |
| C08K 5/3417 | (2006.01) | |
| C08K 5/16 | (2006.01) | |

(Continued)

(52) U.S. Cl.
CPC ................. *G02B 5/22* (2013.01); *C08K 5/00* (2013.01); *C08K 5/0091* (2013.01); *C08K 5/01* (2013.01); *C08K 5/16* (2013.01); *C08K 5/29* (2013.01); *C08K 5/3417* (2013.01); *C08K 5/3437* (2013.01); *C08K 5/5205* (2013.01); *C08K 5/54* (2013.01); *C08L 33/10* (2013.01); *C08L 43/04* (2013.01); *C08L 101/02* (2013.01); *C08L 101/025* (2013.01); *C08L 101/10* (2013.01); *C08L 101/12* (2013.01); *G02B 5/003* (2013.01); *G02B 5/208* (2013.01); *G02B 5/223* (2013.01); *G02B 5/281* (2013.01); *H01L 27/14* (2013.01); *H01L 27/14621* (2013.01); *H01L 27/14625* (2013.01)

(58) Field of Classification Search
CPC combination set(s) only.
See application file for complete search history.

(56) References Cited

U.S. PATENT DOCUMENTS

| | | | |
|---|---|---|---|
| 7,990,034 B2 * | 8/2011 | Cha ......................... | H01J 11/12 313/112 |
| 2009/0026909 A1 | 1/2009 | Cha et al. | |
| 2015/0192718 A1 * | 7/2015 | Saito ...................... | G02B 5/208 359/359 |

FOREIGN PATENT DOCUMENTS

| | | | |
|---|---|---|---|
| CN | 101573409 | * | 11/2009 |
| JP | 2008-268267 A | | 11/2008 |

(Continued)

OTHER PUBLICATIONS

International Preliminary Report on Patentability and Written Opinion of the International Searching Authority(Forms PCT/IB/326, PCT/IB/373 and PCT/ISA/237), dated Jun. 28, 2018, for International Application No. PCT/JP2016/087338, with an English Translation of the Written Opinion.

(Continued)

*Primary Examiner* — Monique R Peets
(74) *Attorney, Agent, or Firm* — Birch, Stewart, Kolasch & Birch, LLP

(57) ABSTRACT

Provided are a near infrared absorbing composition with which a cured film having excellent solvent resistance and thermal shock resistance can be manufactured, a near infrared cut filter, a method of manufacturing a near infrared cut filter, a solid image pickup element, a camera module, and an image display device. The near infrared absorbing composition includes: a resin A that satisfies the following condition a1; an infrared absorber B; and a solvent D. At least the resin A has a crosslinking group, or the near infrared absorbing composition further includes a compound C having a crosslinking group that is different from the resin A.

condition a1: in a case where the resin A does not have a crosslinking group, a glass transition temperature of the resin A measured by differential scanning calorimetry is 0° C. to 100° C., and in a case where the resin A has a crosslinking group, a glass transition temperature of a resin having a structure in which a portion which forms a crosslinking bond in the crosslinking group of the resin A is substituted with a hydrogen atom is 0° C. to 100° C., the glass transition temperature being measured by differential scanning calorimetry.

18 Claims, 2 Drawing Sheets

(51) Int. Cl.
  *C08K 5/01* (2006.01)
  *C08K 5/54* (2006.01)
  *G02B 5/28* (2006.01)

(56) References Cited

FOREIGN PATENT DOCUMENTS

| JP | 2009-31747 A | 2/2009 |
| JP | 2013-182028 A | 9/2013 |
| JP | 2013-195480 A | 9/2013 |
| JP | 2015-1649 A | 1/2015 |
| JP | 2015-17244 A | 1/2015 |
| JP | 2015-60183 A | 3/2015 |
| WO | WO 99/26951 A1 | 6/1999 |
| WO | WO 2008/084653 A1 | 7/2008 |
| WO | WO 2008/087964 A1 | 7/2008 |

OTHER PUBLICATIONS

International Search Report (Form PCT/ISA/210), dated Mar. 21, 2017, for corresponding International Application No. PCT/JP2016/087338, with an English translation.
Japanese Office Action, dated Jun. 25, 2019, for Japanese Application No. 2017-556116, with an English translation.
Japanese Office Action, dated Feb. 4, 2020; for corresponding Japanese Application No. 2017-556116, with an English translation.
Japanese Office Action for corresponding Japanese Application No. 2017-556116, dated Sep. 29, 2020, with English translation.
Nitto Denko Corporation, "Adhesive Design Technology," URL:https://www.nitto.com/jp/ja/rd/base/adhesive/specificat/, Sep. 23, 2020, 5 pages.

\* cited by examiner

NEAR INFRARED ABSORBING COMPOSITION, NEAR INFRARED CUT FILTER, METHOD OF MANUFACTURING NEAR INFRARED CUT FILTER, SOLID IMAGE PICKUP ELEMENT, CAMERA MODULE, AND IMAGE DISPLAY DEVICE

CROSS-REFERENCE TO RELATED APPLICATIONS

This application is a Continuation of PCT International Application No. PCT/JP2016/087338 filed on Dec. 15, 2016, which claims priority under 35 U.S.C § 119(a) to Japanese Patent Application No. 2015-247488 filed on Dec. 18, 2015. Each of the above application(s) is hereby expressly incorporated by reference, in its entirety, into the present application.

BACKGROUND OF THE INVENTION

1. Field of the Invention

The present invention relates to a near infrared absorbing composition, a near infrared cut filter, a method of manufacturing a near infrared cut filter, a solid image pickup element, a camera module, and an image display device.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to near infrared light is used. Therefore, it is necessary to correct visibility, and a near infrared cut filter is used in many cases.

JP2015-060183A describes that a near infrared cut filter or the like is manufactured using a near infrared absorbing composition including a phthalocyanine compound and a resin.

On the other hand, JP2015-001649A describes an optical filter including: a substrate; a tetraazaporphyrin colorant that is provided in the substrate; a diimmonium near infrared absorbing colorant that is formed of an amorphous material of a diimmonium salt; an ultraviolet absorber; a light stabilizer that is formed of a copper complex or a nickel complex; and an adhesive layer including an acrylic pressure sensitive adhesive. Paragraph "0092" of JP2015-001649A describes that a glass transition temperature (Tg) of an acrylic (co)polymer is preferably −40° C. to 40° C. and more preferably −30° C. to 10° C.

SUMMARY OF THE INVENTION

For a near infrared absorbing composition, not only manufacturing of a cured film having excellent visible transparency and infrared shielding properties but also manufacturing of a cured film having excellent solvent resistance are required. The reason for this is that the cured film may be formed by multiple coating or another film such as a protective film may be further formed on the cured film.

In addition, the present inventors performed an investigation on a cured film that is formed using a near infrared absorbing composition including an infrared absorber and a resin, and found that, in a case where the cured film is used in an environment where a difference in air temperature is large, defects such as cracking, fogging, or peeling occur in the cured film. Hereinafter, durability of the cured film against a difference in air temperature will be referred to as "thermal shock resistance". In particular, it was found that, in a case where a cured film is formed on a substrate using the above-described near infrared absorbing composition, the cured film is stretched by the substrate at a low temperature such that cracking is likely to occur in the cured film and thermal shock resistance is likely to deteriorate. In addition, even in a cured film that is formed using the near infrared absorbing composition described in JP2015-060183A, thermal shock resistance is not sufficient.

On the other hand, JP2015-001649A describes a technique relating to the optical filter that includes the diimmonium near infrared absorbing colorant and the adhesive layer including the acrylic pressure sensitive adhesive. JP2015-001649A describes that the adhesive layer of the optical filter is used in a state where it is attached to a display or the like. However, the adhesive layer of the optical filter described in JP2015-001649A has poor solvent resistance.

Accordingly, an object of the present invention is to provide a near infrared absorbing composition with which a cured film having excellent solvent resistance and thermal shock resistance can be manufactured, a near infrared cut filter, a method of manufacturing a near infrared cut filter, a solid image pickup element, a camera module, and an image display device.

As a result of thorough investigation, the present inventors found that the object of the present invention can be achieved using a near infrared absorbing composition having a configuration described below, thereby completing the present invention. The present invention provides the following.

<1> A near infrared absorbing composition comprising:
a resin A that satisfies the following condition a1;
an infrared absorber B; and
a solvent D,
in which at least the resin A has a crosslinking group or the near infrared absorbing composition further comprises a compound C having a crosslinking group that is different from the resin A,
condition a1: in a case where the resin A does not have a crosslinking group, a glass transition temperature of the resin A measured by differential scanning calorimetry is 0° C. to 100° C., and in a case where the resin A has a crosslinking group, a glass transition temperature of a resin having a structure in which a portion which forms a crosslinking bond in the crosslinking group of the resin A is substituted with a hydrogen atom is 0° C. to 100° C., the glass transition temperature being measured by differential scanning calorimetry.

<2> The near infrared absorbing composition according to <1>,
in which the resin A includes a repeating unit derived from a monomer component in which a glass transition temperature of a homopolymer is 70° C. or lower.

<3> The near infrared absorbing composition according to <1> or <2>,
in which the resin A includes a repeating unit having a crosslinking group.

<4> The near infrared absorbing composition according to any one of <1> to <3>,
wherein the crosslinking group is at least one selected from the group consisting of a group having an ethylenically unsaturated bond, a cyclic ether group, and an alkoxysilyl group.

<5> The near infrared absorbing composition according to any one of <1> to <3>,
in which the crosslinking group is an alkoxysilyl group.
<6> The near infrared absorbing composition according to any one of <1> to <5>,
in which a weight-average molecular weight of the resin A is 1000 to 300000.
<7> The near infrared absorbing composition according to any one of <1> to <6>,
in which the resin A has an alkoxysilyl group, and
a silicon valence of the resin A is 1.0 to 3.0 mmol/g.
<8> The near infrared absorbing composition according to any one of <1> to <7>,
in which the near infrared absorbing composition comprises the compound C,
the compound C is a compound having an alkoxysilyl group, and
a silicon valence of the compound C is 3.0 to 8.0 mmol/g.
<9> The near infrared absorbing composition according to any one of <1> to <8>,
in which a content of the compound C is 1 to 60 parts by mass with respect to 100 parts by mass of the resin A.
<10> The near infrared absorbing composition according to any one of <1> to <9>,
in which the infrared absorber B is at least one selected from the group consisting of a copper compound, a cyanine compound, a pyrrolopyrrole compound, a squarylium compound, a phthalocyanine compound, and a naphthalocyanine compound.
<11> The near infrared absorbing composition according to any one of <1> to <10>,
in which the infrared absorber B is a copper compound, and
the copper compound is a copper complex which includes a compound having four or five sites coordinating to copper as a ligand.
<12> The near infrared absorbing composition according to any one of <1> to <11>, which is a composition for forming a near infrared cut filter.
<13> A near infrared cut filter which is obtained using the near infrared absorbing composition according to any one of <1> to <12>.
<14> A method of manufacturing a near infrared cut filter, in which the near infrared absorbing composition according to any one of <1> to <12> is used.
<15> A solid image pickup element comprising:
the near infrared cut filter according to <13>.
<16> A camera module comprising:
the near infrared cut filter according to <13>.
<17> An image display device comprising:
the near infrared cut filter according to <13>.

According to the present invention, a near infrared absorbing composition with which a cured film having excellent solvent resistance and thermal shock resistance can be manufactured, a near infrared cut filter, a method of manufacturing a near infrared cut filter, a solid image pickup element, a camera module, and an image display device can be provided.

DESCRIPTION OF THE PREFERRED EMBODIMENTS

Figure 1:
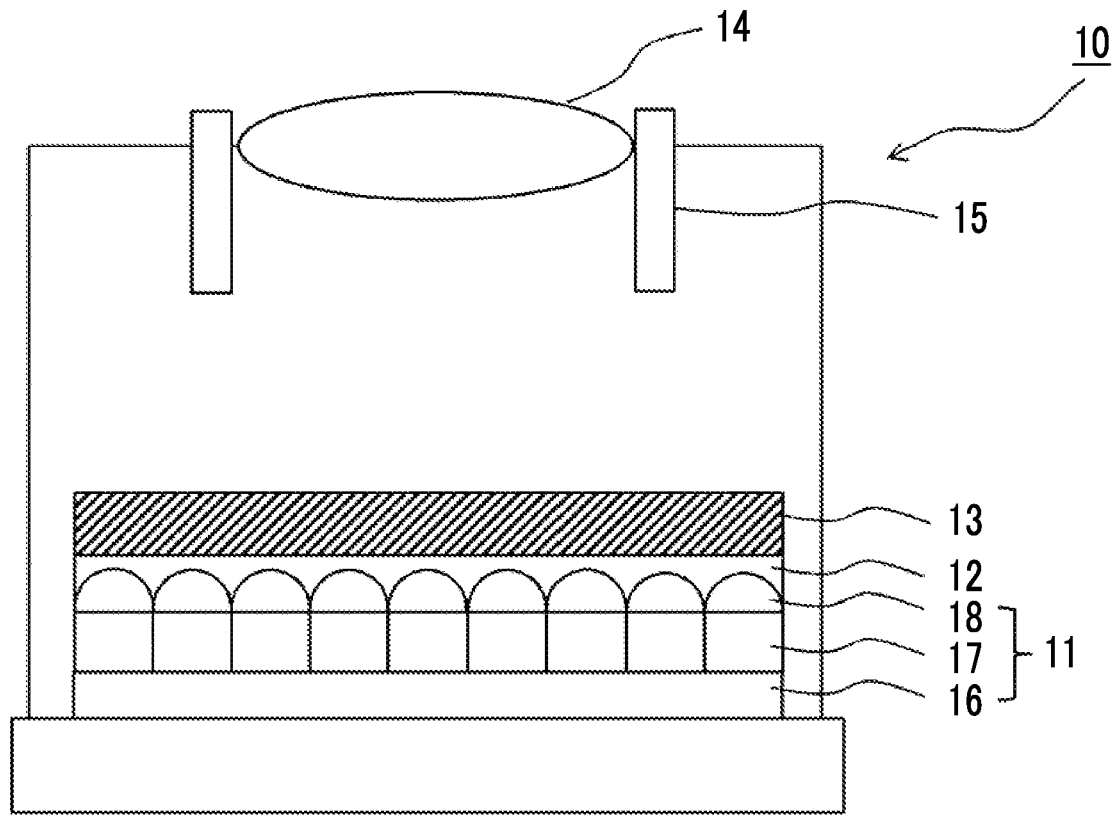
FIG. 1 is a schematic cross-sectional view showing a configuration of a camera module including a near infrared cut filter according to an embodiment of the present invention.

Hereinafter, the details of the present invention will be described. In this specification of the present application, numerical ranges represented by "to" include numerical values before and after "to" as lower limit values and upper limit values.

In this specification, "(meth)acrylate" denotes either or both of acrylate or methacrylate, "(meth)allyl" denotes either or both of allyl and methallyl, "(meth)acryl" denotes either or both of acryl and methacryl, and "(meth)acryloyl" denotes either or both of acryloyl and methacryloyl.

In this specification, unless specified as a substituted group or as an unsubstituted group, a group (atomic group) denotes not only a group (atomic group) having no substituent but also a group (atomic group) having a substituent.

In this specification, in a chemical formula, Me represents a methyl group, Et represents an ethyl group, Pr represents a propyl group, Bu represents a butyl group, and Ph represents a phenyl group.

In this specification, "near infrared light" denotes light (electromagnetic wave) in a wavelength range of 700 to 2500 nm.

In this specification, a total solid content denotes the total mass of all the components of the composition excluding a solvent.

In this specification, a weight-average molecular weight and a number-average molecular weight are defined as values in terms of polystyrene obtained by gel permeation chromatography (GPC).

<Near Infrared Absorbing Composition>

A near infrared absorbing composition according to the present invention includes: a resin A that satisfies the following condition a1; an infrared absorber B; and a solvent D. At least the resin A has a crosslinking group, or the near infrared absorbing composition further includes a compound C having a crosslinking group that is different from the resin A.

condition a1: in a case where the resin A does not have a crosslinking group, a glass transition temperature of the resin A measured by differential scanning calorimetry is 0° C. to 100° C., and in a case where the resin A has a crosslinking group, a glass transition temperature of a resin having a structure in which a portion which forms a crosslinking bond in the crosslinking group of the resin A is substituted with a hydrogen atom is 0° C. to 100° C., the glass transition temperature being measured by differential scanning calorimetry.

Since the resin A that satisfies the condition a1 has excellent flexibility, the flexibility of the obtained cured film is improved. Therefore, during cooling of the cured film, thermal stress can be relaxed, and excellent thermal shock resistance can be obtained. In addition, in the near infrared absorbing composition according to the present invention, the resin A has a crosslinking group, and/or the near infrared absorbing composition includes the compound C having a crosslinking group. Therefore, the crosslinking group functions as a crosslinking point to form a crosslinked structure between the resins A or between the resin A and the compound C such that a cured film having excellent solvent resistance can be obtained. Accordingly, according to the present invention, a cured film having excellent solvent resistance and excellent thermal shock resistance can be manufactured.

In the present invention, a glass transition temperature (Tg) of a resin refers to a boundary temperature at which motility of the resin largely changes. The glass transition temperature of the resin described in the present invention refers to a value measured using a differential scanning calorimeter (DSC1000, manufactured by Seiko Instruments Inc.) after weighing 5 mg of a polymer in a sample pan and heating the polymer from −20° C. to 200° C. at a temperature increase rate of 10° C./min in a nitrogen stream. The average value of a temperature at which the baseline starts to deviate and a temperature at which the curve returns to a new baseline is set as the glass transition temperature of the resin.

In addition, regarding the condition a1 of the present invention, in a case where the resin A has a crosslinking group, "a glass transition temperature of a resin having a structure in which a portion which forms a crosslinking bond in the crosslinking group of the resin A is substituted with a hydrogen atom is 0° C. to 100° C., the glass transition temperature being measured by differential scanning calorimetry." That is, in a case where the resin A has a crosslinking group, the glass transition temperature of the resin having a structure in which a portion which forms a crosslinking bond in the crosslinking group of the resin A is substituted with a hydrogen atom can be considered as the glass transition temperature of the resin A. The flexibility can be improved by adjusting the glass transition temperature of the resin A to be in a predetermined range, and a cured film having excellent thermal shock resistance can be manufactured as shown below in Examples of the present invention by adjusting the glass transition temperature of the resin having a structure in which a portion which forms a crosslinking bond in the crosslinking group of the resin A is substituted with a hydrogen atom to be in a predetermined range. It is considered that a portion of the resin A other than the portion having a crosslinking bond contributes to the flexibility of the cured film. Therefore, it is presumed that, by adjusting the glass transition temperature of the structure to be in a predetermined structure, a cured film having excellent thermal shock resistance can be manufactured.

Hereinafter, each component of the near infrared absorbing composition according to the present invention will be described.

<<Resin A>>

The near infrared absorbing composition according to the present invention, the resin A that satisfies the above-described condition a1. The kind of the resin is not particularly limited as long as it can be used for an optical material. As the resin A, a resin having high transparency is preferable. Specific examples of the resin A include: a polyolefin resin such as polyethylene, polypropylene, carboxylated polyolefin, chlorinated polyolefin, or a cycloolefin polymer; a polystyrene resin; a (meth)acrylic resin such as a (meth) acrylic acid ester resin or a (meth)acrylamide resin; a vinyl acetate resin; a vinyl halide resin; a polyvinyl alcohol resin; a polyamide resin; a polyurethane resin; a polyester resin such as polyethylene terephthalate (PET) or polyarylate (PAR); a polycarbonate resin; an epoxy resin; a polymaleimide resin; a polyurea resin; and a polyvinyl acetal resin such as a polyvinyl butyral resin. Among these, a (meth) acrylic acid ester resin, a (meth)acrylamide resin, a polyurethane resin, a polyester resin, a polymaleimide resin, or a polyurea resin is preferable, a (meth)acrylic acid ester resin, a (meth)acrylamide resin, or a polyurethane resin, or a polyester resin is more preferable, and a (meth)acrylic acid ester resin or a (meth)acrylamide resin is still more preferable.

In a case where the resin A does not have a crosslinking group, a glass transition temperature of the resin A measured by differential scanning calorimetry is 0° C. to 100° C. The lower limit of the glass transition temperature is preferably 10° C. or higher, more preferably 15° C. or higher, and still more preferably 20° C. or higher. The upper limit of the glass transition temperature is preferably 80° C. or lower and more preferably 75° C. or lower.

In a case where the resin A has a crosslinking group, a glass transition temperature of a resin having a structure in which a portion which forms a crosslinking bond in the crosslinking group of the resin A is substituted with a hydrogen atom is 0° C. to 100° C., the glass transition temperature being measured by differential scanning calorimetry. The lower limit of the glass transition temperature is preferably 10° C. or higher and more preferably 15° C. or higher. The upper limit of the glass transition temperature is preferably 80° C. or lower and more preferably 70° C. or lower.

The case where the resin A has a crosslinking group will be described using a specific example. For example, in a case where the resin A is a resin having any one of the following structures A-101 to A-104, a glass transition temperature of a resin having any one of the following structures A-101a to A-104a measured by differential scanning calorimetry is 0° C. to 100° C. Using this resin, the glass transition temperature of the resin A is obtained.

Here, "the portion which forms a crosslinking bond in the crosslinking group" refers to a portion which reacts due to the action of heat, light or a radical to form a crosslinking bond. For example, in the case of a group having an ethylenically unsaturated bond such as a vinyl group, a (meth)allyl group, a (meth)acryloyl group, or a (meth) acryloyloxy group, the ethylenically unsaturated bond corresponds to the portion which forms a crosslinking bond. In a case where the group having an ethylenically unsaturated bond is used as the crosslinking group, the ethylenically unsaturated bond (—C≡C—) is substituted (—CH$_2$) with a hydrogen atom. In addition, in the case of a cyclic ether group such as an epoxy group (oxiranyl group) or an oxetanyl group, the cyclic ether group corresponds to the portion which forms a crosslinking bond. In a case where the group having an ethylenically unsaturated bond is used as the crosslinking group, the cyclic ether group is substituted with a hydrogen atom. In addition, in the case of a methylol group, the methylol group corresponds to the portion which forms a crosslinking bond. In a case where the methylol group is used as the crosslinking group, the methylol group is substituted with a hydrogen atom. In addition, in the case of an alkoxysilyl group, the alkoxysilyl group corresponds to the portion which forms a crosslinking bond. In a case where the alkoxysilyl group is used as the crosslinking group, the alkoxysilyl group is substituted with a hydrogen atom.

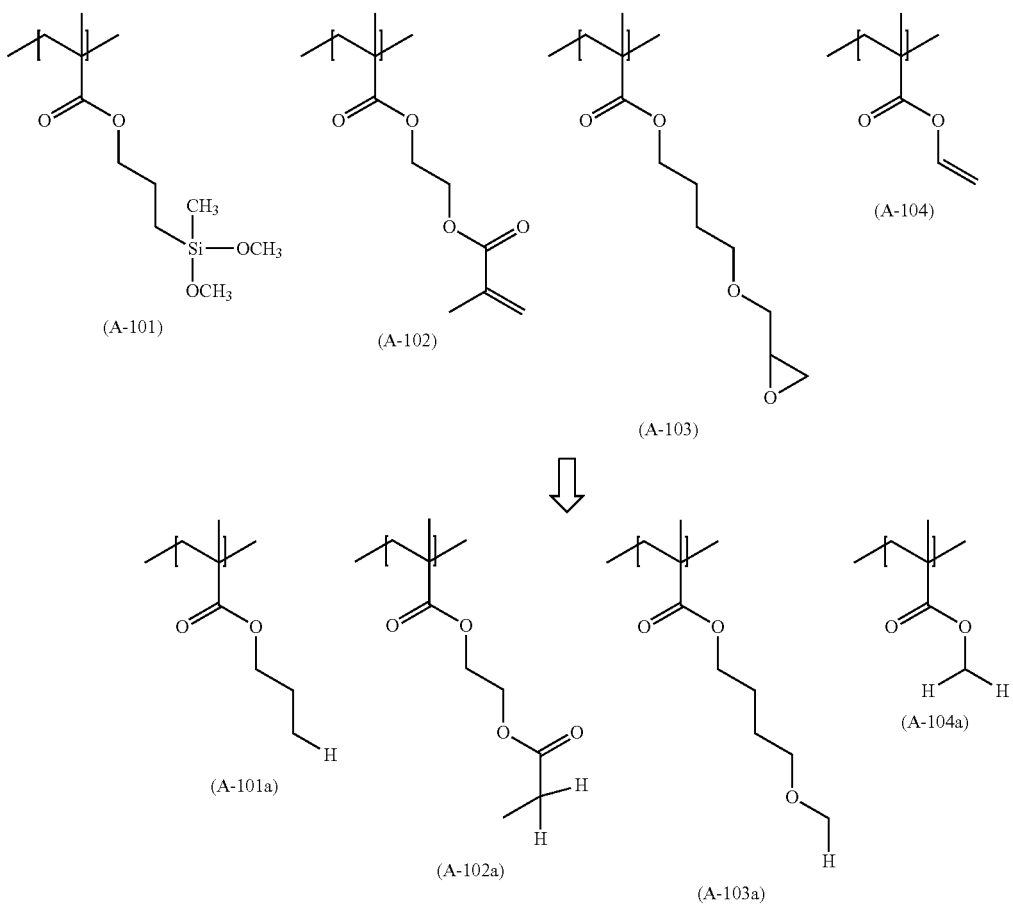

In the present invention, two or more kinds may be used as the resin A.

In a case where two or more resins A are used, a difference between the glass transition temperatures of the two resins A is preferably in a range of 0° C. to 90° C. In addition, it is also preferable that a resin Aa having a glass transition temperature in a range of 0° C. to 100° C. (preferably 0° C. to 75° C. and more preferably 20° C. to 75° C.) and a resin Ab having a glass transition temperature in a range of 0° C. to 100° C. (preferably 0° C. to 75° C. and more preferably 20° C. to 75° C.) are used in combination. In a case where two or more resins A are used, it is preferable that the resins A include at least one kind selected from the group consisting of a resin having a glass transition temperature of 50° C. to 75° C., a resin having a glass transition temperature of 20° C. or higher and lower than 50° C., a resin having a glass transition temperature of 0° C. or higher and lower 20° C., and a resin having a glass transition temperature of higher than 75° C. and lower than 100° C., and it is more preferable that the resins A include at least one kind selected from the group consisting of a resin having a glass transition temperature of 50° C. to 75° C. and a resin having a glass transition temperature of 20° C. or higher and lower than 50° C.

Examples of a preferable combination are as follows. Among these, (1) to (4) are preferable, (1) to (3) are preferable, and (1) is still more preferable.

(1) A combination of a resin having a glass transition temperature of 50° C. to 75° C. and a resin having a glass transition temperature of 20° C. or higher and lower than 50° C.

(2) A combination of a resin having a glass transition temperature of 50° C. to 75° C. and a resin having a glass transition temperature of 0° C. or higher and lower 20° C.

(3) A combination of a resin having a glass transition temperature of 50° C. to 75° C. and a resin having a glass transition temperature of higher than 75° C. and lower than 100° C.

(4) A combination of a resin having a glass transition temperature of 20° C. or higher and lower than 50° C. and a resin having a glass transition temperature of 0° C. or higher and lower 20° C.

(5) A combination of a resin having a glass transition temperature of 20° C. or higher and lower than 50° C. and a resin having a glass transition temperature of higher than 75° C. and lower than 100° C.

(6) A combination of a resin having a glass transition temperature of 0° C. or higher and lower 20° C. and a resin having a glass transition temperature of higher than 75° C. and lower than 100° C.

In the present invention, the crosslinking group refers to a group having a portion which reacts due to the action of heat, light or a radical to form a crosslinking bond. Specific examples of the crosslinking group include a group having an ethylenically unsaturated bond, a cyclic ether group, a methylol group, and an alkoxysilyl group.

Examples of the group having an ethylenically unsaturated bond include a vinyl group, a (meth)allyl group, a (meth)acryloyl group, and a (meth)acryloyloxy group.

Examples of the cyclic ether group include an epoxy group (an oxiranyl group), an oxetanyl group, and an alicyclic epoxy group. Examples of the alicyclic epoxy group include the following group.

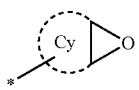

In the formula, Cy represents a cyclic alkyl group, and * represents a direct bond. The number of carbon atoms in the cyclic alkyl group is preferably 3 to 20. The upper limit is preferably 15 or less and more preferably 10 or less. The lower limit is, for example, preferably 4 or more, more preferably 5 or more, and still more preferably 6 or more.

Examples of the alkoxysilyl group include a monoalkoxysilyl group, a dialkoxysilyl group, and a trialkoxysilyl group.

It is preferable that the resin A includes a repeating unit derived from a monomer component a in which a glass transition temperature of a homopolymer is 70° C. or lower. The glass transition temperature of the homopolymer of the monomer component a is more preferably −40° C. to 70° C. and still more preferably −40° C. to 50° C. By the resin A including the repeating unit derived from the monomer component a, the flexibility of the resin A is improved, and the thermal shock resistance of the obtained cured film tends to be improved.

The content of the repeating unit derived from the monomer component a is preferably 1 to 100 mass % with respect to the total mass of all the repeating units of the resin A. The lower limit is more preferably 10 mass % or higher and still more preferably 20 mass % or higher. The upper limit is more preferably 90 mass % or lower and still more preferably 80 mass % or lower.

It is preferable that the resin A includes at least one repeating unit selected from the group consisting of repeating units represented by the following Formulae (A1-1) to (A1-3), and It is more preferable that the resin A includes at least one repeating unit selected from the group consisting of the repeating unit represented by the following Formula (A1-1) and the repeating unit represented by the following Formula (A1-3). With this aspect, the thermal shock resistance of the obtained cured film tends to be improved. In addition, in a case where a copper compound is used as an infrared absorber, by using a resin including the repeating unit represented by the following Formula (A1-3), the compatibility between the copper compound and the resin A can be improved, and a cured film having reduced precipitates can be manufactured.

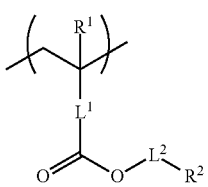

(A1-1)

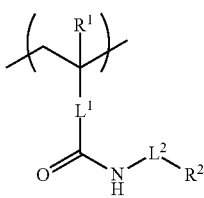

(A1-2)

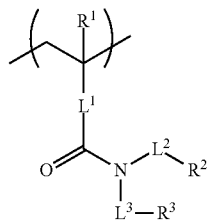

(A1-3)

In Formulae (A1-1) to (A1-3), $R^1$ represents a hydrogen atom or an alkyl group, $L^1$ to $L^3$ each independently represent a single bond or a divalent linking group, $R^2$ and $R^3$ each independently represent a hydrogen atom, an aliphatic hydrocarbon group, or an aromatic group.

In Formulae (A1-1) to (A1-3), $R^1$ represents a hydrogen atom or an alkyl group. The number of carbon atoms in the alkyl group is preferably 1 to 5, more preferably 1 to 3, and still more preferably 1. The alkyl group is preferably linear or branched and more preferably linear. It is preferable that $R^1$ represents a hydrogen atom or a methyl group.

In Formulae (A1-1) to (A1-3), $L^1$ to $L^3$ each independently represent a single bond or a divalent linking group. Examples of the divalent linking group include an alkylene group, an arylene group, —O—, —S—, —SO—, —CO—, —COO—, —OCO—, —SO$_2$—, —NR$^{10}$— ($R^{10}$ represents a hydrogen atom or an alkyl group), and a group including a combination thereof. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. As the arylene group, an arylene group having 6 to 18 carbon atoms is preferable, an arylene group having 6 to 14 carbon atoms is more preferable, an arylene group having 6 to 10 carbon atoms is still more preferable, and a phenylene group is even still more preferable.

In Formulae (A1-1) to (A1-3), it is preferable that $L^1$ represents a single bond.

In Formulae (A1-1) to (A1-3), it is preferable that $L^2$ and $L^3$ each independently represent a single bond, an alkylene group, or a group including a combination of an alkylene group and —O—.

In addition, the number of atoms constituting a chain which is formed by $L^2$ and $R^2$ in Formula (A-1) is preferably 2 or more, more preferably 3 or more, and still more preferably 4 or more. The upper limit is not particularly limited and is, for example, 100 or less or 50 or less.

In Formulae (A1-1) to (A1-3), $R^2$ and $R^3$ each independently represent a hydrogen atom, an aliphatic hydrocarbon group, or an aromatic group. The aliphatic hydrocarbon group and the aromatic group may be unsubstituted or may have a substituent. Examples of the substituent include groups described below regarding a substituent T.

Examples of the aliphatic hydrocarbon group include an alkyl group and an alkenyl group. The alkyl group may be linear, branched, or cyclic. The number of carbon atoms in the alkyl group is preferably 1 to 30, more preferably 1 to 20, and still more preferably 1 to 10. The alkenyl group may be linear, branched, or cyclic. The number of carbon atoms in the alkenyl group is preferably 2 to 30, more preferably 2 to 20, and still more preferably 2 to 10.

Examples of the aromatic group include an aryl group and a heteroaryl group. The number of carbon atoms in the aryl group is preferably 6 to 30, more preferably 6 to 20, and still more preferably 6 to 12. The number of carbon atoms constituting the heteroaryl group is preferably 1 to 30 and more preferably 1 to 12. Examples of the kind of the heteroatom constituting the heteroaryl group include a nitrogen atom, an oxygen atom, and a sulfur atom. The number of heteroatoms constituting the heteroaryl group is preferably 1 to 4, more preferably 1 to 3, and still more preferably 1 or 2. The heteroaryl group is preferably a monocycle or a fused ring, more preferably a monocycle or a fused ring composed of 2 to 8 rings, and still more preferably a monocycle or a fused ring composed of 2 to 4 rings.

It is preferable that $R^2$ represents an alkyl group. It is preferable that $R^3$ represents an alkyl group or an aryl group.

Specific examples of the repeating units represented by Formulae (A1-1) to (A1-3) are as follows.

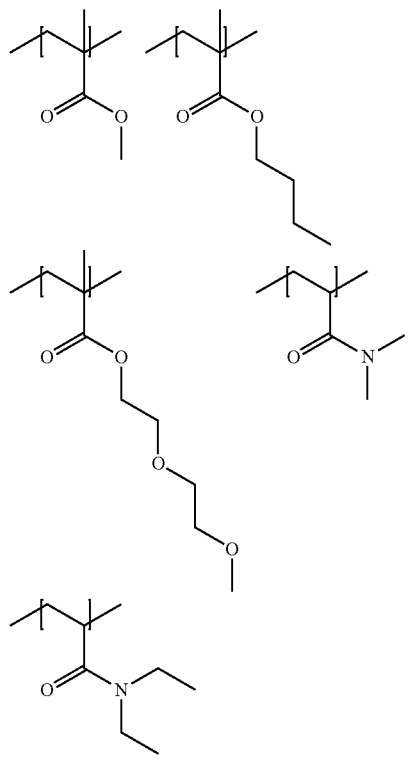

In the resin A, the content of the at least one of the repeating units represented by Formulae (A1-1) to (A1-3) (preferably the repeating unit represented by Formula (A1-3)) is preferably 1 to 90 mass % and more preferably 10 to 80 mass % with respect to the total mass of all the repeating units of the resin A. According to this aspect, a cured film having excellent thermal shock resistance can be easily obtained.

In addition, it is also preferable that the resin A includes the repeating unit represented by Formula (A1-1) and the repeating unit represented by Formula (A1-3). In this case, the content of the repeating unit represented by Formula (A1-1) is preferably 1 to 90 mass % and more preferably 10 to 80 mass % with respect to the total mass of all the repeating units of the resin A. In addition, the content of the repeating unit represented by Formula (A1-3) is preferably 1 to 90 mass % and more preferably 10 to 80 mass % with respect to the total mass of all the repeating units of the resin A.

It is preferable that the resin A further includes a repeating unit having a crosslinking group. According to this aspect, the solvent resistance and thermal shock resistance of the cured film can be further improved.

Examples of the crosslinking group include the above-described examples of the crosslinking group. Among these, a group having an ethylenically unsaturated bond, a cyclic ether group, a methylol group, or an alkoxysilyl group is preferable, and a group having an ethylenically unsaturated bond, a cyclic ether group, or an alkoxysilyl group is more preferable. The details of the group having an ethylenically unsaturated bond, the cyclic ether group, and the alkoxysilyl group can be found in the description of the above-described groups. As the group having an ethylenically unsaturated bond, a (meth)acryloyl group or a (meth)acryloyloxy group is preferable. As the cyclic ether group, an epoxy group is preferable. Examples of the alkoxysilyl group include a monoalkoxysilyl group, a dialkoxysilyl group, and a trialkoxysilyl group. Among these, a dialkoxysilyl group or a trialkoxysilyl group is preferable. In addition, in a case where a copper compound is used as an infrared absorber, the alkoxysilyl group is preferable as the crosslinking group.

Examples of the repeating unit having a crosslinking group include the following (A2-1) to (A2-4). Among these, the following (A2-1) to (A2-3) are preferable.

(A2-1)

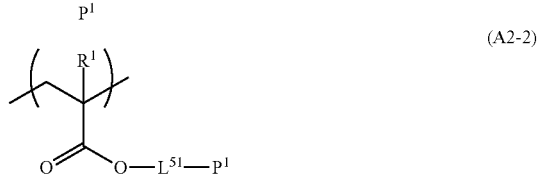
(A2-2)

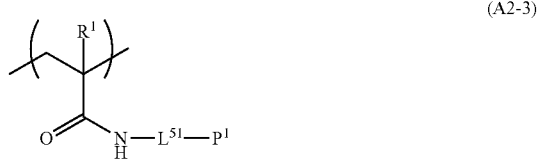
(A2-3)

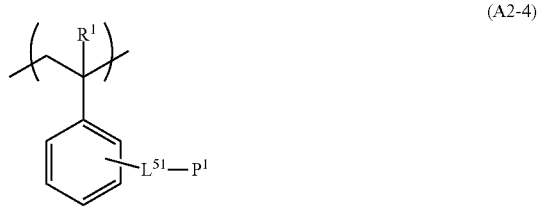
(A2-4)

$R^1$ represents a hydrogen atom or an alkyl group. The number of carbon atoms in the alkyl group is preferably 1 to 5, more preferably 1 to 3, and still more preferably 1. It is preferable that $R^1$ represents a hydrogen atom or a methyl group.

$L^{51}$ represents a single bond or a divalent linking group. Examples of the divalent linking group include the divalent linking groups represented by $L^1$ to $L^3$ in Formula (A). It is preferable that L51 represents an alkylene group or a group including a combination of an alkylene group and —O—. The number of atoms constituting a chain of L51 is preferably 2 or more, more preferably 3 or more, and still more preferably 4 or more. The upper limit is, for example, 200 or less.

P¹ represents a crosslinking group. Examples of the crosslinking group include a group having an ethylenically unsaturated bond, a cyclic ether group, a methylol group, and an alkoxysilyl group. Among these, a group having an ethylenically unsaturated bond, a cyclic ether group, or an alkoxysilyl group is preferable. The details of the group having an ethylenically unsaturated bond, the cyclic ether group, and the alkoxysilyl group can be found in the description of the above-described groups. As the group having an ethylenically unsaturated bond, a (meth)acryloyl group or a (meth)acryloyloxy group is preferable. As the cyclic ether group, an epoxy group is preferable. Examples of the alkoxysilyl group include a monoalkoxysilyl group, a dialkoxysilyl group, and a trialkoxysilyl group. Among these, a dialkoxysilyl group or a trialkoxysilyl group is preferable. In addition, in a case where a copper compound is used as an infrared absorber, the alkoxysilyl group is preferable as the crosslinking group. The number of carbon atoms in the alkoxy group of the alkoxysilyl group is preferably 1 to 5, more preferably 1 to 3, and still more preferably 1 or 2.

In a case where the resin A includes the repeating unit having a crosslinking group, the content of the repeating unit having a crosslinking group in the resin A is preferably 10 to 90 mass %, more preferably 10 to 80 mass %, and still more preferably 30 to 80 mass % with respect to the total mass of all the repeating units of the resin A. According to this aspect, a cured film having excellent solvent resistance can be easily obtained. Specific examples of the repeating unit having a crosslinking group include the following structures.

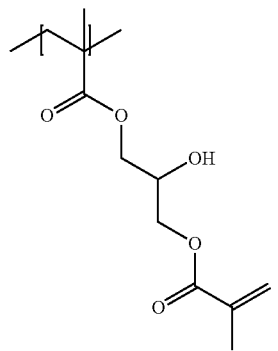

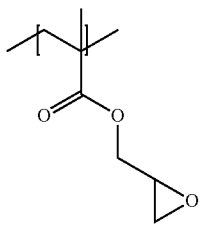

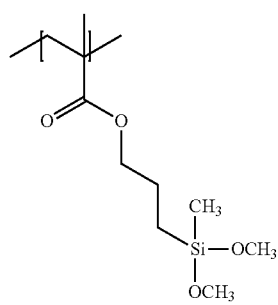

-continued

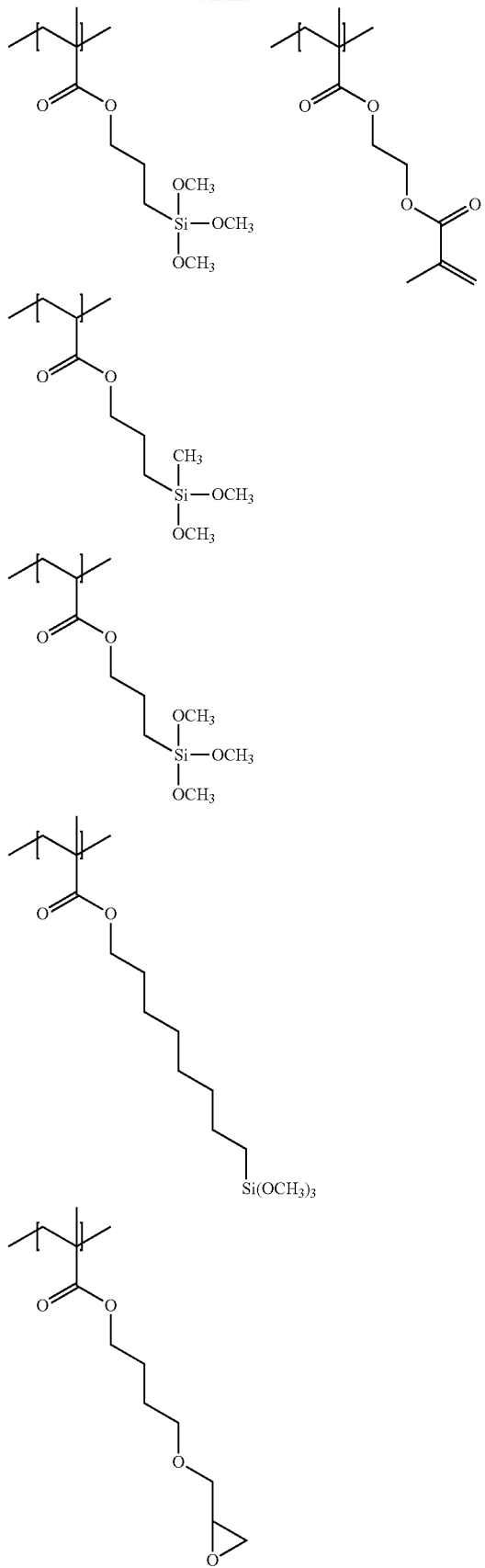

It is preferable that the resin A includes a repeating unit derived from a monomer component b in which a glass transition temperature of a homopolymer is higher than 70° C. The glass transition temperature of the homopolymer of the monomer component b is more preferably higher than 70° C. and 300° C. or lower and still more preferably higher than 70° C. and 200° C. or lower. By the resin A including the repeating unit derived from the monomer component b, the solvent resistance and the like of the obtained cured film tends to be improved.

The resin A may include a repeating unit represented by Formula (A3-1).

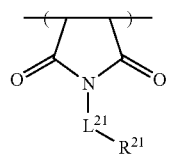

(A3-1)

In Formula (A3-1), $L^{21}$ represents a single bond or a divalent linking group, and $R^{21}$ represents a hydrogen atom, an aliphatic hydrocarbon group, or an aromatic group.

Examples of the divalent linking group represented by $L^{21}$ include an alkylene group, an arylene group, —O—, —S—, —SO—, —CO—, —COO—, —OCO—, —SO$_2$—, —NR$^{10}$— (R$^{10}$ represents a hydrogen atom or an alkyl group), and a group including a combination thereof. The number of carbon atoms in the alkylene group is preferably 1 to 30, more preferably 1 to 15, and still more preferably 1 to 10. The alkylene group may have a substituent but is preferably unsubstituted. The alkylene group may be linear, branched, or cyclic. In addition, the cyclic alkylene group may be monocyclic or polycyclic. As the arylene group, an arylene group having 6 to 18 carbon atoms is preferable, an arylene group having 6 to 14 carbon atoms is more preferable, an arylene group having 6 to 10 carbon atoms is still more preferable, and a phenylene group is even still more preferable.

Examples of the aliphatic hydrocarbon group and the aromatic group represented by $R^{21}$ in Formula (B) include the aliphatic hydrocarbon group and the aromatic group described above regarding $R^2$ and $R^3$ in Formulae (A1-1) to (A1-3).

In a case where the resin A includes the repeating unit represented by Formula (A3-1), the content of the repeating unit represented by Formula (A3-1) is preferably 1 to 70 mass % and more preferably 1 to 60 mass % with respect to the total mass of all the repeating units of the resin A. According to this aspect, a cured film having excellent solvent resistance can be easily obtained. Specific examples of the repeating unit represented by Formula (A3-1) include the following structures.

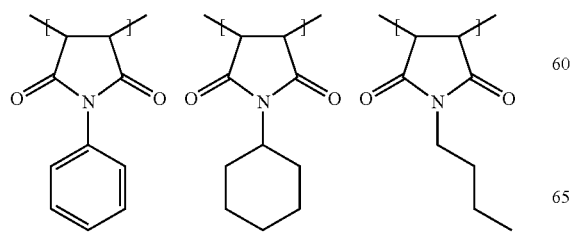

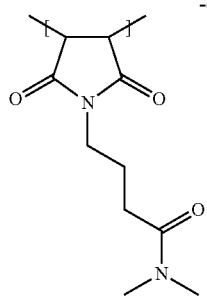

The resin A may include other repeating units in addition to the above-described repeating units. The details of components constituting the other repeating units can be found in the description of copolymerization components in paragraphs "0068" to "0075" of JP2010-106268A (corresponding to paragraphs "0112" to "0118" of US2011/0124824A), the content of which is incorporated herein by reference.

Specific examples of the resin A include the following structures. Numerical values added to the repeating unit represent a mass ratio.

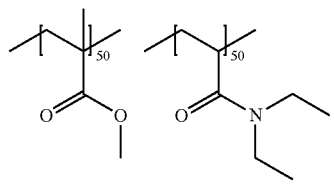

A-1

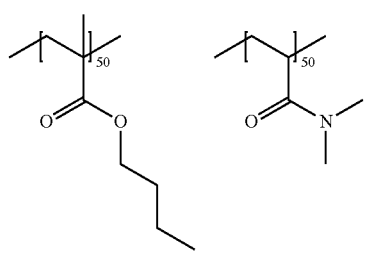

A-2

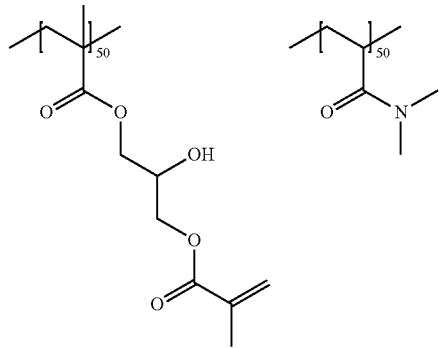

A-3

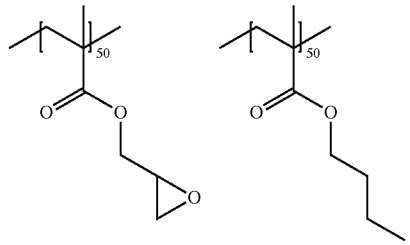

A-4

A-5
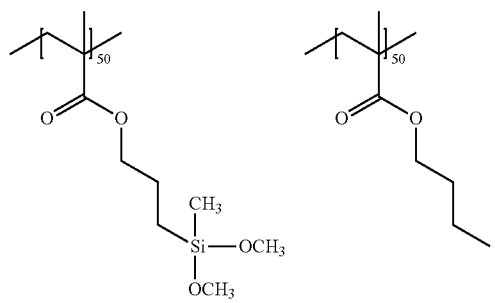
A-6
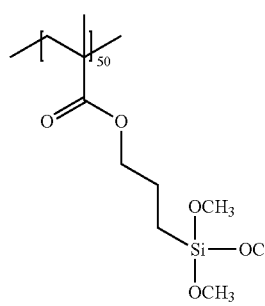 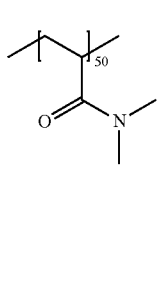
A-7
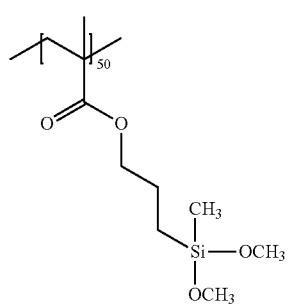 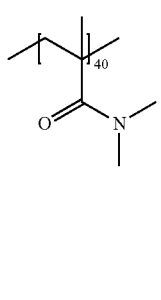
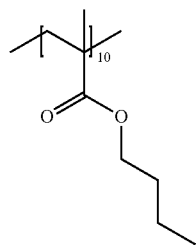
A-8
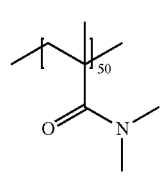
A-9
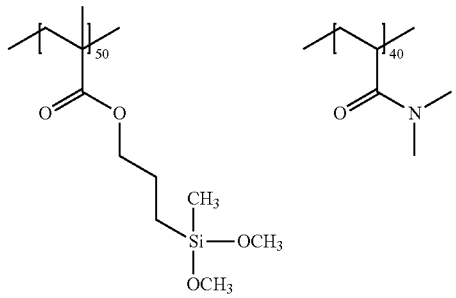
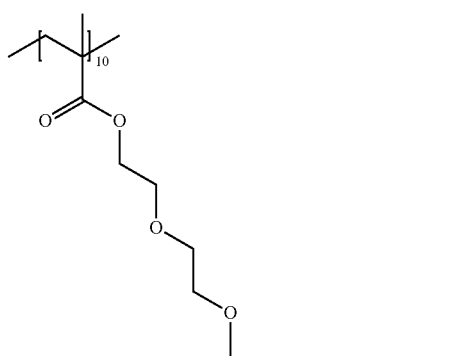
A-10
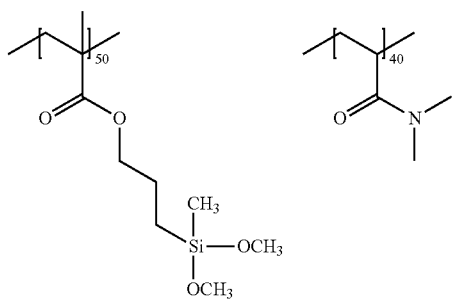
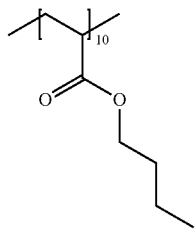
A-11
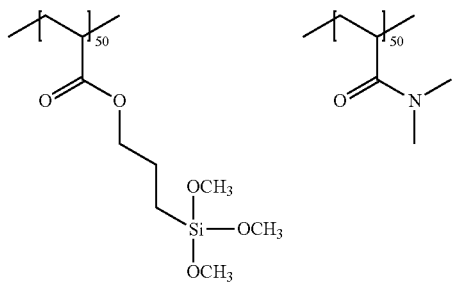

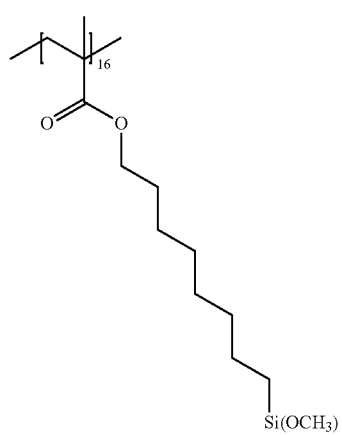 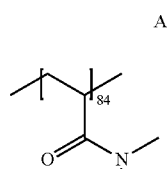
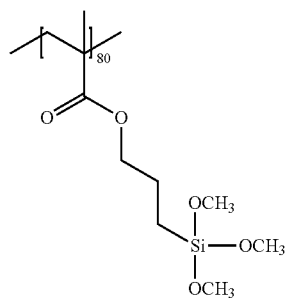 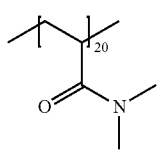
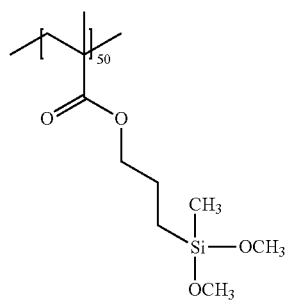 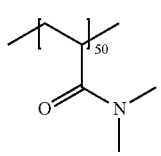
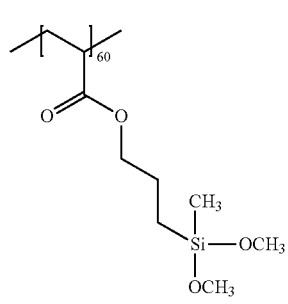 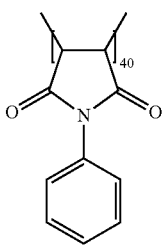
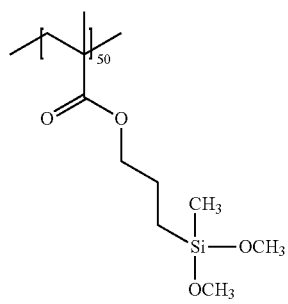 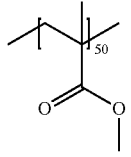
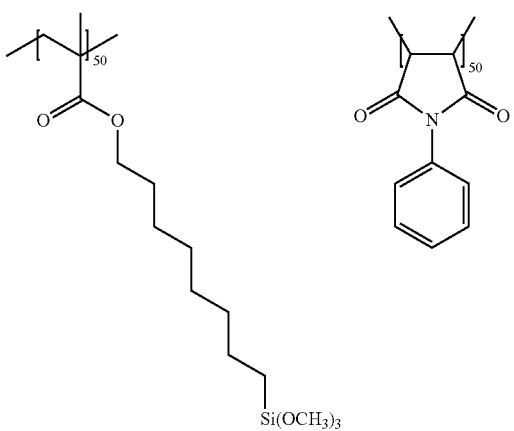
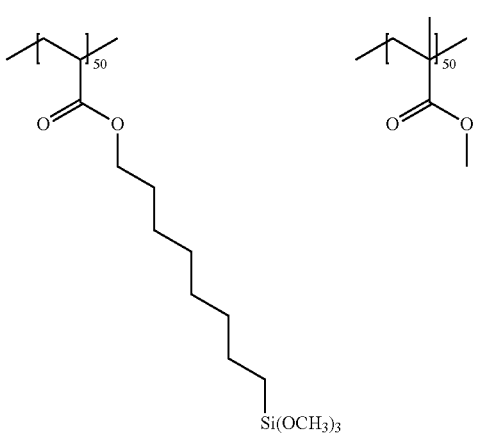
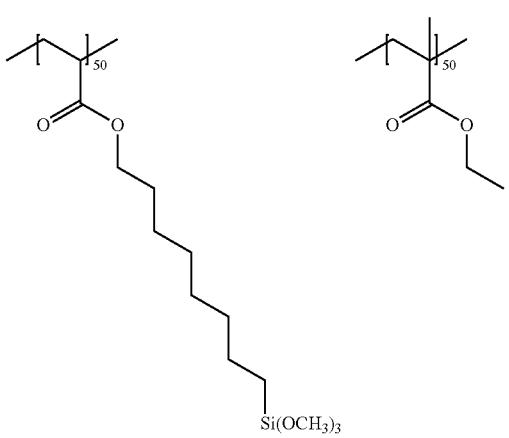
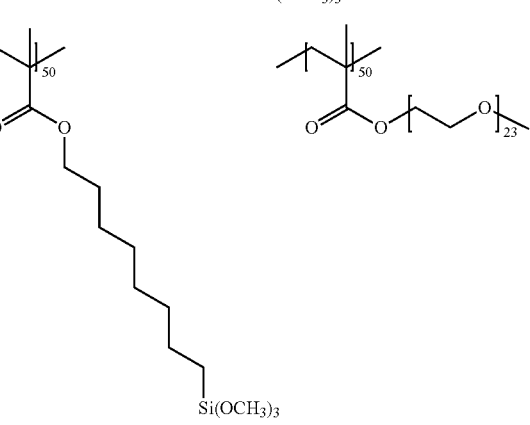

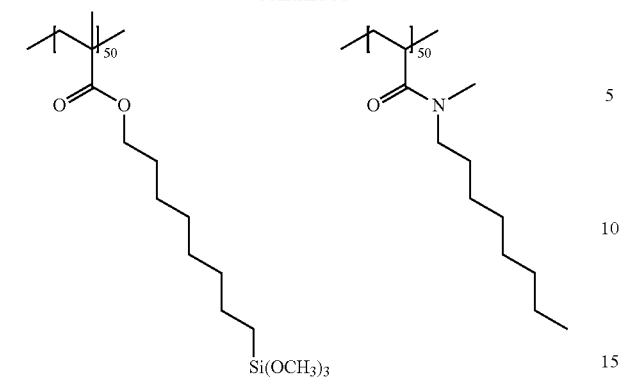
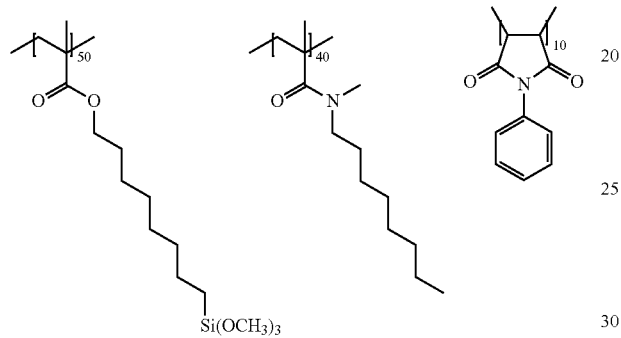
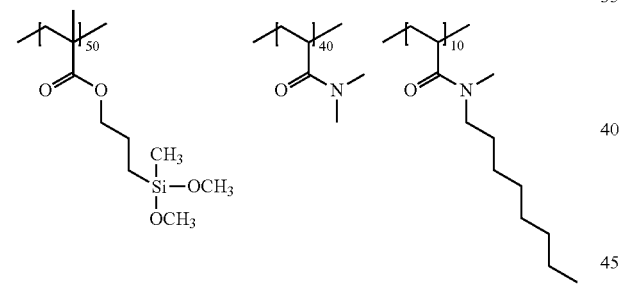
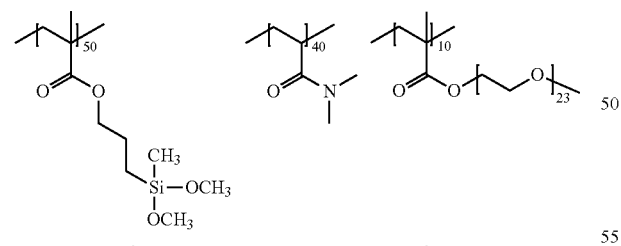
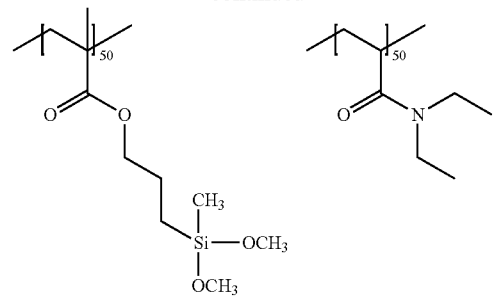
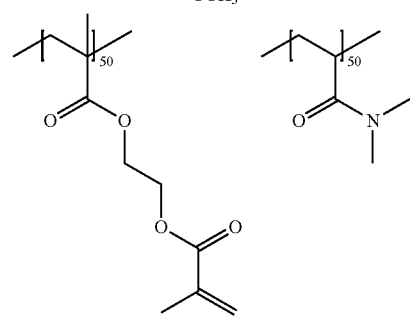
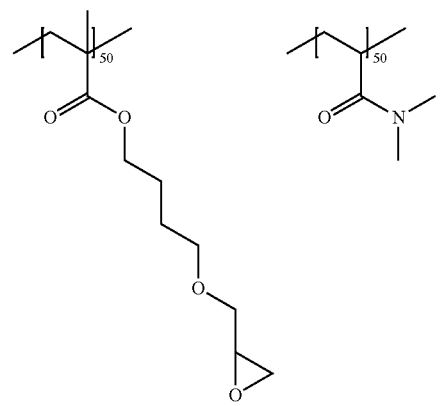
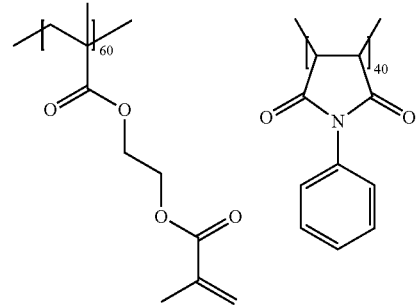
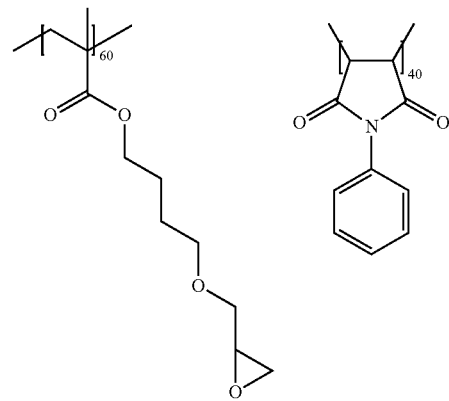

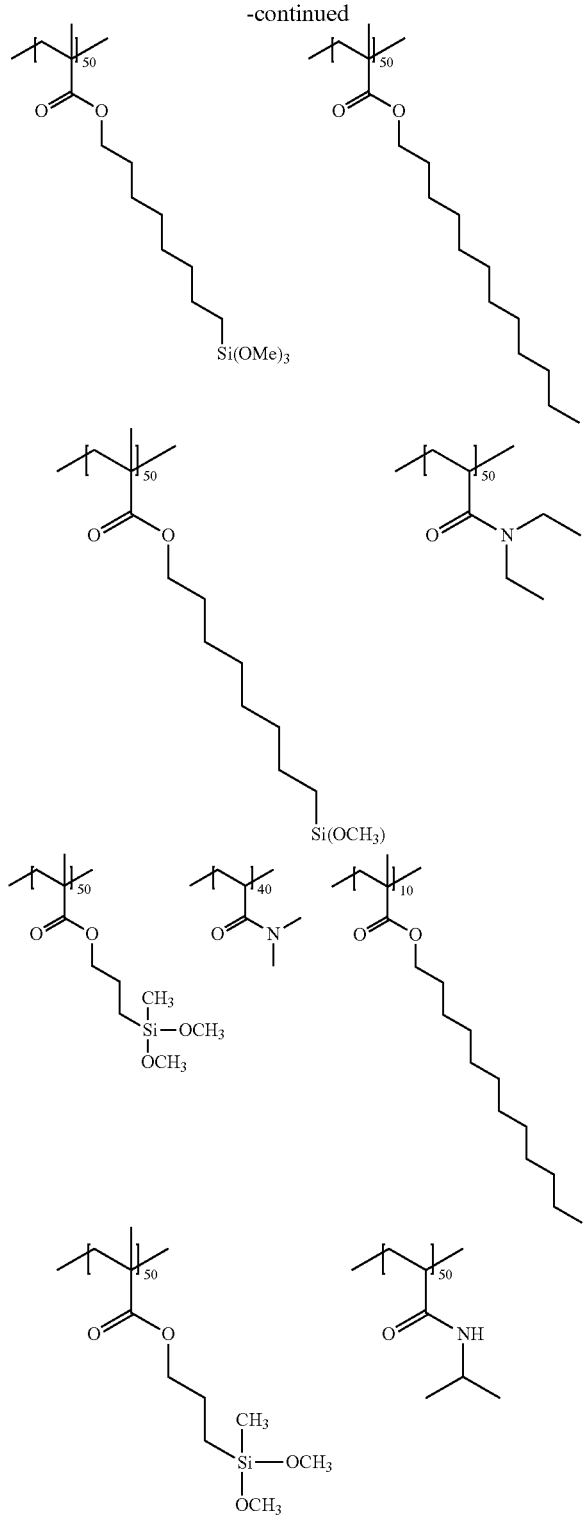

In the present invention, the weight-average molecular weight of the resin A is preferably 1000 to 300000. The lower limit is more preferably 2000 or higher and still more preferably 3000 or higher. The upper limit is more preferably 100000 or lower and still more preferably 50000 or lower. The number-average molecular weight of the resin A is preferably 500 to 150000. The lower limit is more preferably 1000 or higher and still more preferably 2000 or higher. The upper limit is more preferably 200000 or lower and still more preferably 100000 or lower.

In the near infrared absorbing composition according to the present invention, the content of the resin A is preferably 1 to 90 mass % with respect to the total solid content of the near infrared absorbing composition. The lower limit is preferably 5 mass % or higher, more preferably 10 mass % or higher, and still more preferably 15 mass % or higher. The upper limit is preferably 80 mass % or lower, and more preferably 75 mass % or lower. As the resin A, one kind may be used alone, or two or more kinds may be used. In a case where two or more resins A are used in combination, it is preferable that the total content of the two or more resins A is in the above-described range.

<<Infrared Absorber>>

The near infrared absorbing composition according to the present invention includes an infrared absorber. In the present invention, the infrared absorbers refer to compounds which have absorption in an infrared range (preferably a wavelength range of 700 to 1200 nm) and allow transmission of light having a wavelength in a visible range (preferably a range of 400 to 650 nm). As the infrared absorbers, a compound having an absorption maximum in a range of 700 to 1200 nm is preferable, and a compound having an absorption maximum in a range of 700 to 1000 nm is more preferable.

Examples of the infrared absorbers include a copper compound, a cyanine compound, a pyrrolopyrrole compound, a squarylium compound, a phthalocyanine compound, a naphthalocyanine compound, a diimmonium compound, a thiol complex compound, a transition metal oxide compound, a quaterrylene compound, and a croconium compound. Among these, a copper compound, a cyanine compound, a pyrrolopyrrole compound, a squarylium compound, a phthalocyanine compound, a naphthalocyanine compound, or a diimmonium compound is preferable and a copper compound is more preferable because a cured film having excellent infrared shielding properties and visible transparency can be easily formed.

As the pyrrolopyrrole compound, a pigment or a dye may be used. Examples of the pyrrolopyrrole compound include a pyrrolopyrrole compound described in paragraphs "0016" to "0058" of JP2009-263614A. As the cyanine compound, the phthalocyanine compound, the diimmonium compound, the squarylium compound, or the croconium compound, for example, a compound described in paragraphs "0010" to "0081" of JP2010-111750A may be used, the content of which is incorporated herein by reference. In addition the cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference. In addition, the phthalocyanine compound can be found in the description of paragraphs "0013" to "0029" of JP2013-195480A, the content of which is incorporated herein by reference.

In the near infrared absorbing composition according to the present invention, it is preferable that the content of the infrared absorber is 10 to 85 mass % with respect to the total solid content of the near infrared absorbing composition. The upper limit is preferably 80 mass % or lower, and more preferably 70 mass % or lower. The lower limit is preferably 20 mass % or higher and more preferably 30 mass % or higher. In a case where the content of the infrared absorber is in the above-described range, a cured film having excellent infrared shielding properties can be easily formed.

(Copper Compound)

In the present invention, it is preferable that the copper compound used as the infrared absorber is a copper complex. It is preferable that the copper complex is a complex of copper and a compound (ligand) having a coordination site coordinated to copper. Examples of the coordination site coordinated to copper include a coordination site coordinated by an anion and a coordinating atom coordinated by an unshared electron pair. The copper complex may include two or more ligands. In a case where the copper complex includes two or more ligands, the ligands may be the same as or different from each other. The copper complex may be tetradentate-coordinated, pentadentate-coordinated, or hexadentate-coordinated, more preferably tetradentate-coordinated or pentadentate-coordinated, and still more preferably pentadentate-coordinated. In addition, in the copper complex, it is preferable that copper and the ligand form a 5-membered ring and/or a 6-membered ring. This copper complex is stable in shape and has excellent complex stability.

In the present invention, it is also preferable that the copper complex is a copper complex other than a phthalocyanine copper complex. Here, the phthalocyanine copper complex is a copper complex in which a compound having a phthalocyanine skeleton is used as a ligand. In the compound having a phthalocyanine skeleton, the π-electron conjugated system is spread across the molecules thereof such that a planar structure is formed. The phthalocyanine copper complex absorbs light by π-π* transition. In order to absorb light in an infrared range by π-π* transition, it is necessary that a compound which forms a ligand has a long conjugated structure. However, in a case where the conjugated structure of the ligand is long, visible light transmittance tends to deteriorate. Therefore, the phthalocyanine copper complex may have insufficient visible light transmittance.

In addition, it is also preferable that the copper complex is a copper complex in which a compound having an absorption maximum in a wavelength range of 400 to 600 nm is used as a ligand. The copper complex in which a compound having an absorption maximum in a wavelength range of 400 to 600 nm is used as a ligand has absorption in a visible range (for example, a wavelength range of 400 to 600 nm). Therefore, visible light transmittance may be insufficient. Examples of the compound having an absorption maximum in a wavelength range of 400 to 600 nm include a compound which has a long conjugated structure and absorbs a large amount of light by π-π* transition. Specifically, a compound having a phthalocyanine skeleton can be used.

The copper complex can be obtained by mixing, reaction, or the like of a compound (ligand) having a coordination site coordinated to copper with a copper component (copper or a compound including copper). The compound (ligand) having a coordination site coordinated to copper may be a low molecular weight compound or a polymer. Both a low molecular weight compound and a polymer may also be used in combination.

It is preferable that the copper component is a compound including divalent copper. As the copper component, one kind may be used alone, or two or more kinds may be used in combination. As the copper component, for example, copper oxide or a copper salt can be used. As the copper salt, for example, copper carboxylate (for example, copper acetate, copper ethylacetoacetate, copper formate, copper benzoate, copper stearate, copper naphthenate, copper citrate, or copper 2-ethylhexanoate), copper sulfonate (for example, copper methanesulfonate), copper phosphate, copper phosphoric acid ester, copper phosphonate, copper phosphonic acid ester, copper phosphinate, copper amide, copper sulfone amide, copper imide, copper acyl sulfone imide, copper bissulfone imide, copper methide, alkoxy copper, phenoxy copper, copper hydroxide, copper carbonate, copper sulfate, copper nitrate, copper perchlorate, copper fluoride, copper chloride, copper bromide is preferable, copper carboxylate, copper sulfonate, copper sulfone amide, copper imide, copper acyl sulfone imide, copper bissulfone imide, alkoxy copper, phenoxy copper, copper hydroxide, copper carbonate, copper fluoride, copper chloride, copper sulfate, copper nitrate, is more preferable, copper carboxylate, copper acyl sulfone imide, phenoxy copper, copper chloride, copper sulfate, copper nitrate is still more preferable, and copper carboxylate, copper acyl sulfone imide, copper chloride, copper sulfate is even still more preferable.

In the present invention, it is preferable that the copper complex is a compound having an absorption maximum in a wavelength range of 700 to 1200 nm. It is more preferable the absorption maximum of the copper complex is present in a wavelength range of 720 to 1200 nm, and it is still more preferable the absorption maximum of the copper complex is present in a wavelength range of 800 to 1100 nm. The absorption maximum can be measured, for example, using Cary 5000 UV-Vis-NIR (spectrophotometer, manufactured by Agilent Technologies Inc.).

The molar absorption coefficient of the copper complex at the absorption maximum in the wavelength range is preferably 120 (L/mol·cm) or higher, more preferably 150 (L/mol·cm) or higher, still more preferably 200 (L/mol·cm) or higher, even still more preferably 300 (L/mol·cm) or higher, and even yet still more preferably 400 (L/mol·cm) or higher. The upper limit is not particularly limited and is, for example, 30000 (L/mol·cm) or lower. In a case where the molar absorption coefficient of the copper complex is 100 (L/mol·cm) or higher, a cured film having excellent infrared shielding properties can be formed although the film is thin.

The gram absorption coefficient of the copper complex at 800 nm is preferably 0.11 (L/g·cm) or higher, more preferably 0.15 (L/g·cm) or higher, and still more preferably 0.24 (L/g·cm) or higher.

In the present invention, the molar absorption coefficient and the gram absorption coefficient of the copper complex can be obtained by dissolving the copper complex in a solvent to prepare a solution having a concentration of 1 g/L and measuring an absorption spectrum of the solution in which the copper complex is dissolved. As a measuring device, for example, UV-1800 manufactured by Shimadzu Corporation (wavelength range: 200 to 1100 nm) or Cary 5000 manufactured by Agilent Technologies Inc. (wavelength range: 200 to 1300 nm) can be used. Examples of the measurement solvent include water, N,N-dimethylformamide, propylene glycol monomethyl ether, 1,2,4-trichlorobenzene, and acetone. In the present invention, a solvent in which the copper complex as the measurement target is soluble is selected from the above-described measurement solvents. In particular, in a case where a copper complex that is soluble in propylene glycol monomethyl ether is used, it is preferable that propylene glycol monomethyl ether is used as the measurement solvent. "Soluble" represents a state where the solubility of the copper complex in the solvent at 25° C. is higher than 0.01 g with respect to 100 g Solvent.

In the present invention, the molar absorption coefficient and the gram absorption coefficient of the copper complex are preferably values measured using any one of the above-described measurement solvents and more preferably values measured using propylene glycol monomethyl ether.

In a case where the copper compound is used as the infrared absorber, the infrared shielding properties can be improved by increasing the content of the copper in the composition. From this viewpoint, the content of the copper compound is preferably 10 mass % or higher, more preferably 20 mass % or higher, and still more preferably 30 mass % or higher in terms of copper content with respect to the total solid content of the near infrared absorbing composition. The upper limit is not particularly limited, and is preferably 70 mass % or lower and more preferably 60 mass % or lower.

<<<Low Molecular Weight Compound Type Copper Compound>>>

As the copper compound, for example, a copper complex represented by the following Formula (Cu-1) can be used. This copper complex is a copper compound in which a ligand L is coordinated to copper as central metal, and the copper is typically divalent copper. For example, the copper complex can be obtained, for example, by mixing, reaction, or the like of a compound which forms the ligand L or a salt thereof with a copper component.

$$Cu(L)_{n1} \cdot (X)_{n2} \quad \text{Formula (Cu-1)}$$

In the formula, L represents a ligand coordinated to copper, and X represents a counter ion. n1 represents an integer of 1 to 4. n2 represents an integer of 0 to 4.

X represents a counter ion. The copper compound site may be a neutral complex having no charge, a cationic complex, or an anionic complex. In this case, optionally, a counter ion is present to neutralize the charge of the copper compound.

In a case where the counter ion is a negative counter ion, for example, the counter ion may be an inorganic anion or an organic anion. Specific examples include a hydroxide ion, a halogen anion (for example, a fluoride ion, a chloride ion, a bromide ion, or an iodide ion), a substituted or unsubstituted alkylcarboxylate ion (for example, an acetate ion or a trifluoroacetate ion), a substituted or unsubstituted arylcarboxylate ion (for example, a benzoate ion), a substituted or unsubstituted alkylsulfonate ion (for example, a methanesulfonate ion, a trifluoromethanesulfonate ion), a substituted or unsubstituted arylsulfonate ion (for example, a p-toluenesulfonate ion or a p-chlorobenzenesulfonate ion), an aryldisulfonate ion (for example, a 1,3-benzenedisulfonate ion, a 1,5-naphthalene disulfonate ion, or an 2,6-naphthalenedisulfonate ion), an alkylsulfate ion (for example, a methylsulfate ion), a sulfate ion, a thiocyanate ion, a nitrate ion, a perchlorate ion, a tetrafluoroborate ion, a tetraarylborate ion, a tetrakis(pentafluorophenyl)borate ion ($B^-(C_6F_5)_4$), a hexafluorophosphate ion, a picrate ion, an amide ion (including amide substituted with an acyl group or a sulfonyl group), and a methide ion (including a methide substituted with an acyl group or a sulfonyl group). Among these, a halogen anion, a substituted or unsubstituted alkylcarboxylate ion, a sulfate ion, a nitrate ion, a tetrafluoroborate ion, a tetraarylborate ion, a hexafluorophosphate ion, an amide ion (including amide substituted with an acyl group or a sulfonyl group), a ion, an amide ion (including a methide substituted with an acyl group or a sulfonyl group), a methide ion (including a methide substituted with an acyl group or a sulfonyl group) is preferable.

In a case where the counter ion is a positive counter ion, examples of the positive counter ion include an inorganic or organic ammonium ion (for example, a tetraalkylammonium ion such as a tetrabutylammonium ion, a triethylbenzylammonium ion, or a pyridinium ion), a phosphonium ion (for example, a tetraalkylphosphonium ion such as a tetrabutylphosphonium ion, an alkyltriphenylphosphonium ion, or a triethylphenylphosphonium ion), an alkali metal ion, and a proton.

In addition, the counter ion may be a metal complex ion. In particular, the counter ion may be a salt of a copper complex, that is, a cationic copper complex or an anionic copper complex.

The ligand L is a compound having a coordination site coordinated to copper, and examples thereof include a compound having one or more selected from the group consisting of a coordination site coordinated to copper by an anion and a coordinating atom coordinated to copper by an unshared electron pair. The coordination site coordinated by an anion may or may not be dissociable. As the ligand L, a compound (multidentate ligand) having two or more coordination sites coordinated to copper is preferable. In addition, in order to improve visible transparency, it is preferable that a plurality of π-conjugated systems such as aromatic compounds are not continuously bonded to each other in the ligand L. As the ligand L, a compound monodentate ligand) having one coordination site coordinated to copper and a compound (multidentate ligand) having two or more coordination sites coordinated to copper can also be used in combination. Examples of the monodentate ligand include a monodentate ligand coordinated by an anion or an unshared electron pair. Examples of the ligand coordinated by an anion include a halide anion, a hydroxide anion, an alkoxide anion, a phenoxide anion, an amide anion (including amide substituted with an acyl group or a sulfonyl group), an imide anion (including imide substituted with an acyl group or a sulfonyl group), an anilide anion (including anilide substituted with an acyl group or a sulfonyl group), a thiolate anion, a hydrogen carbonate anion, a carboxylate anion, a thiocarboxylate anion, a dithiocarboxylate anion, a hydrogen sulfate anion, a sulfonate anion, a dihydrogen phosphate anion, a phosphoric acid diester anion, a phosphonic acid monoester anion, a hydrogen phosphonate anion, a phosphinate anion, a nitrogen-containing heterocyclic anion, a nitrate anion, a hypochlorite anion, a cyanide anion, a cyanate anion, an isocyanate anion, a thiocyanate anion, an isothiocyanate anion, and an azide anion. Examples of the monodentate ligand coordinated by an unshared electron pair include water, alcohol, phenol, ether, amine, aniline, amide, imide, imine, nitrile, isonitrile, thiol, thioether, a carbonyl compound, a thiocarbonyl compound, sulfoxide, a heterocyclic ring, carbonic acid, carboxylic acid, sulfuric acid, sulfonic acid, phosphoric acid, phosphonic acid, phosphinic acid, nitric acid, and an ester thereof.

The anion in the ligand L may be an anion capable of coordination to a copper atom in the copper component and is preferably an oxygen anion, a nitrogen anion, or a sulfur anion. It is preferable that the coordination site coordinated by an anion is at least one selected from the following Group (AN-1) of monovalent functional groups or Group (AN-2) of divalent functional groups. In the following structural formulae, a wave line represents a binding site to an atomic group constituting a ligand.

Group (AN-1)

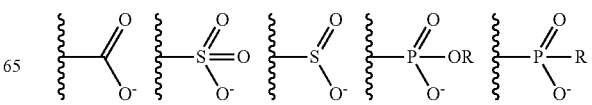

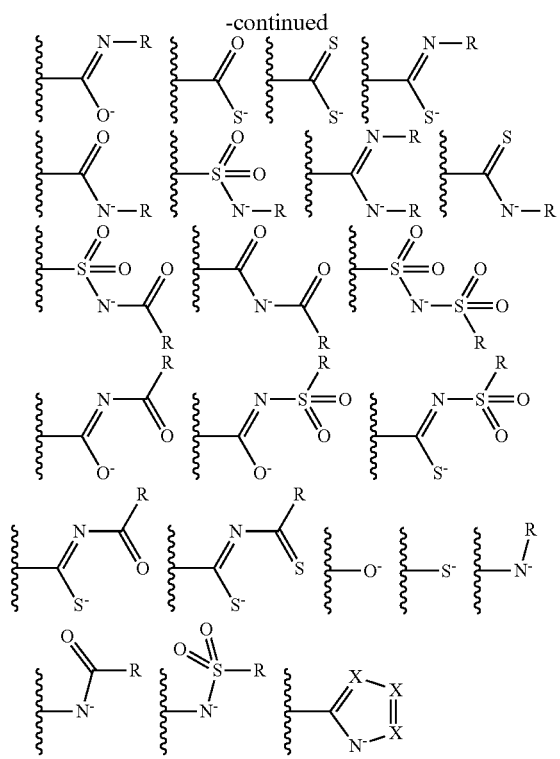

Group (AN-2)

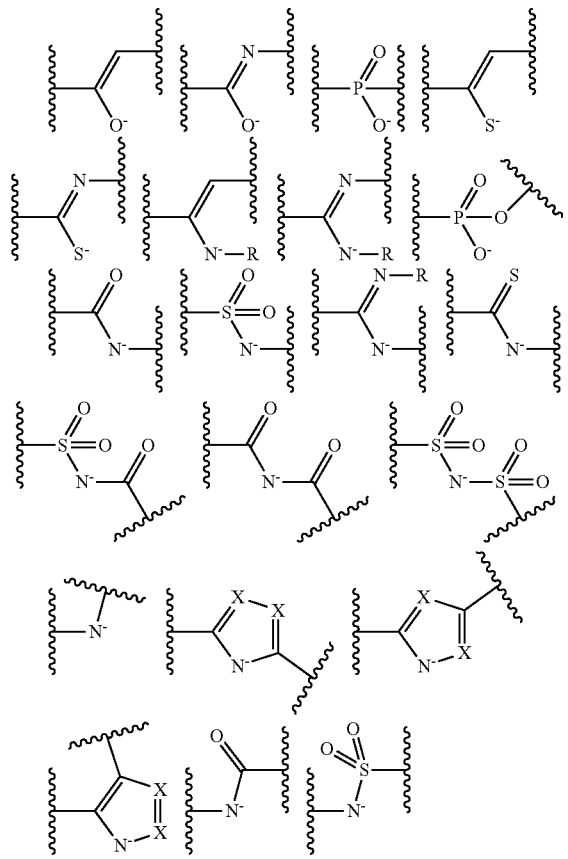

In the formulae, X represents N or CR, R's each independently represent a hydrogen atom, an alkyl group, an alkenyl group, an alkynyl group, an aryl group, or a heteroaryl group.

The alkyl group represented by R may be linear, branched, or cyclic and is preferably linear. The number of carbon atoms in the alkyl group is preferably 1 to 10, more preferably 1 to 6, and still more preferably 1 to 4. Examples of the alkyl group include a methyl group. The alkyl group may have a substituent, and examples of the substituent include a halogen atom, a carboxyl group, and a heterocyclic group. The heterocyclic group as the substituent may be monocyclic or polycyclic and may be aromatic or nonaromatic. The number of heteroatoms constituting the heterocycle is preferably 1 to 3 and more preferably 1 or 2. It is preferable that the heteroatom constituting the heterocycle is a nitrogen atom. In a case where the alkyl group has a substituent, the substituent may further have a substituent.

The alkenyl group represented by R may be linear, branched, or cyclic and is preferably linear. The number of carbon atoms in the alkenyl group is preferably 2 to 10 and more preferably 2 to 6. The alkenyl group may be unsubstituted or may have a substituent. Examples of the substituent include the above-described substituents.

The alkynyl group represented by R may be linear, branched, or cyclic and is preferably linear. The number of carbon atoms in the alkynyl group is preferably 2 to 10 and more preferably 2 to 6. The alkynyl group may be unsubstituted or may have a substituent. Examples of the substituent include the above-described substituents.

The aryl group represented by R may be monocyclic or polycyclic and is preferably monocyclic. The number of carbon atoms in the aryl group is preferably 6 to 18, more preferably 6 to 12, and still more preferably 6. The aryl group may be unsubstituted or may have a substituent. Examples of the substituent include the above-described substituents.

The heteroaryl group may be monocyclic or polycyclic. The number of heteroatoms constituting the heteroaryl group is preferably 1 to 3. It is preferable that the heteroatoms constituting the heteroaryl group are a nitrogen atom, a sulfur atom, or an oxygen atom. The number of carbon atoms in the heteroaryl group is preferably 6 to 18 and more preferably 6 to 12. The heteroaryl group may have a substituent or may be unsubstituted. Examples of the substituent include the above-described substituents.

Examples of the coordination site coordinated by an anion include a monoanionic coordination site. The monoanionic coordination site represents a site that is coordinated to a copper atom through a functional group having one negative charge. Examples of the monoanionic coordination site include an acid group having an acid dissociation constant (pka) of 12 or lower. Specific examples include an acid group having a phosphorus atom (for example, a phosphoric acid diester group, a phosphonic acid monoester group, or a phosphinic acid group), a sulfo group, a carboxyl group, and an imide acid group. Among these, a sulfo group or a carboxyl group is preferable.

As the coordinating atom coordinated by an unshared electron pair, an oxygen atom, a nitrogen atom, a sulfur atom, or a phosphorus atom is preferable, an oxygen atom, a nitrogen atom, or a sulfur atom is more preferable, an oxygen atom or a nitrogen atom is still more preferable, and a nitrogen atom is even still more preferable. In a case where the coordinating atom coordinated by an unshared electron pair is a nitrogen atom, that an atom adjacent to the nitrogen atom is preferably a carbon atom or a nitrogen atom and more preferably a carbon atom.

It is preferable that the coordinating atom coordinated by an unshared electron pair is included in a ring or at least one partial structure selected from the following Group (UE-1) of monovalent functional groups, Group (UE-2) of divalent functional groups, and Group (UE-3) of trivalent functional groups. In the following structural formulae, a wave line represents a binding site to an atomic group constituting a ligand.

Group (UE-1)

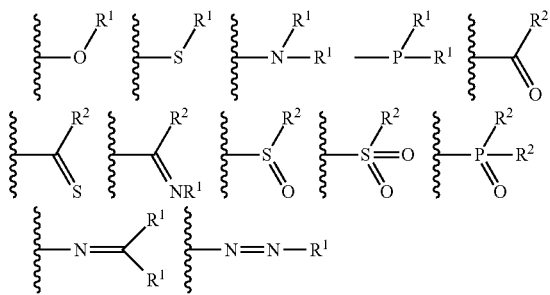

Group (UE-2)

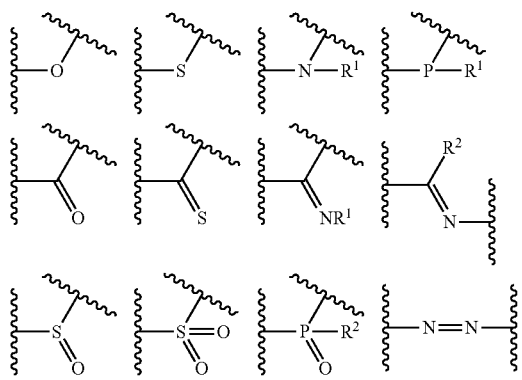

Group (UE-3)

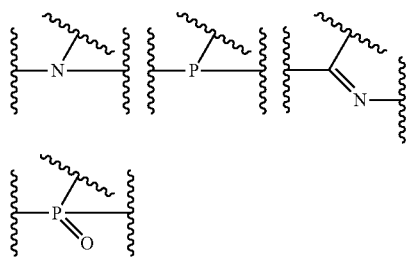

In Groups (UE-1) to (UE-3), $R^1$ represents a hydrogen atom, an alkyl group, an alkenyl group, an alkynyl group, an aryl group, or a heteroaryl group, and $R^2$ represents a hydrogen atom, an alkyl group, an alkenyl group, an alkynyl group, an aryl group, a heteroaryl group, an alkoxy group, an aryloxy group, a heteroaryloxy group, an alkylthio group, an arylthio group, a heteroarylthio group, an amino group, or an acyl group.

The coordinating atom coordinated by an unshared electron pair is included in a ring. In a case where the coordinating atom coordinated by an unshared electron pair is included in a ring, the ring including the coordinating atom coordinated by an unshared electron pair may be monocyclic or polycyclic and may be aromatic or nonaromatic. The ring including the coordinating atom coordinated by an unshared electron pair is preferably a 5- to 12-membered ring and more preferably a 5- to 7-membered ring.

The ring including the coordinating atom coordinated by an unshared electron pair may have a substituent. Examples of the substituent include a linear, branched, or cyclic alkyl group having 1 to 10 carbon atoms, an aryl group having 6 to 12 carbon atoms, a halogen atom, a silicon atom, an alkoxy group having 1 to 12 carbon atoms, an acyl group having 2 to 12 carbon atoms, an alkylthio group having 1 to 12 carbon atoms, and a carboxyl group.

In a case where the ring including the coordinating atom coordinated by an unshared electron pair has a substituent, the substituent may further have a substituent. Examples of the substituent include a group which includes a ring including a coordinating atom coordinated by an unshared electron pair, a group which includes at least one partial structure selected from Groups (UE-1) to (UE-3), an alkyl group having 1 to 12 carbon atoms, an acyl group having 2 to 12 carbon atoms, and a hydroxy group.

In a case where the coordinating atom coordinated by an unshared electron pair is included in a partial structure selected from Groups (UE-1) to (UE-3), $R^1$ represents a hydrogen atom, an alkyl group, an alkenyl group, an alkynyl group, an aryl group, or a heteroaryl group, and $R^2$ represents a hydrogen atom, an alkyl group, an alkenyl group, an alkynyl group, an aryl group, a heteroaryl group, an alkoxy group, an aryloxy group, a heteroaryloxy group, an alkylthio group, an arylthio group, a heteroarylthio group, an amino group, or an acyl group.

The alkyl group, the alkenyl group, the alkynyl group, the aryl group, and the heteroaryl group have the same definitions and the same preferable ranges as the alkyl group, the alkenyl group, the alkynyl group, the aryl group, and the heteroaryl group described above regarding the coordination site coordinated by an anion.

The number of carbon atoms in the alkoxy group is preferably 1 to 12 and more preferably 3 to 9.

The number of carbon atoms in the aryloxy group is preferably 6 to 18 and more preferably 6 to 12.

The heteroaryloxy group may be monocyclic or polycyclic. The heteroaryl group constituting the heteroaryloxy group has the same definition and the same preferable range as the heteroaryl group described above regarding the coordination site coordinated by an anion.

The number of carbon atoms in the alkylthio group is preferably 1 to 12 and more preferably 1 to 9.

The number of carbon atoms in the arylthio group is preferably 6 to 18 and more preferably 6 to 12.

The heteroarylthio group may be monocyclic or polycyclic. The heteroaryl group constituting the heteroarylthio group has the same definition and the same preferable range as the heteroaryl group described above regarding the coordination site coordinated by an anion.

The number of carbon atoms in the acyl group is preferably 2 to 12 and more preferably 2 to 9.

In a case where the ligand has a coordination site coordinated by an anion and a coordinating atom coordinated by an unshared electron pair in one molecule, the number of atoms linking the coordination site coordinated by an anion and the coordinating atom coordinated by an unshared electron pair is preferably 1 to 6 and more preferably 1 to 3. With the above-described configuration, the structure of the copper complex is more likely modified. Thus a color value can be further improved, and the molar absorption coefficient can be easily increased while improving visible light transmittance. As the atoms linking the coordination site coordinated by an anion and the coordinating atom coordinated by an unshared electron pair, one kind or two or more kinds may be used. A carbon atom or a nitrogen atom is preferable.

In a case where the ligand has two or more coordinating atoms coordinated by an unshared electron pair in one molecule, the number of coordinating atoms coordinated by an unshared electron pair may be 3 or more and is preferably 2 to 5 and more preferably 4. The number of atoms linking the coordinating atoms coordinated by an unshared electron pair is preferably 1 to 6, more preferably 1 to 3, still more preferably 2 or 3, and still more preferably 3. With the above-described configuration, the structure of the copper complex is more likely modified, and thus color value can be further improved. As the atom linking the coordinating atoms coordinated by an unshared electron pair, one kind or two or more kinds may be used. As the atom linking the coordinating atoms coordinated by an unshared electron pair, a carbon atom is preferable.

It is preferable that the ligand is a compound (also referred to as "multidentate ligand") having at least two coordination sites. The number of coordination sites in the ligand is more preferably at least 3, still more preferably 3 to 5, and even still more preferably 4 or 5. The multidentate ligand acts as a chelating ligand to a copper component. That is, it is presumed that, by at least two coordination sites in the multidentate ligand being chelating-coordinated to copper, the structure of the copper complex is distorted, high transmittance in a visible range can be obtained, infrared absorption capability can be improved, and a color value can also be improved. Thus, even in a case where a near infrared cut filter is used for a long period of time, characteristics thereof do not deteriorate, and a camera module can be stably manufactured.

Examples of the multidentate ligand include a compound having one or more coordination sites coordinated by an anion and one or more coordinating atoms coordinated by an unshared electron pair, a compound having two or more coordinating atoms coordinated by an unshared electron pair, and a compound having two coordination sites coordinated by an anion. As each of the compounds, one kind may be used alone, or two or more kinds may be used in combination. In addition, as the compound which forms the ligand, a compound having only one coordination site can also be used.

It is preferable that the multidentate ligand is a compound represented by any one of the following Formulae (IV-1) to (IV-14). For example, in a case where the ligand is a compound having four coordination sites, a compound represented by the following Formula (IV-3), (IV-6), (IV-7), or (IV-12) is preferable, and a compound represented by the following formula (IV-12) is more preferable because the ligand can be more strongly coordinated to the central metal to easily form a stable pentadentate-coordinated complex having high heat resistance. In addition, for example, in a case where the ligand is a compound having five coordination sites, a compound represented by the following Formula (IV-4), (IV-8) to (IV-11), (IV-13), or (IV-14) is preferable, a compound represented by the following Formula (IV-9), (IV-10), (IV-13), or (IV-14) is more preferable, and a compound represented by the following Formula (IV-13) is still more preferable because the multidentate ligand can be more strongly coordinated to the central metal to form a stable pentadentate-coordinated complex having high heat resistance.

(IV-1)

(IV-2)

(IV-3)

(IV-4)

(IV-5)

(IV-6)

(IV-7)

(IV-8)

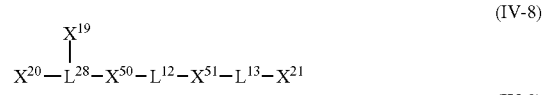

(IV-9)

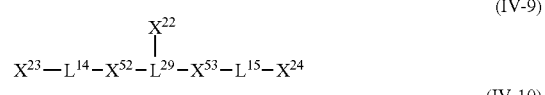

(IV-10)

(IV-11)

(IV-12)

(IV-13)

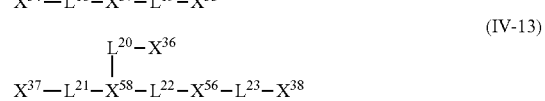

(IV-14)

In Formulae (IV-1) to (IV-14), it is preferable that $X^1$ to $X^{59}$ each independently represent a coordination site, $L^1$ to $L^{25}$ each independently represent a single bond or a divalent linking group, $L^{26}$ to $L^{32}$ each independently represent a trivalent linking group, and $L^{33}$ to $L^{34}$ each independently represent a tetravalent linking group.

It is preferable that $X^1$ to $X^{42}$ each independently represent a group which includes a ring including a coordinating atom coordinated by an unshared electron pair or at least one selected from Group (AN-1) or Group (UE-1).

It is preferable that $X^{43}$ to $X^{56}$ each independently represent a group which includes a ring including a coordinating atom coordinated by an unshared electron pair or at least one selected from Group (AN-2) or Group (UE-2).

It is preferable that $X^{57}$ to $X^{59}$ each independently represent at least one selected from Group (UE-3).

$L^1$ to $L^{25}$ each independently represent a single bond or a divalent linking group. As the divalent linking group, an alkylene group having 1 to 12 carbon atoms, an arylene group having 6 to 12 carbon atoms, —SO—, —O—, —SO$_2$—, or a group including a combination of the above-described groups is preferable, and an alkylene group having 1 to 3 carbon atoms, a phenylene group, —SO$_2$—, or a group of a combination of the above-described groups is more preferable.

$L^{26}$ to $L^{32}$ each independently represent a trivalent linking group. Examples of the trivalent linking group include a group obtained by removing one hydrogen atom from the divalent linking group.

$L^{33}$ to $L^{34}$ each independently represent a tetravalent linking group. Examples of the tetravalent linking group include a group obtained by removing two hydrogen atoms from the divalent linking group.

Here, regarding R in Groups (AN-1) and (AN-2) and $R^1$ in Groups (UE-1) to (UE-3), R's, $R^1$'s, or R and $R^1$ may be linked to each other to form a ring. For example, specific examples of Formula (IV-2) include the following compound (IV-2A). $X^3$, $X^4$, and $X^{43}$ represent the following groups, $L^2$ and $L^3$ represent a methylene group, and $R^1$ represents a methyl group. $R^1$'s may be linked to each other to form a ring and have a structure represented by the following Formula (IV-2B) or (IV-2C).

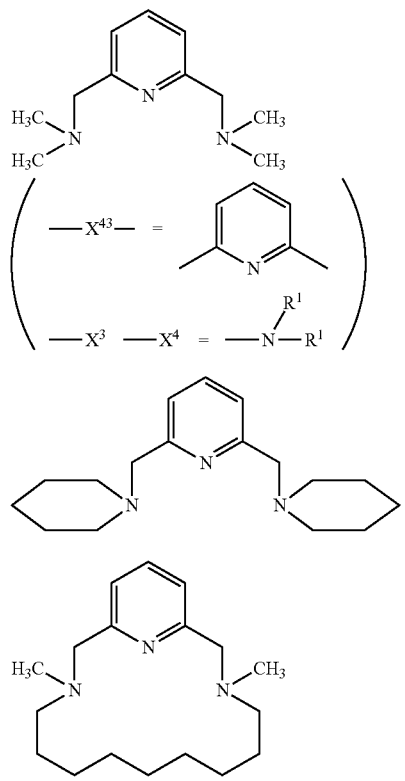

Specific examples of the compound which forms a ligand include the following compounds, compounds described below as preferable examples of a multidentate ligand, and salts of the above-described compounds. Examples of an atom or an atomic group constituting the salts include a metal atom and tetrabutylammonium. As the metal atom, an alkali metal atom or an alkali earth metal atom is more preferable. Examples of the alkali metal atom include sodium and potassium. Examples of the alkali earth metal atom include calcium and magnesium. In addition, the details can be found in paragraphs "0022" to "0042" of JP2014-41318A, paragraphs "0021" to "0039" of JP2015-43063A, and paragraphs "0025" and "0026" of JP2015-158662A, the contents of which are incorporated herein by reference.

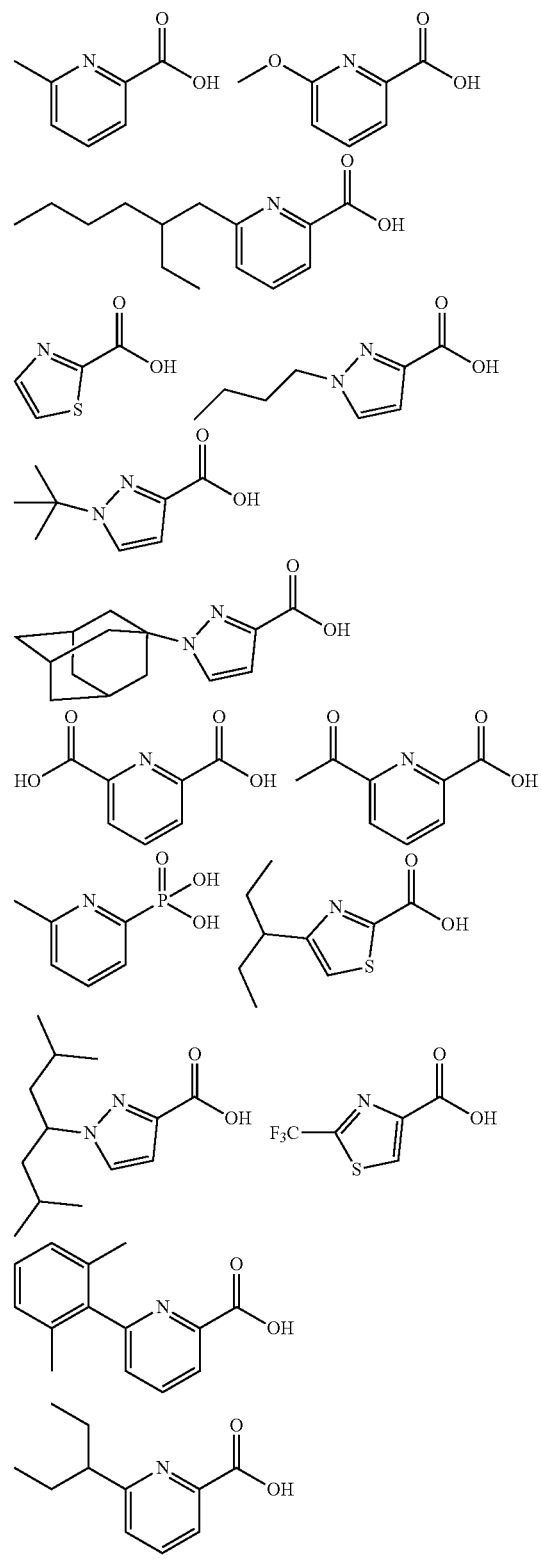

37
-continued
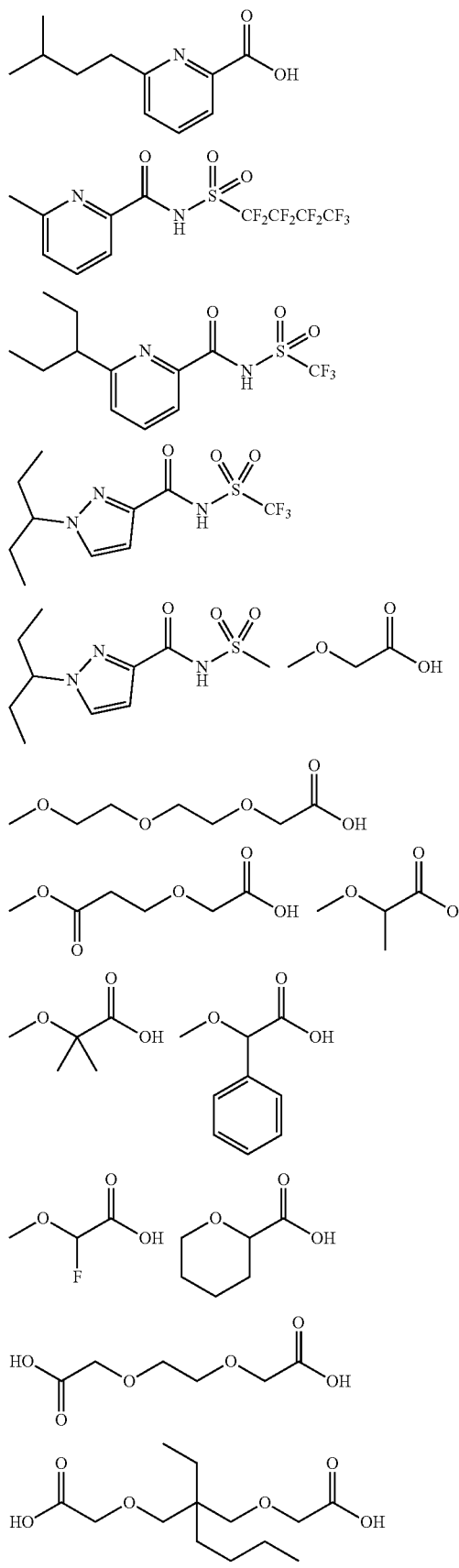
38
-continued
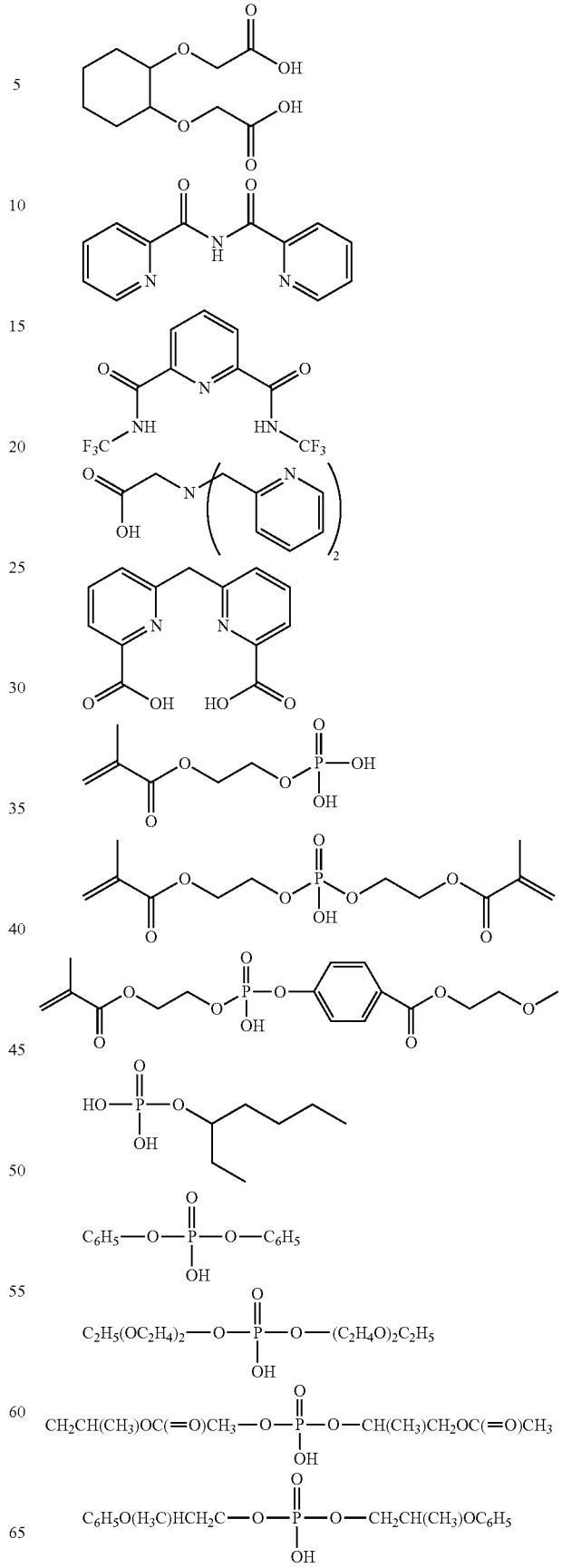

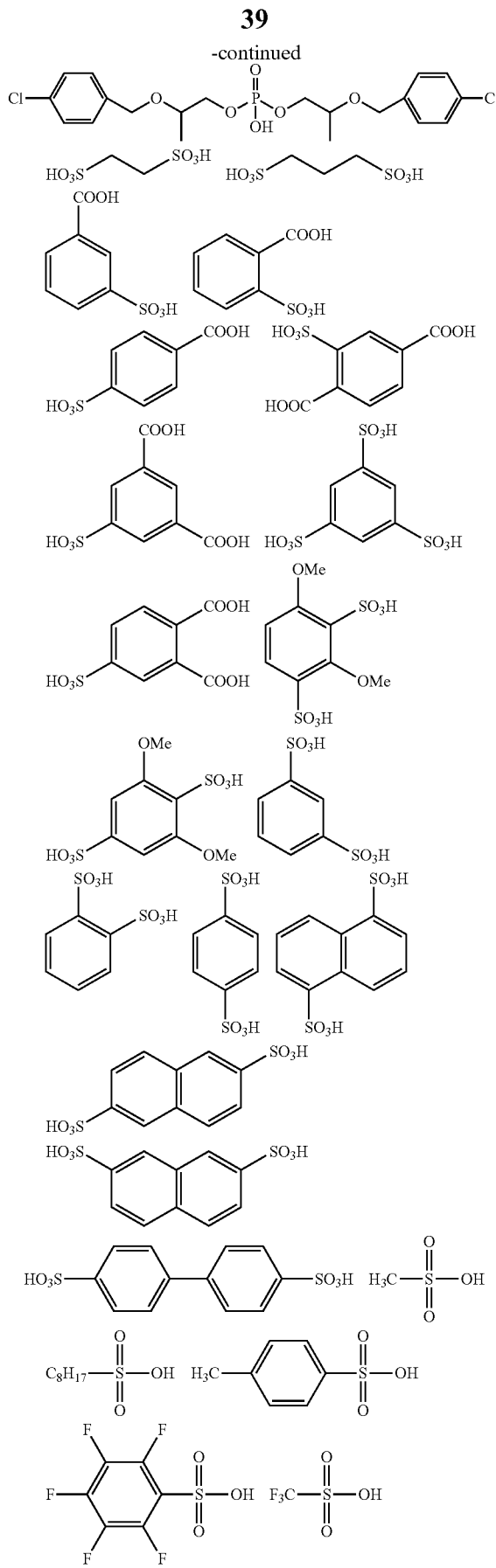

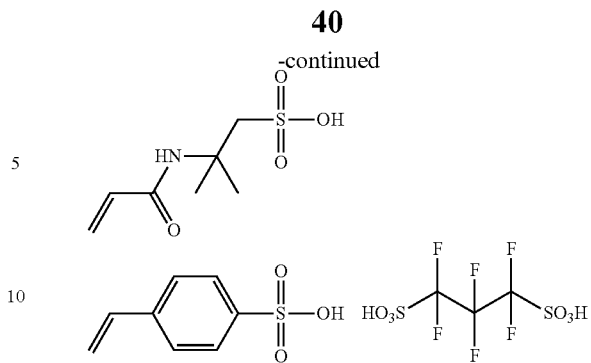

As the copper complex, for example, the following aspects (1) to (5) are preferable, the aspects (2) to (5) are more preferable, the aspects (3) to (5) are still more preferable, and the aspect (4) or (5) is even still more preferable.

(1) a copper complex which includes one or two compounds having two coordination sites as a ligand (2) a copper complex which includes a compound having three coordination sites as a ligand (3) a copper complex which includes a compound having three coordination sites and a compound having two coordination sites as a ligand (4) a copper complex which includes a compound having four coordination sites as a ligand (5) a copper complex which includes a compound having five coordination sites as a ligand In the aspect (1), it is preferable that the compound having two coordination sites is a compound having two coordinating atoms coordinated by an unshared electron pair or a compound having a coordination site coordinated by an anion and a coordinating atom coordinated by an unshared electron pair. In addition, in a case where the copper complex includes two compounds having two coordination sites as a ligand, the compounds as the ligand may be the same as or different from each other.

In addition, in the aspect (1), the copper complex may further include the monodentate ligand. The number of monodentate ligands may be 0 or 1 to 3. Regarding the kind of the monodentate ligand, a monodentate ligand coordinated by an anion or a monodentate ligand coordinated by an unshared electron pair is preferable. In a case where the compound having two coordination sites is a compound having two coordinating atoms coordinated by an unshared electron pair, a monodentate ligand coordinated by an anion is more preferable because a coordination force is strong. In a case where the compound having two coordination sites is a compound having a coordination site coordinated by an anion and a coordinating atom coordinated by an unshared electron pair, a monodentate ligand coordinated by an unshared electron pair is more preferable because the entire complex has no charge.

In the aspect (2), as the compound having three coordination sites, a compound having a coordinating atom coordinated by an unshared electron pair is preferable, and a compound having three coordinating atoms coordinated by an unshared electron pair is more preferable. In addition, in the aspect (2), the copper complex site may further include a monodentate ligand. The number of monodentate ligands may be 0. In addition, the number of monodentate ligands may be 1 or more and is preferably 1 to 3, more preferably 1 or 2, and still more preferably 2. Regarding the kind of the monodentate ligand, a monodentate ligand coordinated by an anion or a monodentate ligand coordinated by an unshared electron pair is preferable, and a monodentate ligand coordinated by an anion is more preferable due to the above-described reason.

In the aspect (3), as the compound having three coordination sites, a compound having a coordination site coordinated by an anion and a coordinating atom coordinated by an unshared electron pair is preferable, and a compound having two coordination sites coordinated by an anion and one coordinating atom coordinated by an unshared electron pair is more preferable. Further, it is still more preferable that the two coordination sites coordinated by an anion are different from each other. In addition, as the compound having two coordination sites, a compound having a coordinating atom coordinated by an unshared electron pair is preferable, and a compound having two coordinating atoms coordinated by an unshared electron pair is more preferable. In particular, it is preferable that the compound having three coordination sites is a compound having two coordination sites coordinated by an anion and one coordinating atom coordinated by an unshared electron pair and the compound having two coordination sites is a compound having two coordinating atoms coordinated by an unshared electron pair.

In addition, in the aspect (3), the copper complex site may further include a monodentate ligand. The number of monodentate ligands may be 0 or 1 or more. The number of monodentate ligand is preferably 0.

In the aspect (4), as the compound having four coordination sites, a compound having a coordinating atom coordinated by an unshared electron pair is preferable, a compound having two or more coordinating atoms coordinated by an unshared electron pair is more preferable, and a compound having four coordinating atoms coordinated by an unshared electron pair is still more preferable.

In addition, in the aspect (4), the copper complex site may further include a monodentate ligand. The number of monodentate ligands may be 0, 1 or more, or 2 or more. The number of monodentate ligand is preferably 1. Regarding the kind of the monodentate ligand, a monodentate ligand coordinated by an anion or a monodentate ligand coordinated by an unshared electron pair is preferable.

In the aspect (5), as the compound having five coordination sites, a compound having a coordinating atom coordinated by an unshared electron pair is preferable, a compound having two or more coordinating atoms coordinated by an unshared electron pair is more preferable, and a compound having five coordinating atoms coordinated by an unshared electron pair is still more preferable.

In addition, in the aspect (5), the copper complex site may further include a monodentate ligand. The number of monodentate ligands may be 0 or 1 or more. The number of monodentate ligands is preferably 0.

As the multidentate ligand, for example, a compound having two or more coordination sites or the following compounds can be used among the compounds described above as the specific examples of the ligand.

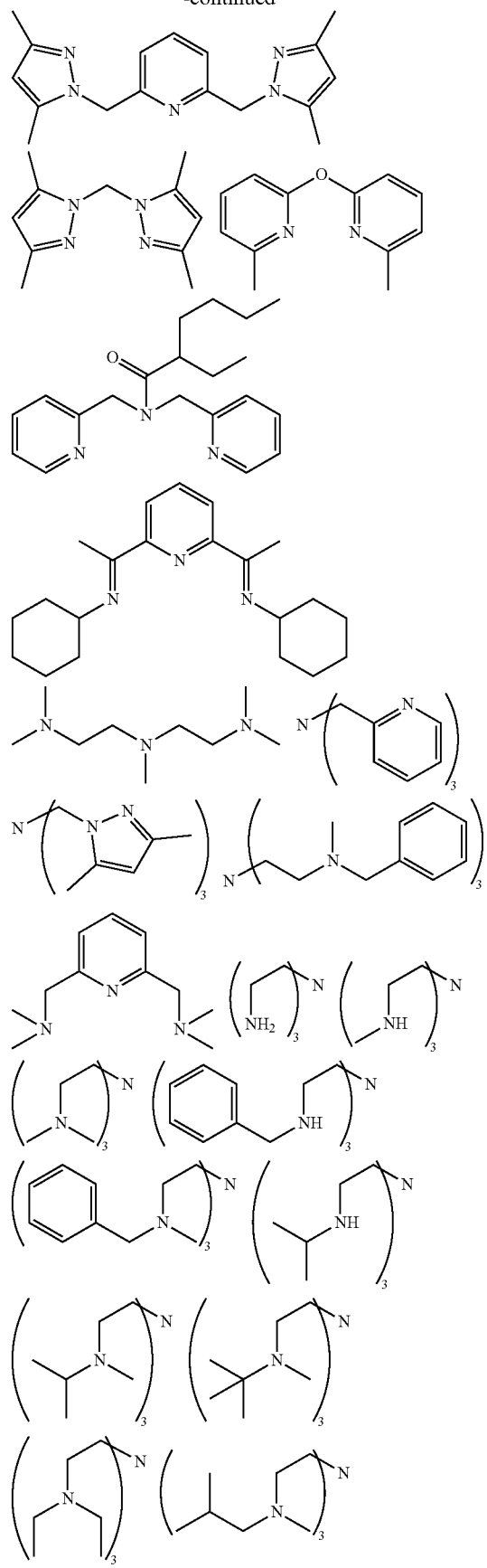

-continued

-continued

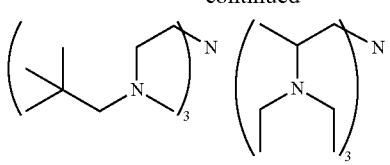
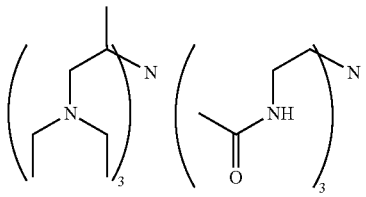
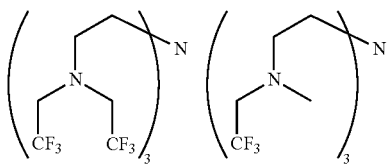
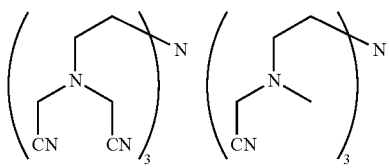
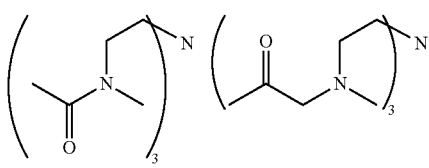
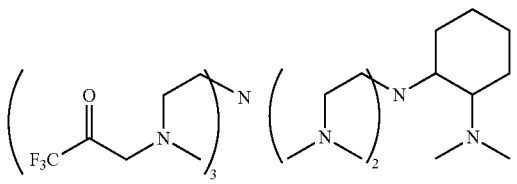
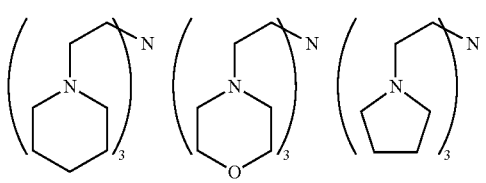
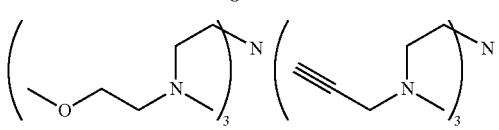
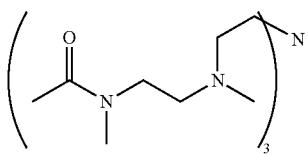
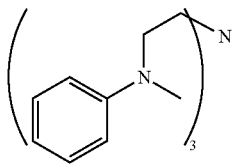

-continued

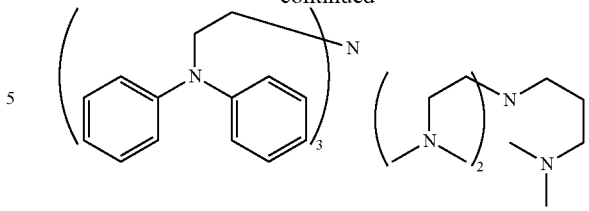
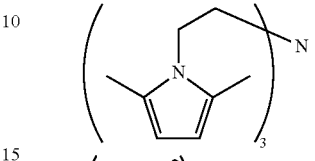
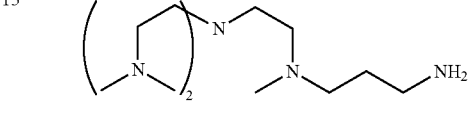

[Copper Phosphate Complex]

In the present invention, as the copper compound, a copper phosphate complex can also be used. The copper phosphate complex has copper as central metal and has a phosphate compound as a ligand. As the phosphate compound which forms the ligand of the copper phosphate complex, a compound represented by the following Formula (L-100) or a salt thereof is preferable.

$$(HO)_n—P(=O)—(OR^1)_{3-n}$$  Formula (L-100)

In the formula, $R^1$ represents an alkyl group having 1 to 18 carbon atoms, an aryl group having 6 to 18 carbon atoms, an aralkyl group having 7 to 18 carbon atoms, or an alkenyl group having 2 to 18 carbon atoms. Alternatively, —$OR^1$ represents a polyoxyalkyl group having 4 to 100 carbon atoms, a (meth)acryloyloxyalkyl group having 4 to 100 carbon atoms, or a (meth)acryloylpolyoxyalkyl group having 4 to 100 carbon atoms, and n represents 1 or 2. In a case where n represents 1, $R^2$'s may be the same as or different from each other.

Specific examples of the phosphate compound include the above-described ligand. In addition, the details can be found in paragraphs "0022" to "0042" of JP2014-41318A, the content of which is incorporated herein by reference.

[Copper Sulfate Complex]

In the present invention, as the copper compound, a copper sulfate complex can also be used. The copper sulfate complex has copper as central metal and has a sulfonic acid compound as a ligand. As the sulfonic acid compound which forms the ligand of the copper sulfate complex, a compound represented by the following Formula (L-200) or a salt thereof is preferable.

$$R^2—SO_2—OH$$  Formula (L-200)

In the formula, $R^2$ represents a monovalent organic group. Examples of the monovalent organic group include an alkyl group, an aryl group, and a heteroaryl group.

The alkyl group, the aryl group, and the heteroaryl group may be unsubstituted or may have a substituent. Examples of the substituent include a polymerizable group (preferably a group having an ethylenically unsaturated bond such as a vinyl group, a (meth)acryloyloxy group, or a (meth)acryloyl group), a halogen atom (a fluorine atom, a chlorine atom, a bromine atom, or an iodine atom), an alkyl group, a carboxylate group (for example, —$CO_2CH_3$), an alkyl halide group, an alkoxy group, a methacryloyloxy group, an acryloyloxy group, an ether group, an alkylsulfonyl group, an arylsulfonyl group, a sulfide group, an amido group, an acyl group, a hydroxyl group, a carboxyl group, a sulfonate group, an acid group containing a phosphorus atom, an amino group, a carbamoyl group, and a carbamoyloxy group.

The alkyl group, the aryl group, and the heteroaryl group may have a divalent linking group. Examples of the divalent linking group include —(CH$_2$)$_m$— (m represents an integer of 1 to 10, preferably an integer of 1 to 6, and more preferably an integer of 1 to 4), a cyclic alkylene group having 5 to 10 carbon atoms, or a group including a combination of one of the above-described groups with at least one selected from the group consisting of —O—, —COO—, —S—, —NH—, and —CO— is preferable.

In Formula (L-200), $R^2$ represents preferably an organic group having a formula weight of 300 or lower, more preferably an organic group having a formula weight of 50 to 200, and still more preferably an organic group having a formula weight of 60 to 100.

The molecular weight of the sulfonic acid compound represented by Formula (L-200) is preferably 80 to 750, more preferably 80 to 600, and still more preferably 80 to 450.

It is preferable that the copper sulfate complex has a structure represented by the following Formula (L-201).

In the formula, $R^{2A}$ has the same definition and the same preferable range as $R^2$ in Formula (L-200).

Specific examples of the sulfonic acid compound include the above-described ligand. In addition, the details can be found in paragraphs "0021" to "0039" of JP2015-43063A, the content of which is incorporated herein by reference.

<<<Polymer Type Copper Compound>>>

In the present invention, as the copper compound, a copper-containing polymer having a copper complex site at a polymer side chain can be used. The polymer type copper compound (copper-containing polymer) is a component different from the resin A.

Examples of the copper complex site include copper and a site (coordination site) coordinated to copper. Examples of the site coordinated to copper include a site coordinated by an anion or an unshared electron pair. In addition, it is preferable that the copper complex site includes a site tetradentate- or pentadentate-coordinated to copper. The details of the coordination site are as described above regarding the low molecular weight compound type copper compound, and a preferable range is also the same.

Examples of the copper-containing polymer include, a polymer having a coordination site (also referred to as "polymer (B1)"), a polymer obtained from a reaction with a copper component, a polymer having a reactive site at a polymer side chain (hereinafter, also referred to as "polymer (B2)"), and a polymer obtained from a reaction with a copper complex having a functional group which is reactive with the reactive site in the polymer (B2). The weight-average molecular weight of the copper-containing polymer is preferably 2000 or higher, more preferably 2000 to 2000000, and still more preferably 6000 to 200000.

The copper-containing polymer may include other repeating units in addition to the repeating unit having a copper complex site. Specific examples of the other repeating units include the repeating unit having a crosslinking group. Examples of the crosslinking group include examples of the crosslinking group described above regarding the resin A.

The weight-average molecular weight of the copper-containing polymer is preferably 2000 or higher, more preferably 2000 to 2000000, and still more preferably 6000 to 200000.

(Pyrrolopyrrole Compound)

In the present invention, it is preferable that the pyrrolopyrrole compound is a compound represented by the following Formula (1). By using this compound, a cured film having excellent infrared shielding properties and visible transparency can be easily manufactured.

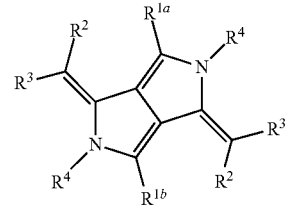

In the formula, $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —BR$^{4A}$R$^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a substituent.

In Formula (1), $R^{1a}$ and $R^{1b}$ each independently represent an alkyl group, an aryl group, or a heteroaryl group, preferably an aryl group or a heteroaryl group, and more preferably an aryl group.

The number of carbon atoms in the alkyl group represented by $R^{1a}$ and $R^{1b}$ is preferably 1 to 30, more preferably 1 to 20, and still more preferably 1 to 10.

The number of carbon atoms in the aryl group represented by $R^{1a}$ and $R^{1b}$ is preferably 6 to 30, more preferably 6 to 20, and still more preferably 6 to 12.

The number of carbon atoms constituting the heteroaryl group represented by $R^{1a}$ and $R^{1b}$ is preferably 1 to 30 and more preferably 1 to 12. Examples of the kind of the heteroatom constituting the heteroaryl group include a nitrogen atom, an oxygen atom, and a sulfur atom. The number of heteroatoms constituting the heteroaryl group is preferably 1 to 3 and more preferably 1 or 2. The heteroaryl group is preferably a monocycle or a fused ring, more preferably a monocycle or a fused ring composed of 2 to 8 rings, and still more preferably a monocycle or a fused ring composed of 2 to 4 rings.

The alkyl group, the aryl group, and the heteroaryl group may have a substituent or may be unsubstituted. It is preferable that the groups have a substituent. Examples of the substituent include groups described below regarding the substituent T. Among these, an alkoxy group or a hydroxy group is preferable. The alkoxy group is preferably an alkoxy group having a branched alkyl group. The group represented by $R^{1a}$ and $R^{1b}$ is preferably an aryl group which has an alkoxy group having a branched alkyl group as a substituent, or an aryl group which has a hydroxy group as a substituent. The number of carbon atoms in the branched alkyl group is preferably 3 to 30 and more preferably 3 to 20.

In Formula (1), $R^{1a}$ and $R^{1b}$ may be the same as or different from each other.

$R^2$ and $R^3$ each independently represent a hydrogen atom or a substituent. $R^2$ and $R^3$ may be bonded to each other to form a ring. It is preferable that at least one of $R^2$ or $R^3$ represents an electron-withdrawing group. It is preferable that $R^2$ and $R^3$ each independently represent a cyano group or a heteroaryl group.

Examples of the substituent include substituents described in paragraphs "0020" to "0022" of 2009-263614A. The content is incorporated herein by reference.

Examples of the substituent include the following substituent T.

(Substituent T)

The substituent T include an alkyl group (preferably having 1 to 30 carbon atoms), an alkenyl group (preferably having 2 to 30 carbon atoms), an alkynyl group (preferably having 2 to 30 carbon atoms), an aryl group (preferably having 6 to 30 carbon atoms), an amino group (preferably having 0 to 30 carbon atoms), an alkoxy group (preferably having 1 to 30 carbon atoms), an aryloxy group (preferably having 6 to 30 carbon atoms), a heteroaryloxy group (preferably having 1 to 30 carbon atoms), an acyl group (preferably having 1 to 30 carbon atoms), an alkoxycarbonyl group (preferably having 2 to 30 carbon atoms), an aryloxycarbonyl group (preferably having 7 to 30 carbon atoms), an acyloxy group (preferably having 2 to 30 carbon atoms), an acylamino group (preferably having 2 to 30 carbon atoms), an alkoxycarbonylamino group (preferably having 2 to 30 carbon atoms), an aryloxycarbonylamino group (preferably having 7 to 30 carbon atoms), a sulfamoyl group (preferably having 0 to 30 carbon atoms), a carbamoyl group (preferably having 1 to 30 carbon atoms), an alkylthio group (preferably having 1 to 30 carbon atoms), an arylthio group (preferably having 6 to 30 carbon atoms), a heteroarylthio group (preferably having 1 to 30 carbon atoms), an alkylsulfonyl group (preferably having 1 to 30 carbon atoms), an arylsulfonyl group (preferably having 6 to 30 carbon atoms), a heteroarylsulfonyl group (preferably having 1 to 30 carbon atoms), an alkylsulfinyl group (preferably having 1 to 30 carbon atoms), an arylsulfinyl group (preferably having 6 to 30 carbon atoms), a heteroarylsulfinyl group (preferably having 1 to 30 carbon atoms), a ureido group (preferably having 1 to 30 carbon atoms), a phosphoric amide group (preferably having 1 to 30 carbon atoms), a hydroxyl group, a mercapto group, a halogen atom, a cyano group, a sulfo group, a carboxyl group, a nitro group, a hydroxamic acid group, a sulfino group, a hydrazino group, an imino group, and a heteroaryl group (preferably having 1 to 30 carbon atoms). A hydrogen atom in the carboxyl group may be dissociable (that is, a carbonate group), or the carboxyl group may be in the form of a salt. A hydrogen atom in the sulfo group may be dissociable (that is, a sulfonate group), or the sulfo group may be in the form of a salt.

In a case where the above-described groups can be further substituted, the groups may further have a substituent. Examples of the substituent include the groups described regarding the substituent T.

It is preferable that at least one of $R^2$ or $R^3$ represents an electron-withdrawing group. A substituent having a positive Hammett sigma para value (σp value) functions as an electron-withdrawing group.

In the present invention, a substituent having a Hammett σp value of 0.2 or higher can be used as an example of the electron-withdrawing group. The σp value is preferably 0.25 or higher, more preferably 0.3 or higher, and still more preferably 0.35 or higher. The upper limit is not particularly limited and is preferably 0.80.

Specific examples of the substituent having a Hammett σp value of 0.2 or higher include a cyano group (σp value=0.66), a carboxyl group (for example, —COOH; σp value=0.45), an alkoxycarbonyl group (—COOMe: σp value=0.45), an aryloxycarbonyl group (for example, —COOPh; σp value=0.44), a carbamoyl group (for example, —CONH$_2$; σp value=0.36), an alkylcarbonyl group (for example, —COMe; σp value=0.50), an arylcarbonyl group (for example, —COPh; σp value=0.43), an alkylsulfonyl group (for example, —SO$_2$Me; σp value=0.72), and an arylsulfonyl group (for example, —SO$_2$Ph; σp value=0.68). In particular, a cyano group is preferable. Here, Me represents a methyl group, and Ph represents a phenyl group.

The details of the Hammett substituent constant σ value can be found in paragraphs "0017" and "0018" of JP2011-68731A, the content of which is incorporated herein by reference.

In a case where $R^2$ and $R^3$ are bonded to each other to form a ring, the formed ring is preferably a 5-membered to 7-membered ring (preferably 5-membered or 6-membered ring). As the formed ring, a merocyanine colorant which is typically used as an acid nucleus is preferable, and specific examples thereof include paragraphs "0019" to "0021" of JP2011-68731A, the content of which is incorporated herein by reference.

It is preferable that $R^2$ represents an electron-withdrawing group (preferably a cyano group) and R3 represents a heteroaryl group. It is preferable that the heteroaryl group is a 5-membered or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of the heteroatom include a nitrogen atom, an oxygen atom, and a sulfur atom. It is preferable that the heteroaryl group has one or more nitrogen atoms. The number of carbon atoms constituting the heteroaryl group is preferably 1 to 30 and more preferably 1 to 12. Specific examples of the heteroaryl group include an imidazolyl group, a pyridyl group, a pyrazyl group, a pyrimidyl group, a pyridazyl group, a triazyl group, a quinolyl group, a quinoxalyl group, an isoquinolyl group, an indolinyl group, a furyl group, a thienyl group, a benzoxazolyl group, a benzimidazolyl group, a benzothiazolyl group, a naphthothiazolyl group, a benzoxazolyl group, a m-carbazolyl group, an azepinyl group, and a benzo-fused ring or a naphtho-fused ring of the above-described groups. The heteroaryl group may have a substituent or may be unsubstituted. Examples of the substituent include the groups described regarding the substituent T. For example, an alkyl group, an alkoxy group, or a halogen atom may be used.

In Formula (1), two $R^2$'s may be the same as or different from each other, and two $R^3$'s may be the same as or different from each other.

In a case where $R^4$ represents an alkyl group, an aryl group, or a heteroaryl group, the alkyl group, the aryl group, and the heteroaryl group represented by $R^4$ have the same definitions and the same preferable ranges as those described regarding $R^{1a}$ and $R^{1b}$.

In a case where $R^4$ represents —$BR^{4A}R^{4B}$, $R^{4A}$ and $R^{4B}$ each independently represent a substituent. Examples of the substituent represented by $R^{4A}$ and $R^{4B}$ include the above-described substituent T. In particular, a halogen atom, an alkyl group, an alkoxy group, an aryl group, or a heteroaryl group is preferable, an alkyl group, an aryl group, or a heteroaryl group is more preferable, and an aryl group is still more preferable. Specific examples of the group represented by $-BR^{4A}R^{4B}$ include difluoroboron, diphenylboron, dibutylboron, dinaphthylboron, and catecholboron. In particular, diphenylboron is preferable.

In a case where $R^4$ represents a metal atom, examples of the metal atom include magnesium, aluminum, calcium, barium, zinc, tin, aluminum, zinc, vanadium, iron, cobalt, nickel, copper, palladium, iridium, platinum. In particular, aluminum, zinc, vanadium, iron, copper, palladium, iridium, or platinum is preferable.

$R^4$ may form a covalent bond or a coordinate bond with at least one selected from the group consisting of $R^{1a}$, $R^{1b}$, and $R^3$. In particular, it is preferable that $R^4$ and $R^3$ form a coordinate bond. It is preferable that R represents a hydrogen atom or a group (in particular, diphenylboron) represented by $-BR^{4A}R^{4B}$. In Formula (1), two $R^4$'s may be the same as or different from each other.

It is preferable that the compound represented by Formula (1) is a compound represented by the following Formula (1A).

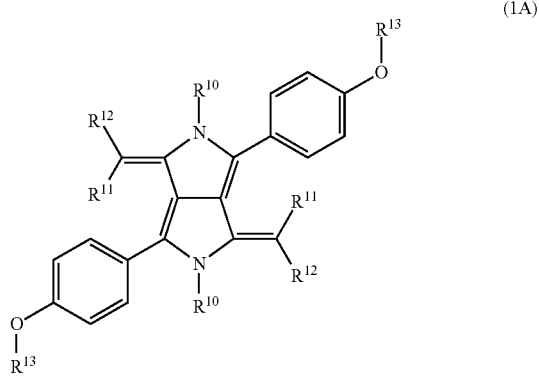

(1A)

In the formula, $R^{10}$'s each independently represent a hydrogen atom, an alkyl group, an aryl group, a heteroaryl group, $-BR^{14A}R^{14B}$, or a metal atom. $R^{10}$ may form a covalent bond or a coordinate bond with $R^{12}$. $R^{11}$ and $R^{12}$ each independently represent a hydrogen atom or a substituent, at least one of $R^{11}$ or $R^{12}$ represents a cyano group, and $R^{11}$ and $R^{12}$ may be bonded to each other to form a ring. $R^{13}$'s each independently represent a hydrogen atom or a branched alkyl group having 3 to 30 carbon atoms.

$R^{10}$ has the same definition and the same preferable range as $R^4$ in Formula (1). $R^{10}$ represents preferably a hydrogen atom or a group (in particular, diphenylboron) represented by $-BR^{14A}R^{14B}$ and more preferably a group represented by $-BR^{14A}R^{14B}$.

$R^{11}$ and $R^{12}$ have the same definitions and the same preferable ranges as $R^2$ and $R^3$ in Formula (1). It is more preferable that one of $R^{11}$ and $R^{12}$ represents a cyano group and the other one of $R^{11}$ and $R^{12}$ represents a heteroaryl group.

$R^{14A}$ and $R^{14B}$ have the same definitions and the same preferable ranges as $R^{4A}$ and $R^{4B}$ in Formula (1).

$R^{13}$'s each independently represent a hydrogen atom or a branched alkyl group having 3 to 30 carbon atoms. The number of carbon atoms in the branched alkyl group is preferably 3 to 20.

Specific examples of the compound represented by Formula (1) include the following compounds. In addition, the details can be found in paragraphs "0037" to "0052" of JP2011-68731A (corresponding to paragraphs "0070" of US2011/0070407A), the content of which is incorporated herein by reference.

(Squarylium Compound)

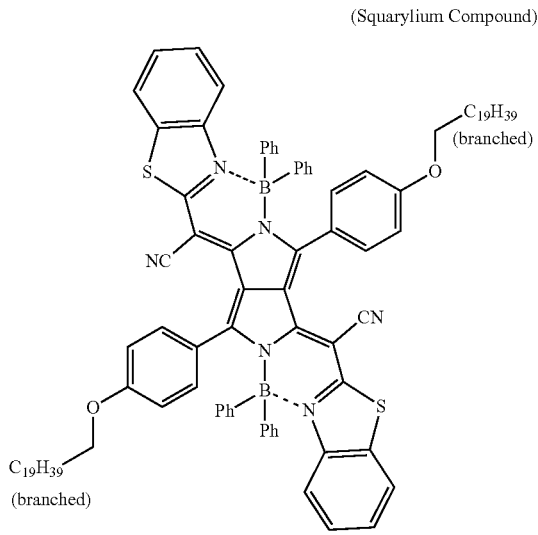

In the present invention, it is preferable that the squarylium compound is a compound represented by the following Formula (11). This compound has excellent near infrared absorbing properties and invisibility.

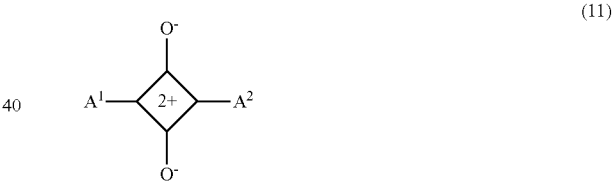

(11)

In Formula (11), $A^1$ and $A^2$ each independently represent an aryl group, a heteroaryl group, or a group represented by the following Formula (12).

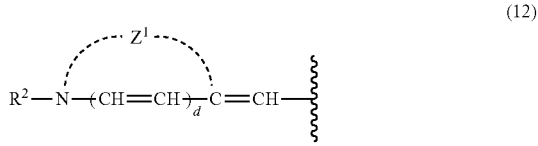

(12)

In Formula (12), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond to a 4-membered ring of Formula (11).

In Formula (11), $A^1$ and $A^2$ each independently represent an aryl group, a heteroaryl group, or a group represented by the following Formula (12), and preferably a group represented by Formula (12).

The number of carbon atoms in the aryl group represented by $A^1$ and $A^2$ is preferably 6 to 48, more preferably 6 to 24, and still more preferably 6 to 12. Specific examples include a phenyl group and a naphthyl group. In a case where the aryl group has a substituent, the number of carbon atoms in the aryl group denotes the number of carbon atoms excluding the number of carbon atoms in the substituent.

It is preferable that the heteroaryl group represented by $A^1$ and $A^2$ is a 5-membered or 6-membered ring. In addition, the heteroaryl group is preferably a monocycle or a fused ring, more preferably a monocycle or a fused ring composed of 2 to 8 rings, still more preferably a monocycle or a fused ring composed of 2 to 4 rings, and even still more preferably a monocycle or a fused ring composed of 2 or 3 rings. Examples of a heteroatom constituting the heteroaryl group include a nitrogen atom, an oxygen atom, and a sulfur atom. Among these, a nitrogen atom or a sulfur atom is preferable. The number of heteroatoms constituting the heteroaryl group is preferably 1 to 3 and more preferably 1 or 2. Specific examples include a heteroaryl group derived from a monocycle or a polycyclic aromatic ring such as a 5-membered or 6-membered ring containing at least one of a nitrogen atom, an oxygen atom, or a sulfur atom.

The aryl group and the heteroaryl group may have a substituent. Examples of the substituent include the substituent T described above regarding the pyrrolopyrrole compound.

A substituent which may be included in the aryl group and the heteroaryl group is preferably a halogen atom, an alkyl group, a hydroxy group, an amino group, or an acylamino group.

The halogen atom is preferably a chlorine atom.

The number of carbon atoms in the alkyl group is preferably 1 to 20, more preferably 1 to 10, still more preferably 1 to 5, and most preferably 1 to 4. The alkyl group is preferably linear or branched.

The amino group is preferably a group represented by $-NR^{100}R^{101}$. $R^{100}$ and $R^{101}$ each independently represent a hydrogen atom or an alkyl group having 1 to 30 carbon atoms. The number of carbon atoms in the alkyl group is preferably 1 to 30, more preferably 1 to 20, still more preferably 1 to 10, and even still more preferably 1 to 8. The alkyl group is preferably linear or branched and more preferably linear.

The acylamino group is preferably a group represented by $-NR^{102}-C(=O)-R^{103}$. $R^{102}$ represents a hydrogen atom or an alkyl group and preferably a hydrogen atom. $R^{103}$ represents an alkyl group. The number of carbon atoms in the alkyl group represented by $R^{102}$ and $R^{103}$ is preferably 1 to 20, more preferably 1 to 10, still more preferably 1 to 5, and even still more preferably 1 to 4.

In a case where the aryl group and the heteroaryl group have two or more substituents, the substituents may be the same as or different from each other.

Next, the group represented by Formula (12) which is represented by $A^1$ and $A^2$ will be described.

In Formula (12), $R^2$ represents an alkyl group, an alkenyl group, or an aralkyl group and preferably an alkyl group.

The number of carbon atoms in the alkyl group is preferably 1 to 30, more preferably 1 to 20, still more preferably 1 to 12, and even still more preferably 2 to 8.

The number of carbon atoms in the alkenyl group is preferably 2 to 30, more preferably 2 to 20, and still more preferably 2 to 12.

The alkyl group and the alkenyl group may be linear, branched, or cyclic and is preferably linear or branched.

The number of carbon atoms in the aralkyl group is preferably 7 to 30 and more preferably 7 to 20.

In Formula (12), the nitrogen-containing heterocycle formed by Z1 is preferably a 5-membered or 6-membered ring. In addition, the nitrogen-containing heterocycle is preferably a monocycle or a fused ring, more preferably a monocycle or a fused ring composed of 2 to 8 rings, still more preferably a monocycle or a fused ring composed of 2 to 4 rings, and even still more preferably a fused ring composed of 2 or 3 rings. In addition to a nitrogen atom, the nitrogen-containing heterocycle may include a sulfur atom. In addition, the nitrogen-containing heterocycle may have a substituent. Examples of the substituent include the groups described regarding the substituent T. For example, a halogen atom, an alkyl group, a hydroxy group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

It is preferable that the group represented by Formula (12) is a group represented by the following Formula (13) or (14).

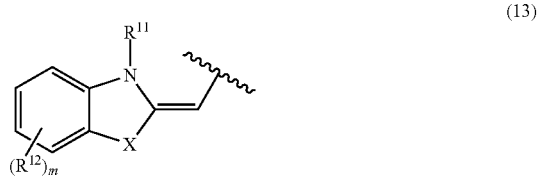

(13)

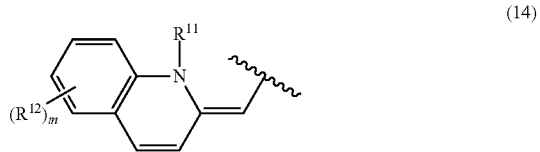

(14)

In Formulae (13) and (14), $R^{11}$ represents an alkyl group, an alkenyl group, or an aralkyl group, $R^{12}$ represents a substituent, in a case where m represents 2 or more, $R^{12}$'s may be linked to each other to form a ring, X represents a nitrogen atom or $CR^{13}R^{14}$, $R^{13}$ and $R^{14}$ each independently represent a hydrogen atom or a substituent, m represents an integer of 0 to 4, and a wave line represents a direct bond to a 4-membered ring of Formula (11).

$R^{11}$ in Formulae (13) and (14) has the same definition and the same preferable range as $R^2$ in Formula (12).

$R^{12}$ in Formulae (13) and (14) represents a substituent. Examples of the substituent include the groups described regarding the substituent T. For example, a halogen atom, an alkyl group, a hydroxy group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

In a case where m represents 2 or more, $R^{12}$'s may be linked to each other to form a ring. Examples of the ring include an alicyclic ring (a nonaromatic hydrocarbon ring), an aromatic ring, and a heterocycle. The ring may be a monocycle or a polycycle. In a case where substituents are linked to each other to form a ring, a linking group may be a divalent linking group selected from the group consisting of —CO—, —O—, —NH—, a divalent aliphatic group, a divalent aromatic group, and a combination thereof. For example, it is preferable that $R^{12}$'s may be linked to each other to form a benzene ring.

In Formula (13), X represents a nitrogen atom or $CR^{13}R^{14}$, and $R^{13}$ and $R^{14}$ each independently represent a hydrogen atom or a substituent. Examples of the substituent include the groups described regarding the substituent T. For example, the substituent is an alkyl group. The number of carbon atoms in the alkyl group is preferably 1 to 20, more preferably 1 to 10, still more preferably 1 to 5, even still more preferably 1 to 3, and most preferably 1. The alkyl group is preferably linear or branched and more preferably linear.

m represents an integer of 0 to 4 and preferably 0 to 2.

As shown below, cations in Formula (11) are present without localized.

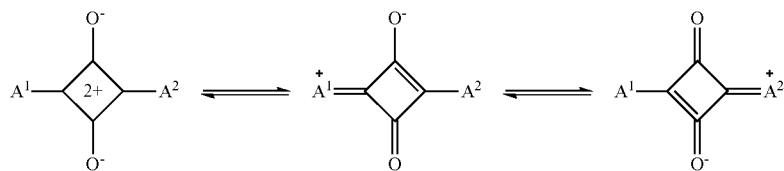

As the squarylium compound, for example, the following compound can be used. Other examples of the squarylium compound include a compound described in paragraphs "0044" to "0049" of JP2011-208101A, the content of which is incorporated herein by reference.

(Cyanine Compound)

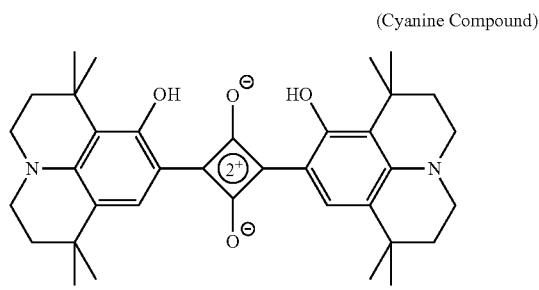

In the present invention, it is preferable that the cyanine compound is a compound represented by the following Formula (A).

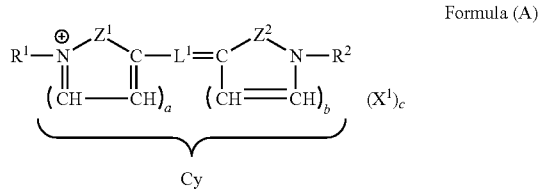

Formula (A)

In Formula (A), $Z^1$ and $Z^2$ each independently represent a non-metal atomic group for forming a 5- or 6-membered nitrogen-containing heterocycle which may be fused, $R^1$ and $R^2$ each independently represent an alkyl group, an alkenyl group, an alkynyl group, an aralkyl group, or an aryl group, $L^1$ represents a methine chain including an odd number of methine groups, and a and b each independently represent 0 or 1.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

In Formula (A), $Z^1$ and $Z^2$ each independently represent a non-metal atomic group for forming a 5- or 6-membered nitrogen-containing heterocycle which may be fused.

Another heterocycle, an aromatic ring, or an aliphatic ring may be fused to the nitrogen-containing heterocycle. It is preferable that the nitrogen-containing heterocycle is a 5-membered ring. It is more preferable that a benzene ring or a naphthalene ring is fused to the 5-membered nitrogen-containing heterocycle. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazol ring, an indolenine ring, a benzoindolenine ring, an imidazole ring, a benzimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. Among these, a quinoline ring, an indolenine ring, a benzoindolenine ring, a benzoxazole ring, a benzothiazole ring, or a benzimidazole ring is preferable, and an indolenine ring, a benzothiazole ring, or a benzimidazole ring is more preferable.

The nitrogen-containing heterocycle and a ring fused thereto may have a substituent. Examples of the substituent include a halogen atom, a cyano group, a nitro group, an alkyl group, an alkenyl group, an alkynyl group, an aryl group, a heteroaryl group, an aralkyl group, —$OR^{10}$, —$COR^{11}$, —$COOR^{12}$, —$OCOR^{13}$, —$NR^{14}R^{15}$, —NH$COR^{16}$, —$CONR^{17}R^{18}$, —$NHCONR^{19}R^{20}$, —$NHCOOR^{21}$, —$SR^{22}$, —$SO_2R^{23}$, —$SO_2OR^{24}$, —$NHSO_2R^{25}$, and —$SO_2NR^{26}R^{27}$. $R^{10}$ to $R^{27}$ each independently represent a hydrogen atom, an alkyl group, an alkenyl group, an alkynyl group, an aryl group, a heteroaryl group, or an aralkyl group. In a case where $R^{12}$ in —$COOR^{12}$ represents a hydrogen atom (that is, a carboxyl group), the hydrogen atom may be dissociable (that is, a carbonate group) or may be in the form of a salt. In a case where $R^{24}$ in —$SO_2OR^{24}$ represents a hydrogen atom (that is, a sulfo group), the hydrogen atom may be dissociable (that is, a sulfonate group) or may be in the form of a salt.

The alkyl group, the alkenyl group, the alkynyl group, the aralkyl group, the aryl group, and the heteroaryl group may have a substituent or may be unsubstituted. Examples of the substituent include the groups described regarding the substituent group T. Among these, a halogen atom, a hydroxy group, a carboxyl group, a sulfo group, an alkoxy group, or an amino group is preferable, a carboxyl group or a sulfo group is more preferable, and a sulfo group is still more preferable. In the carboxyl group and the sulfo group, a hydrogen atom may be dissociable or may be in the form of a salt.

In Formula (A), $R^1$ and $R^2$ each independently represent an alkyl group, an alkenyl group, an alkynyl group, an aralkyl group, or an aryl group.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The alkyl group, the alkenyl group, the alkynyl group, the aralkyl group, and the aryl group may have a substituent or may be unsubstituted. Examples of the substituent include a halogen atom, a hydroxy group, a carboxyl group, a sulfo group, an alkoxy group, and an amino group. Among these, a carboxyl group or a sulfo group is preferable, and a sulfo group is more preferable. In the carboxyl group and the sulfo group, a hydrogen atom may be dissociable or may be in the form of a salt.

In Formula (A), $L^1$ represents a methine chain including an odd number of methine groups. $L^1$ represents preferably a methine chain including 3, 5, or 7 methine groups and more preferably a methine chain including 5 or 7 methine groups.

The methine group may have a substituent. It is preferable that the methine group having a substituent is a methine group positioned at the center (meso position). Specific examples of the substituent include a substituent which may be included in the nitrogen-containing heterocycle represented by $Z^1$ and $Z^2$, and a group represented by the following Formula (a). In addition, two substituents in the methine chain may be bonded to each other to form a 5- or 6-membered ring.

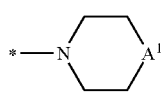

(a)

In Formula (a), * represents a linking portion to the methine chain, and $A^1$ represents an oxygen atom or a sulfur atom.

a and b each independently represent 0 or 1. In a case where a represents 0, a carbon atom and a nitrogen atom are bonded through a double bond. In a case where b represents 0, a carbon atom and a nitrogen atom are bonded through a single bond. It is preferable that both a and b represent 0. In a case where both a and b represent 0, Formula (A) will be shown below.

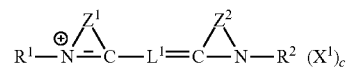

In a case where a site represented by Cy in Formula (A) is a cation site, $X^1$ represents an anion, and c represents the number of $X^1$'s for balancing charge. Examples of the anion include an halide ion ($Cl^-$, $Br^-$, $I^-$), a p-toluenesulfonate ion, an ethyl sulfate ion, $PF_6^-$, $BF_4^-$ or $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), and a tetracyano borate anion.

In a case where a site represented by Cy in Formula (A) is an anion site, $X^1$ represents a cation, and c represents the number of $X^1$'s for balancing charge. Examples of the cation include an alkali metal ion (for example, $Li^+$, $Na^+$, or $K^+$), an alkali earth metal ion ($Mg^{2+}$, $Ca^{2+}$, $Ba^{2+}$, or $Sr^{2+}$), a transition metal ion (for example, Ag, $Fe^{2+}$, $Co^{2+}$, $Ni^{2+}$, $Cu^{2+}$, or $Zn^{2+}$), other metal ions (for example, $Al^{3+}$), an ammonium ion, a triethylammonium ion, a tributylammonium ion, a pyridinium ion, a tetrabutylammonium ion, a guanidinium ion, a tetramethylguanidinium ion, and diazabicycloundecenium. As the cation, $Na^+$, $K^+$, $Mg^{2+}$, $Ca^{2+}$, $Zn^{2+}$, or diazabicycloundecenium is preferable.

In a case where charge of a site represented by Cy in Formula (A) is neutralized in a molecule, $X^1$ is not present. That is, c represents 0.

As the cyanine compound, for example, the following compound can be used. In addition, other examples of the cyanine compound include a compound described in paragraphs "0044" and "0045" of JP2009-108267A and a compound described in paragraphs "0026" to "0030" of JP2002-194040A, the content of which is incorporated herein by reference.

(Diimmonium Compound)

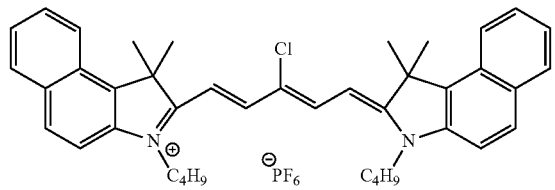

In the present invention, it is preferable that the diimmonium compound is a compound represented by the following Formula (Im).

Formula (Im)

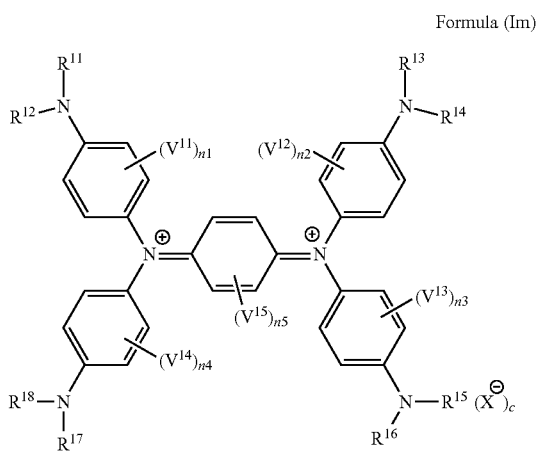

(Phthalocyanine Compound)

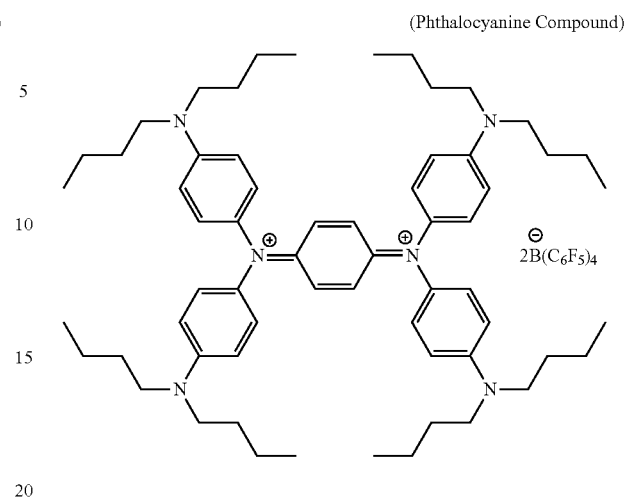

In the formula, $R^{11}$ to $R^{18}$ each independently represent an alkyl group or an aryl group, $V^{11}$ to $V^{15}$ each independently represent an alkyl group, an aryl group, a halogen atom, an alkoxy group, or a cyano group, X represents an anion, c represents the number of X's for balancing charge, and n1 to n5 each independently 0 to 4.

$R^{11}$ to $R^{18}$ each independently represent an alkyl group or an aryl group. The number of carbon atoms in the alkyl group is preferably 1 to 20, more preferably 1 to 12, and still more preferably 1 to 8. The alkyl group may be linear, branched, or cyclic and is preferably linear or branched and more preferably linear. The number of carbon atoms in the aryl group is preferably 6 to 25, more preferably 6 to 15, and still more preferably 6 to 12. The alkyl group and the aryl group may have a substituent or may be unsubstituted. Examples of the substituent include the groups described regarding the substituent T.

$V^{11}$ to $V^{15}$ each independently represent an alkyl group, an aryl group, a halogen atom, an alkoxy group, or a cyano group. Examples of the halogen atom include a fluorine atom, a chlorine atom, a bromine atom, and an iodine atom. The number of carbon atoms in the alkyl group is preferably 1 to 20, more preferably 1 to 12, and still more preferably 1 to 8. The alkyl group may be linear, branched, or cyclic and is preferably linear or branched and more preferably linear. The number of carbon atoms in the aryl group is preferably 6 to 25, more preferably 6 to 15, and still more preferably 6 to 12. The number of carbon atoms in the alkoxy group is preferably 1 to 20, more preferably 1 to 12, and still more preferably 1 to 8. The alkoxy group may be linear, branched, or cyclic and is preferably linear or branched and more preferably linear.

n1 to n5 each independently 0 to 4. n1 to n4 represents preferably 0 to 2 and more preferably 0 or 1. n5 represents preferably 0 to 3 and more preferably 0 to 2.

As the diimmonium compound, for example, the following compound can be used. Other examples of the diimmonium compound include a compound described in JP2008-528706A, the content of which is incorporated herein by reference.

In the present invention, it is preferable that the phthalocyanine compound is a compound represented by the following Formula (PC).

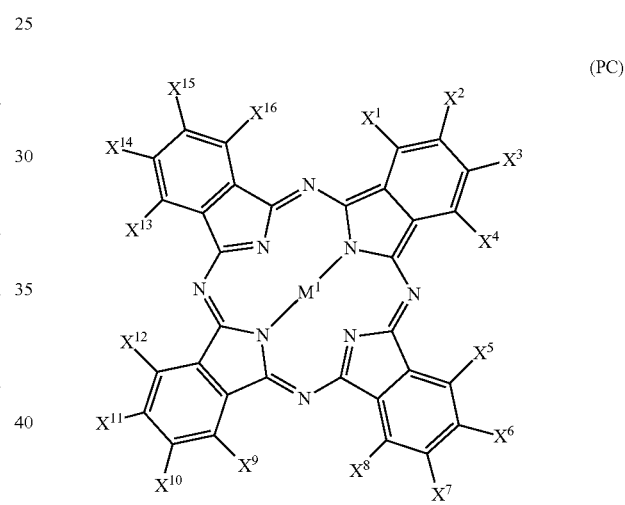

In Formula (PC), $X^1$ to $X^{16}$ each independently represent a hydrogen atom or a substituent, and $M^1$ represents Cu or V=O.

Examples of the substituent represented by $X^1$ to $X^{16}$ include the groups described above regarding the substituent T. Among these, an alkyl group, a halogen atom, an alkoxy group, a phenoxy group, an alkylthio group, a phenylthio group, an alkylamino group, or an anilino group is preferable.

The number of substituents among $X^1$ to $X^{16}$ is preferably 0 to 16, more preferably 0 to 4, still more preferably 0 or 1, and even still more preferably 0. In addition, it is preferable that $M^1$ represents Ti=O.

As the phthalocyanine compound, for example, the following compound can be used. In addition, other examples of the phthalocyanine compound include a compound described in paragraph "0093" of JP2012-77153A and oxytitaniumphthalocyanine described in JP2006-343631A, the content of which is incorporated herein by reference.

(Naphthalocyanine Compound)

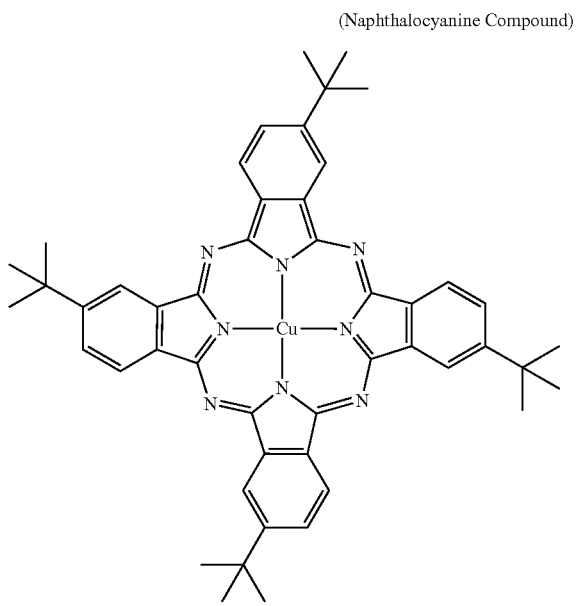

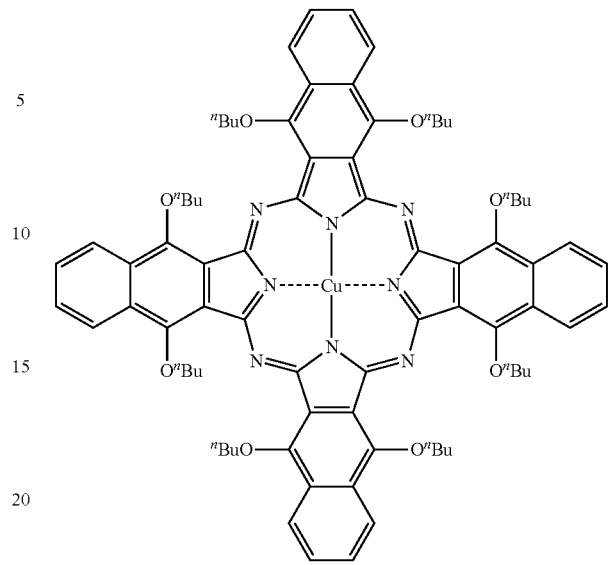

In the present invention, it is preferable that the naphthalocyanine compound is a compound represented by the following Formula (NPC).

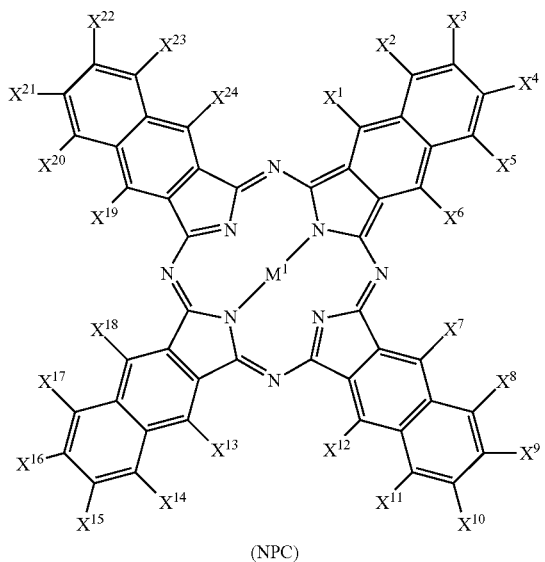

(NPC)

In Formula (NPC), $X^1$ to $X^{24}$ each independently represent a hydrogen atom or a substituent, and $M^1$ represents Cu or V=O. Examples of the substituent represented by $X^1$ to $X^{24}$ include the groups described above regarding the substituent group T. Among these, an alkyl group, a halogen atom, an alkoxy group, a phenoxy group, an alkylthio group, a phenylthio group, an alkylamino group, or an anilino group is preferable. It is preferable that $M^1$ represents V=O.

As the naphthalocyanine compound, for example, the following compound can be used. Other examples of the squarylium compound include a compound described in paragraph "0093" of JP2012-77153A, the content of which is incorporated herein by reference. In the following formula, Bu represents a butyl group.

<<Inorganic Particles>>

The near infrared absorbing composition according to the present invention may include inorganic particles. As the inorganic particles, one kind may be used alone, or two or more kinds may be used in combination.

The inorganic particles mainly function to shield (absorb) infrared light. As the inorganic particles, metal oxide particles or metal particles are preferable from the viewpoint of further improving infrared shielding properties.

Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles.

Examples of the metal particles include silver (Ag) particles, gold (Au) particles, copper (Cu) particles, and nickel (Ni) particles. In order to simultaneously realize infrared shielding properties and photolithographic properties, it is preferable that the transmittance in an exposure wavelength range (365 to 405 nm) is high. From this point of view, indium tin oxide (ITO) particles or antimony tin oxide (ATO) particles are preferable.

The shape of the inorganic particles is not particularly limited and may have a sheet shape, a wire shape, or a tube shape irrespective of whether or not the shape is spherical or non-spherical.

In addition, as the inorganic particles, a tungsten oxide compound can be used. Specifically, a tungsten oxide compound represented by the following Formula (compositional formula) (I) is more preferable.

$$M_xW_yO_z \quad (1)$$

M represents metal, W represents tungsten, and O represents oxygen.

$0.001 \leq x/y \leq 1.1$ $2.2 \leq z/y \leq 3.0$

Examples of the metal represented by M include an alkali metal, an alkali earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi. Among these, an alkali metal is preferable, Rb or Cs is more preferable, and Cs is still more preferable. As the metal represented by M, one kind or two or more kinds may be used.

By adjusting x/y to be 0.001 or higher, infrared light can be sufficiently shielded. By adjusting x/y to be 1.1 or lower, production of an impurity phase in the tungsten oxide compound can be reliably avoided.

By adjusting z/y to be 2.2 or higher, chemical stability as a material can be further improved. By adjusting z/y to be 3.0 or lower, infrared light can be sufficiently shielded. Specific examples of the tungsten oxide compound represented by Formula (I) include $Cs_{0.33}WO_3$, $Rb_{0.33}WO_3$, $K_{0.33}WO_3$, and $Ba_{0.33}WO_3$. Among these, $Cs_{0.33}WO_3$ or $Rb_{0.33}WO_3$ is preferable, and $Cs_{0.33}WO_3$ is more preferable.

The tungsten oxide compound is available in the form of, for example, a dispersion of tungsten particles such as YMF-02 (manufactured by Sumitomo Metal Mining Co., Ltd.).

The average particle size of the inorganic particles is preferably 800 nm or less, more preferably 400 nm or less, and still more preferably 200 nm or less. By adjusting the average particle size of the inorganic particles to be in the above-described range, transmittance in a visible range can be reliably improved. From the viewpoint of avoiding light scattering, the less the average particle size, the better. However, due to the reason of handleability during manufacturing or the like, the average particle size of the inorganic particle is typically 1 nm or more.

The content of the inorganic particles is preferably 0.01 to 30 mass % with respect to the total solid content of the near infrared absorbing composition. The lower limit is preferably 0.1 mass % or higher and more preferably 1 mass % or higher. The upper limit is preferably 20 mass % or lower, and more preferably 10 mass % or lower.

<<Solvent>>

The near infrared absorbing composition according to the present invention includes a solvent. The solvent is not particularly limited as long as the respective components can be uniformly dissolved or dispersed therein, and can be appropriately selected according to the purpose. For example, water or an organic solvent can be used.

Examples of the organic solvent include an alcohol, a ketone, an ester, an aromatic hydrocarbon, a halogenated hydrocarbon, dimethylformamide, dimethylacetamide, dimethyl sulfoxide, and sulfolane. Among these, one kind may be used alone, or two or more kinds may be used in combination.

Specific examples of the alcohol, the aromatic hydrocarbon, and the halogenated hydrocarbon can be found in, for example, paragraph "0136" of JP2012-194534A, the content of which is incorporated herein by reference.

Specific examples of the ester, the ketone, and the ether can be found in, for example, paragraph "0497" of JP2012-208494A (corresponding to paragraph "0609" of US2012/0235099A). Other examples include n-amyl acetate, ethyl propionate, dimethyl phthalate, ethyl benzoate, methyl sulfate, acetone, methyl isobutyl ketone, diethyl ether, and ethylene glycol monobutyl ether acetate.

As the solvent, at least one selected from the group consisting of 1-methoxy-2-propanol, cyclopentanone, cyclohexanone, propylene glycol monomethyl ether acetate, N-methyl-2-pyrrolidone, butyl acetate, ethyl lactate, and propylene glycol monomethyl ether is preferably used.

In the present invention, a solvent having a low metal content is preferable. For example, the metal content in the solvent is preferably 10 ppb or lower. Optionally, a solvent having a metal content at a ppt level may be used. For example, such a high-purity solvent is available from Toyo Gosei Co., Ltd.

Examples of a method of removing impurities such as metal from the solvent include distillation (for example, molecular distillation or thin-film distillation) and filtering using a filter. During the filtering using a filter, the pore size of a filter is preferably 10 nm or less, more preferably 5 nm or less, and still more preferably 3 nm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

The content of the solvent is preferably 5 to 60 mass % with respect to the total solid content of the near infrared absorbing composition according to the present invention. The lower limit is more preferably 10 mass % or higher. The upper limit is more preferably 40 mass % or lower.

As the solvent, one kind or two or more kinds may be used. In a case where two or more solvents are used, it is preferable that the total content of the two or more solvents is in the above-described range.

<<Compound Having Crosslinking Group (Crosslinking Compound)>>

The near infrared absorbing composition according to the present invention may include a compound having a crosslinking group (hereinafter, also referred to as "crosslinking compound") as a component other than the resin A. Examples of the crosslinking compound include a compound which has a group having an ethylenically unsaturated bond, a compound having a cyclic ether group, a compound having a methylol group, and a compound having an alkoxysilyl group. The details of the group having an ethylenically unsaturated bond, the cyclic ether group, and the alkoxysilyl group can be found in the ranges described above regarding the resin.

The crosslinking compound may be in the form of a monomer or a polymer and is preferably a monomer. The molecular weight of the monomer type crosslinking compound is preferably 100 to 3000. The upper limit is preferably 2000 or lower and more preferably 1500 or lower. The lower limit is preferably 150 or higher and more preferably 250 or higher. In addition, it is preferable that the crosslinking compound is a compound substantially not having a molecular weight distribution. Here, the compound substantially not having a molecular weight distribution represent that the dispersity (weight-average molecular weight (Mw)/number-average molecular weight (Mn)) of the compound is preferably 1.0 to 1.5 and more preferably 1.0 to 1.3. Examples of the polymer type crosslinking compound include a resin which includes a repeating unit having a crosslinking group and an epoxy resin. Examples of the repeating unit having a crosslinking group include the repeating units represented by Formulae (A2-1) to (A2-4) described above regarding the resin A.

In the case of the monomer type crosslinking compound, a crosslinking group equivalent weight of the crosslinking compound is preferably 3.0 to 8.0 mmol/g, more preferably 3.5 to 8.0 mmol/g, and still more preferably 4.0 to 7.0 mmol/g. In addition, it is preferable that the monomer type crosslinking compound has two or more crosslinking groups in one molecule. The upper limit is, for example, preferably 15 or less, more preferably 10 or less, and still more preferably 6 or less. In the case of the polymer type crosslinking compound, the crosslinking group equivalent weight of the crosslinking compound is preferably 0.5 to 4.0 mmol/g, more preferably 0.5 to 3.0 mmol/g, and still more preferably 1.0 to 3.0 mmol/g. The crosslinking group equivalent weight of the crosslinking compound is defined as the amount (mmol) of crosslinking groups included 1 g of a sample.

In the present invention, as the crosslinking compound, a compound which has a group having an ethylenically unsaturated bond, a compound having a cyclic ether group, a compound having an alkoxysilyl group is preferable, and a compound having an alkoxysilyl group is more preferable. A monomer type compound having an alkoxysilyl group is still more preferable. In addition, a silicon valence the monomer type compound having an alkoxysilyl group is preferably 3.0 to 8.0 mmol/g, more preferably 3.5 to 8.0 mmol/g, and still more preferably 4.0 to 7.0 mmol/g. The silicon valence of the crosslinking compound is defined as the amount (mmol) of silicon included 1 g of a sample.

(Compound which has Group Having Ethylenically Unsaturated Bond)

In the present invention, as the crosslinking compound, a compound which has a group having an ethylenically unsaturated bond can be used. It is preferable that the compound which has a group having an ethylenically unsaturated bond is a monomer. The molecular weight of the compound is preferably 100 to 3000. The upper limit is preferably 2000 or lower and more preferably 1500 or lower. The lower limit is preferably 150 or higher and more preferably 250 or higher. The compound is preferably a (meth)acrylate compound having 3 to 15 functional groups and more preferably a (meth)acrylate compound having 3 to 6 functional groups.

Examples of the compound which has a group having an ethylenically unsaturated bond can be found in paragraphs "0033" and "0034" of JP2013-253224A, the content of which is incorporated herein by reference. As the compound which has a group having an ethylenically unsaturated bond, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth) acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol or a propylene glycol residue is preferable. In addition, oligomers of the above-described examples can be used. In addition, the compound having an ethylenically unsaturated bond can be found in the description of a polymerizable compound in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US2012/0235099A), the content of which is incorporated herein by reference.

In addition, diglycerin ethylene oxide (EO)-modified (meth)acrylate (as a commercially available product, M-460 manufactured by Toagosei Co., Ltd.) is preferable. Pentaerythritol tetraacrylate (A-TMMT manufactured by Shin-Nakamura Chemical Co., Ltd.) or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The compound which has a group having an ethylenically unsaturated bond may have an acid group such as a carboxyl group, a sulfo group, or a phosphate group. Examples of the compound having an acid group include an ester of an aliphatic polyhydroxy compound and an unsaturated carboxylic acid. A compound having an acid group obtained by causing a nonaromatic carboxylic anhydride to react with an unreacted hydroxy group of an aliphatic polyhydroxy compound is preferable. In particular, it is more preferable that, in this ester, the aliphatic polyhydroxy compound is pentaerythritol and/or dipentaerythritol. Examples of a commercially available product of the monomer having an acid group include M-305, M-510, and M-520 of ARONIX series as polybasic acid-modified acrylic oligomer (manufactured by Toagosei Co., Ltd.). The acid value of the compound having an acid group is preferably 0.1 to 40 mgKOH/g. The lower limit is preferably 5 mgKOH/g or higher. The upper limit is preferably 30 mgKOH/g or lower.

In addition, a compound having a caprolactone structure is also preferable as the compound which has a group having an ethylenically unsaturated bond. The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the compound having a caprolactone structure can be found in paragraphs "0042" to "0045" of JP2013-253224A, the content of which is incorporated herein by reference. Examples of the compound having a caprolactone structure include: DPCA-20, DPCA-30, DPCA-60, and DPCA-120 which are commercially available as KAYARADDPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the compound which has a group having an ethylenically unsaturated bond, a urethane acrylate described in JP1973-41708B (JP-S48-41708B), JP1976-37193A (JP-S51-37193A), JP1990-32293B (JP-H2-32293B), or JP1990-16765B (JP-H2-16765B), or a urethane compound having an ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, a curable coloring composition having an excellent film speed can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600 and AI-600 (manufactured by Kyoeisha Chemical Co., Ltd.).

In the present invention, as the compound which has a group having an ethylenically unsaturated bond, a polymer which has a group having an ethylenically unsaturated bond at a side chain can be used. The content of a repeating unit which has a group having an ethylenically unsaturated bond at a side chain is preferably 5 to 100 mass % with respect to all the repeating units constituting the polymer. The lower limit is preferably 10 mass % or higher and more preferably 15 mass % or higher. The upper limit is preferably 90 mass % or lower, more preferably 80 mass % or lower, and still more preferably 70 mass % or lower.

The polymer may include other repeating units in addition to the repeating unit which has a group having an ethylenically unsaturated bond at a side chain. The other repeating units may have a functional group such as an acid group. The other repeating units may not have a functional group. Examples of the acid group include a carboxyl group, a sulfonate group, and a phosphate group. As the acid group, one kind may be used, or two or more kinds may be used. The proportion of the repeating unit having an acid group is preferably 0 to 50 mass % with respect to all the repeating units constituting the polymer. The lower limit is preferably 1 mass % or higher and more preferably 3 mass % or higher. The upper limit is more preferably 35 mass % or lower, and still more preferably 30 mass % or lower.

Specific examples of the polymer include a copolymer including (meth)allyl (meth)acrylate and (meth)acrylic acid. Examples of a commercially available product of the polymerizable polymer include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

(Compound Having Cyclic Ether Group)

In the present invention, as the crosslinking compound, a compound having a cyclic ether group can also be used. Examples of the cyclic ether group include an epoxy group and an oxetanyl group. Among these, an epoxy group is preferable.

Examples of the compound having a cyclic ether group include a polymer having a cyclic ether group at a side chain and a monomer or an oligomer having two or more cyclic ether groups in a molecule. Examples of the compound include a bisphenol A epoxy resin, a bisphenol F epoxy resin, a phenol novolac epoxy resin, a cresol novolac epoxy resin, and an aliphatic epoxy resin. In addition, a monofunctional or polyfunctional glycidyl ether compound can also be used, and a polyfunctional aliphatic glycidyl ether compound is preferable.

The weight-average molecular weight of the compound having a cyclic ether group is preferably 500 to 5000000 and more preferably 1000 to 500000. As the compound, a commercially available product may be used, or a compound obtained by introducing an epoxy group into a side chain of the polymer may be used.

Examples of a commercially available product of the compound having a cyclic ether group can be found in, for example, paragraph "0191" JP2012-155288A, the content of which is incorporated herein by reference.

In addition, a polyfunctional aliphatic glycidyl ether compound such as DENACOL EX-212L, EX-214L, EX-216L, EX-321L, or EX-850L (all of which are manufactured by Nagase ChemteX Corporation) can be used. The above-described examples are low-chlorine products, but a commercially available product which is not a low-chlorine product such as EX-212, EX-214, EX-216, EX-321, or EX-850 can also be used.

Other examples include: ADEKA RESIN EP-4000S, EP-4003S, EP-4010S, and EP-4011S (all of which are manufactured by Adeka Corporation); NC-2000, NC-3000, NC-7300, XD-1000, EPPN-501, and EPPN-502 (all of which are manufactured by Adeka Corporation); JER1031S, CELLOXIDE 2021P, CELLOXIDE 2081, CELLOXIDE 2083, CELLOXIDE 2085, EHPE 3150, EPOLEAD PB 3600, and EPOLEAD PB 4700 (all of which are manufactured by Daicel Corporation); and CYCLOMER P ACA 200M, CYCLOMER P ACA 230AA, CYCLOMER P ACA Z250, CYCLOMER P ACA Z251, CYCLOMER P ACA Z300, and CYCLOMER P ACA Z320 (all of which are manufactured by Daicel Corporation).

Further, examples of a commercially available product of the phenol novolac epoxy resin include JER-157S65, JER-152, JER-154, and JER-157S70 (all of which are manufactured by Mitsubishi Chemical Corporation).

In addition, specific examples of a polymer having an oxetanyl group at a side chain and a polymerizable monomer or an oligomer having two or more oxetanyl groups in a molecule ARONE OXETANE OXT-121, OXT-221, OX-SQ, and PNOX (all of which are manufactured by Toagosei Co., Ltd.).

As the compound having an epoxy group, a compound having a glycidyl group such as glycidyl (meth)acrylate or allyl glycidyl ether can be used, and an unsaturated compound having an alicyclic epoxy group is preferable. Examples of the compound having an epoxy group can be found in, for example, paragraph "0045" of JP2009-265518A, the content of which is incorporated herein by reference.

The compound having a cyclic ether group may include a polymer having an epoxy group or an oxetanyl group as a repeating unit.

(Compound Having Alkoxysilyl Group)

In the present invention, as the crosslinking compound, a compound having an alkoxysilyl group can also be used. The number of carbon atoms in the alkoxy group of the alkoxysilyl group is preferably 1 to 5, more preferably 1 to 3, and still more preferably 1 or 2. It is preferable that two or more alkoxysilyl groups are present in one molecule, and it is more preferable that two or three alkoxysilyl groups are present in one molecule. Specific examples of the compound having an alkoxysilyl group include methyl trimethoxysilane, dimethyl dimethoxysilane, phenyl trimethoxysilane, methyltriethoxysilane, and dimethyl diethoxysilane, phenyltriethoxysilane, n-propyltrimethoxysilane, n-propyltriethoxysilane, hexyl trimethoxysilane, hexyl triethoxysilane, octyl triethoxysilane, decyl trimethoxysilane, 1,6-bis(trimethoxysilyl)hexane, trifluoropropyltrimethoxysilane, hexamethyldisilazane, vinyl trimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2-(aminoethyl)-3- aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, tris-(trimethoxysilylpropyl)isocyanurate, 3-ureidopropyltriethoxysilane, 3-mercaptopropylmethyldimethoxysilane, 3-mercaptopropyltrimethoxysilane, and bis(triethoxysilylpropyl)tetrasulfide, and 3-isocyanatepropyltriethoxysilane. In addition to the above-described examples, an alkoxy oligomer can be used. In addition, the following compounds can also be used.

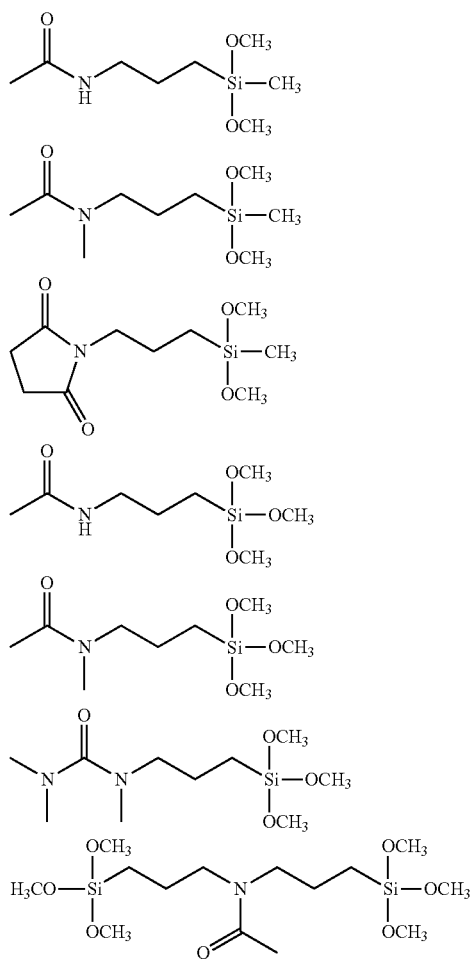

Examples of a commercially available product of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, X-40-9225, X-40-9246, X-40-9250, KR-401N, X-40-9227, X-40-9247, KR-510, KR-9218, KR-213, X-40-2308, and X-40-9238 (all of which are manufactured by Shin-Etsu Chemical Co., Ltd.).

In addition, as the compound having an alkoxysilyl group, a polymer having an alkoxysilyl group at a side chain can also be used.

In a case where the near infrared absorbing composition according to the present invention includes a crosslinking compound, the content of the crosslinking compound is preferably 1 to 30 mass %, more preferably 1 to 25 mass %, and still more preferably 1 to 20 mass % with respect to the total solid content of the near infrared absorbing composition. In addition, the content of the crosslinking compound is preferably 1 to 60 parts by mass, more preferably 1 to 50 parts by mass, and still more preferably 1 to 40 parts by mass with respect to 100 parts by mass of the resin A. As the crosslinking compound, one kind may be used alone, or two or more kinds may be used. In a case where two or more crosslinking compounds are used in combination, it is preferable that the total content of the two or more crosslinking compounds is in the above-described range.

The near infrared absorbing composition according to the present invention may not substantially include the crosslinking compound. "Substantially not including the crosslinking compound" represents that the content of the crosslinking compound is preferably 0.5 mass % or lower, more preferably 0.1 mass % or lower, and still more preferably 0% with respect to the total solid content of the near infrared absorbing composition.

<<Other Resins>>

The near infrared absorbing composition according to the present invention may include resins (hereinafter, also referred to as "other resins") other than the resin A and the crosslinking compound. That is, the near infrared absorbing composition according to the present invention may include a resin having a glass transition temperature of lower than 0° C. or a resin having a glass transition temperature of higher than 100° C. The details of the other resins can be found in paragraphs "0558" to "0571" of JP2012-208494A (corresponding to paragraphs "0685" to "0700" of US2012/0235099A), the content of which is incorporated herein by reference.

In a case where the near infrared absorbing composition according to the present invention includes the other resins, the content of the other resins is preferably 1 to 80 mass % with respect to the total solid content of the near infrared absorbing composition. The lower limit is preferably 5 mass % or higher and more preferably 7 mass % or higher. The upper limit is preferably 50 mass % or lower, and more preferably 30 mass % or lower.

<<Dehydrating Agent, Alkyl Alcohol>>

In a case where a dehydrating agent or an alkyl alcohol is added to the near infrared absorbing composition according to the present invention, the storage stability of the solution can be improved. Specific examples of the dehydrating agent include:

a silane compound such as vinyl trimethoxysilane, dimethyl dimethoxysilane, tetraethoxysilane, methyl trimethoxysilane, methyltriethoxysilane, tetramethoxysilane, phenyl trimethoxysilane, or diphenyl dimethoxysilane;

an orthoester compound such as methyl orthoformate, ethyl orthoformate, methyl orthoacetate, ethyl orthoacetate, trimethyl orthopropionate, triethyl orthopropionate, trimethyl orthoisopropionate, triethyl orthoisopropionate, trimethyl orthobutyrate, triethyl orthobutyrate, trimethyl orthoisobutyrate, or triethyl orthoisobutyrate; and a ketal compound such as acetone dimethyl ketal, diethyl ketone dimethyl ketal, acetophenone dimethyl ketal, cyclohexanone dimethyl ketal, cyclohexanone diethyl ketal, or benzophenone dimethyl ketal. Among these, one kind may be used alone, or two or more kinds may be used in combination.

In addition, specific examples of the alkyl alcohol include a lower alcohol having 1 to 4 carbon atoms such as methanol or ethanol.

For example, the dehydrating agent or the alkyl alcohol may be added to components before polymerization of the resin A, may be added during polymerization of the resin A, or may be added during mixing of the obtained resin A and other components without any particular limitation.

The content of the dehydrating agent and the alkyl alcohol is not particularly limited, and is preferably 0.5 to 20 parts by mass and more preferably 2 to 10 parts by mass with respect to 100 parts by mass of the resin A.

<<Polymerization Initiator>>

The near infrared absorbing composition according to the present invention may include a polymerization initiator. The polymerization initiator is not particularly limited as long as it has an ability to start polymerization of a polymerizable compound using either or both light and heat. In particular, a photopolymerization initiator is preferable. For example, in a case where polymerization starts by light, a photopolymerization initiator having photosensitivity to light in a range from an ultraviolet range to a visible range is preferable. In addition, in a case where polymerization starts by heat, a polymerization initiator which is decomposed at 150° C. to 250° C. is preferable.

As the polymerization initiator, a compound having an aromatic group is preferable. Examples of the polymerization initiator include an acylphosphine compound, an acetophenone compound, an α-aminoketone compound, a benzophenone compound, a benzoin ether compound, a ketal compound, a thioxanthone compound, an oxime compound, a hexaarylbiimidazole compound, a trihalomethyl compound, an azo compound, an organic peroxide, an onium salt compound such as a diazonium compound, an iodonium compound, a sulfonium compound, an azinium compound, or a metallocene compound, an organic boron salt compound, a disulfone compound, and a thiol compound.

For example, the details of the polymerization initiator can be found in paragraphs "0217" to "0228" of JP2013-253224A, the content of which is incorporated herein by reference.

As the polymerization initiator, an oxime compound, an acetophenone compound or an acylphosphine compound is preferable. As a commercially available product of the acetophenone compound, for example, IRGACURE-907, IRGACURE-369, or IRGACURE-379 (trade name, all of which are manufactured by BASF SE) can be used. As a commercially available product of the acylphosphine compound, IRGACURE-819 or DAROCUR-TPO (trade name, all of which are manufactured by BASF SE) can be used.

The content of the polymerization initiator is preferably 0.01 to 30 mass % with respect to the total solid content of the near infrared absorbing composition. The lower limit is more preferably 0.1 mass % or higher. The upper limit is preferably 20 mass % or lower, and more preferably 15 mass % or lower. As the polymerization initiator, one kind or two or more kinds may be used. In a case where two or more polymerization initiators are used, it is preferable that the total content of the two or more polymerization initiators is in the above-described range.

<<Catalyst>>

The near infrared absorbing composition according to the present invention may include a catalyst. For example, in a case where the resin which includes a repeating unit having a crosslinking group such as an alkoxysilyl group is used as the resin A or in a case where the crosslinking compound is used, by the near infrared absorbing composition including the catalyst, crosslinking of the crosslinking group is promoted, and a cured film having excellent solvent resistance and heat resistance can be easily obtained.

Examples of the catalyst include an organic metal catalyst, an acid catalyst, and an amine catalyst. Among these, an organic metal catalyst is preferable. In the present invention, it is preferable that the organic metal catalyst is at least one selected from the group consisting of an oxide, a sulfide, a halide, a carbonate, a carboxylate, a sulfonate, a phosphate, a nitrate, a sulfate, an alkoxide, a hydroxide, and an acetylacetonato complex which may have a substituent, the at least one including at least one metal selected from the group consisting of Na, K, Ca, Mg, Ti, Zr, Al, Zn, Sn, and Bi. Among these, at least one selected from the group consisting of a halide of the metal, a carboxylate of the metal, a nitrate of the metal, a sulfate of the metal, a hydroxide of the metal, and an acetylacetonato complex of the metal which may have a substituent is preferable, and an acetylacetonato complex of the metal is more preferable. In particular, an acetylacetonato complex of Al is preferable. Specific examples of the organic metal catalyst include aluminum tris(2,4-pentanedionate).

In a case where the near infrared absorbing composition according to the present invention includes the catalyst, the content of the catalyst is preferably 0.01 to 5 mass % with respect to the total solid content of the near infrared absorbing composition. The upper limit is more preferably 3 mass % or lower, and still more preferably 1 mass % or lower. The lower limit is more preferably 0.05 mass % or higher.

<<Heat Stability Imparting Agent>>

The near infrared absorbing composition according to the present invention may include a heat stability imparting agent. Examples of the heat stability imparting agent include an oxime compound.

As a commercially available product of the oxime compound, for example, IRGACURE-OXE01 (manufactured by BASF SE), IRGACURE-OXE02 (manufactured by BASF SE), TR-PBG-304 (manufactured by Changzhou Tronly New Electronic Materials Co., Ltd.), ADEKA ARKLS NCI-831 (manufactured by Adeka Corporation), or ADEKA ARKLS NCI-930 (manufactured by Adeka Corporation) can be used.

In the present invention, an oxime compound having a fluorine atom can also be used as the oxime compound. Specific examples of the oxime compound having a fluorine atom include a compound described in JP2010-262028A, Compound 24 and 36 to 40 described in JP2014-500852A, and Compound (C-3) described in JP2013-164471A. the content of which is incorporated herein by reference.

In the present invention, as the oxime compound, an oxime compound having a nitro group can be used. Specific examples of the oxime compound having a nitro group include compounds described in paragraphs "0031" to "0047" of JP2013-114249A and paragraphs "0008" to "0012" and "0070" to "0079" of JP2014-137466A, and ADEKA ARKLS NCI-831 (manufactured by Adeka Corporation).

The content of the heat stability imparting agent is preferably 0.01 to 30 mass % with respect to the total solid content of the near infrared absorbing composition. The lower limit is more preferably 0.1 mass % or higher. The upper limit is preferably 20 mass % or lower, and more preferably 10 mass % or lower.

<<Surfactant>>

The near infrared absorbing composition according to the present invention may include a surfactant. Among these surfactants, one kind may be used alone, or two or more kinds may be used in combination. The content of the surfactant is preferably 0.0001 to 5 mass % with respect to the total solid content of the near infrared absorbing composition. The lower limit is preferably 0.005 mass % or higher and more preferably 0.01 mass % or higher. The upper limit is preferably 2 mass % or lower, and more preferably 1 mass % or lower.

As the surfactants, various surfactants such as a fluorine surfactant, a nonionic surfactant, a cationic surfactant, an anionic surfactant, or a silicone surfactant can be used. It is preferable that the near infrared absorbing composition includes at least one of a fluorine surfactant or a silicone surfactant. The interfacial tension between a coated surface and a coating solution decreases, and the wettability on the coated surface is improved. Therefore, liquid properties (in particular, fluidity) of the composition are improved, and uniformity in coating thickness and liquid saving properties can be further improved. As a result, even in a case where a thin film having a thickness of several micrometers is formed using a small amount of the coating solution, a film having a uniform thickness with reduced unevenness in thickness can be formed.

The fluorine content in the fluorine surfactant is preferably 3 to 40 mass %. The lower limit is preferably 5 mass % or higher and more preferably 7 mass % or higher. The upper limit is more preferably 30 mass % or lower, and still more preferably 25 mass % or lower. In a case where the fluorine content is in the above-described range, there are advantageous effects in the uniformity in the thickness of the coating film and liquid saving properties, and the solubility is also excellent.

Examples of the fluorine surfactant include a surfactant described in paragraphs "0060" to "0064" of JP2014-41318A (paragraphs "0060" to "0064" of corresponding WO2014/17669), the content of which is incorporated herein by reference. Examples of a commercially available product of the fluorine surfactant include: MEGAFACE F-171, F-172, F-173, F-176, F-177, F-141, F-142, F-143, F-144, R30, F-437, F-475, F-479, F-482, F-554, and F-780 (all of which are manufactured by DIC Corporation); FLUORAD FC430, FC431, and FC171 (all of which are manufactured by Sumitomo 3M Ltd.); and SURFLON S-382, SC-101, SC-103, SC-104, SC-105, SC1068, SC-381, SC-383, S393, and KH-40 (all of which are manufactured by Asahi Glass Co., Ltd.). As the fluorine surfactant, a compound described in paragraphs "0015" to "0158" of JP2015-117327A can also be used. As the fluorine surfactant, a block polymer can also be used, and specific examples thereof include a compound described in JP2011-89090A.

As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

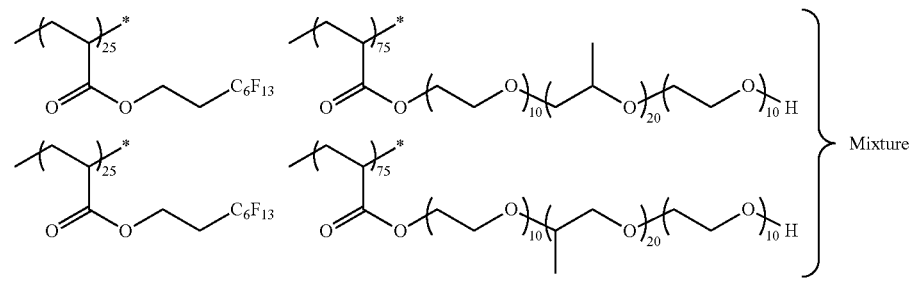

The weight-average molecular weight of the compound is preferably 3000 to 50000 and, for example, 14000.

In addition, a fluorine-containing polymer having an ethylenically unsaturated group at a side chain can also be preferably used as the fluorine surfactant. Specific examples include compounds described in paragraphs "0050" of "0090" and paragraphs "0289" to "0295" of JP2010-164965A, for example, MEGAFACE RS-101, RS-102, and RS-718K manufactured by DIC Corporation.

Specific examples of the nonionic surfactant include nonionic surfactants described in paragraph "0553" of JP2012-208494A (corresponding to paragraph "0679" of US2012/0235099A), the content of which is incorporated herein by reference.

Specific examples of the cationic surfactant include cationic surfactants described in paragraph "0554" of JP2012-208494A (corresponding to paragraph "0680" of US2012/0235099A), the content of which is incorporated herein by reference.

Specific examples of the anionic surfactant include W004, W005, and W017 (manufactured by Yusho Co., Ltd.).

Specific examples of the silicone surfactant include silicone surfactants described in paragraph "0556" of JP2012-208494A (corresponding to paragraph "0682" of US2012/0235099A), the content of which is incorporated herein by reference.

<<Other Components>>

Examples of other components which can be used in combination with the near infrared absorbing composition according to the present invention include a dispersant, a sensitizer, a curing accelerator, a filler, a thermal curing accelerator, a thermal polymerization inhibitor, and a plasticizer. Further, an accelerator for accelerating adhesion to a substrate surface and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent) may be used in combination. By the near infrared absorbing composition appropriately including the components, properties of a desired near infrared cut filter such as stability or film properties can be adjusted. The details of the components can be found in, for example, paragraph "0183" of JP2012-003225A (corresponding to "0237" of US2013/0034812A) and paragraphs "0101" to "0104" and "0107" to "0109" of JP2008-250074A, the content of which is incorporated herein by reference. In addition, examples of the antioxidant include a phenol compound, a phosphite compound, and a thioether compound. A phenol compound having a molecular weight of 500 or higher, a phosphite compound having a molecular weight of 500 or higher, or a thioether compound having a molecular weight of 500 or higher is more preferable. Among these compounds, a mixture of two or more kinds may be used. As the phenol compound, any phenol compound which is known as a phenol antioxidant can be used. As the phenol compound, for example, a hindered phenol compound is preferable. In particular, a compound having a substituent at a position (ortho-position) adjacent to a phenolic hydroxyl group is preferable. As the substituent, a substituted or unsubstituted alkyl group having 1 to 22 carbon atoms is preferable, and a methyl group, an ethyl group, a propionyl group, an isopropionyl group, a butyl group, an isobutyl group, a t-butyl group, a pentyl group, an isopentyl group, a t-pentyl group, a hexyl group, an octyl group, an isooctyl group, or a 2-ethylhexyl group is more preferable. In addition, a compound (antioxidant) having a phenol group and a phosphite group in the same molecule is also preferable. In addition, as the antioxidant, a phosphorus-based antioxidant can also be preferably used. Examples of the phosphorus-based antioxidant include at least one compound selected from the group consisting of tris[2-[[2, 4,8,10-tetrakis(1,1-dimethylethyl)dibenzo[d,f][1,3,2]dioxaphosphepin-6-yl]oxy]ethyl]amine, tris[2-[(4,6,9,11-tetra-t-butyldibenzo[d,f][1,3,2]dioxaphosphepin-2-yl)oxy]ethyl] amine, and ethyl bis(2,4-di-t-butyl-6-methylphenyl) phosphite. The phosphorus-based antioxidant is easily commercially available, and examples of the commercially available product include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). The content of the antioxidant is preferably 0.01 to 20 mass % and more preferably 0.3 to 15 mass % with respect to the mass of the total solid content of the composition. As the antioxidant, one kind may be used alone, or two or more kinds may be used. In a case where two or more antioxidants are used in combination, it is preferable that the total content of the two or more antioxidants is in the above-described range.

<Preparation and Use of Near Infrared Absorbing Composition>

The near infrared absorbing composition according to the present invention can be prepared by mixing the above-described components with each other.

During the preparation of the composition, the respective components constituting the composition may be mixed with each other collectively, or may be mixed with each other sequentially after dissolved and/or dispersed in a solvent. In addition, during mixing, the order of addition or working conditions are not particularly limited.

It is preferable that the near infrared absorbing composition according to the present invention is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including polypropylene having a high density and an ultrahigh molecular weight) such as polyethylene or polypropylene (PP). Among these materials, polypropylene (including polypropylene having a high density and an ultrahigh molecular weight) or nylon is preferable.

The pore size of the filter is suitably about 0.01 to 7.0 μm and is preferably about 0.01 to 3.0 μm and more preferably about 0.05 to 0.5 μm. In the above-described range, fine foreign matter can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation, Toyo Roshi Kaisha, Ltd., Entegris Japan Co., Ltd. (former Mykrolis Corporation), or Kits Microfilter Corporation.

A second filter may be formed of the same material as that of the first filter. The pore diameter of the second filter is preferably 0.2 to 10.0 μm, more preferably 0.2 to 7.0 μm, and still more preferably 0.3 to 6.0 μm. In the above-described range, foreign matter can be removed while allowing the component particles included in the composition to remain.

The near infrared absorbing composition according to the present invention can be made liquid. Therefore, a near infrared cut filter can be easily manufactured, for example, by applying the near infrared absorbing composition according to the present invention to a substrate or the like and drying the near infrared absorbing composition.

In a case where the near infrared cut filter is formed by applying the near infrared absorbing composition according to the present invention, the viscosity of the near infrared absorbing composition is preferably 1 to 3000 mPa·s. The lower limit is preferably 10 mPa·s or higher and more preferably 100 mPa·s or higher. The upper limit is preferably 2000 mPa·s or lower and more preferably 1500 mPa·s or lower.

The total solid content of the near infrared absorbing composition according to the present invention changes depending on a coating method and, for example, is preferably 1 to 50 mass %. The lower limit is more preferably 10 mass % or higher. The upper limit is more preferably 30 mass % or lower.

The use of the near infrared absorbing composition according to the present invention is not particularly limited. The near infrared absorbing composition can be preferably used for forming a near infrared cut filter or the like. For example, the near infrared absorbing composition can be preferably used, for example, for a near infrared cut filter (for example, a near infrared cut filter for a wafer level lens) on a light receiving side of a solid image pickup element or as a near infrared cut filter on a back surface side (opposite to the light receiving side) of a solid image pickup element In particular, the near infrared absorbing composition can be preferably used as a near infrared cut filter on a light receiving side of a solid image pickup element.

In addition, with the near infrared absorbing composition according to the present invention, a near infrared cut filter can be obtained in which heat resistance is high and high infrared shielding properties can be realized while maintaining a high transmittance in a visible range. Further, the thickness of the near infrared cut filter can be reduced, which contributes to a reduction in the height of a camera module or an image display device.

<Near Infrared Cut Filter>

In addition, a near infrared cut filter according to the present invention will be described.

The near infrared cut filter according to the present invention is formed using the above-described near infrared absorbing composition according to the present invention.

It is preferable that the light transmittance of the near infrared cut filter according to the present invention satisfies at least one of the following conditions (1) to (9), it is more preferable that the light transmittance of the near infrared cut filter according to the present invention satisfies all the following conditions (1) to (8), and it is still more preferable that the light transmittance of the near infrared cut filter according to the present invention satisfies all the following conditions (1) to (9).

(1) A light transmittance at a wavelength of 400 nm is preferably 80% or higher, more preferably 90% or higher, still more preferably 92% or higher, and even still more preferably 95% or higher (2) A light transmittance at a wavelength of 450 nm is preferably 80% or higher, more preferably 90% or higher, still more preferably 92% or higher, and even still more preferably 95% or higher (3) A light transmittance at a wavelength of 500 nm is preferably 80% or higher, more preferably 90% or higher, still more preferably 92% or higher, and even still more preferably 95% or higher (4) A light transmittance at a wavelength of 550 nm is preferably 80% or higher, more preferably 90% or higher, still more preferably 92% or higher, and even still more preferably 95% or higher (5) A light transmittance at a wavelength of 700 nm is preferably 20% or lower, more preferably 15% or lower, still more preferably 10% or lower, and even still more preferably 5% or lower (6) A light transmittance at a wavelength of 750 nm is preferably 20% or lower, more preferably 15% or lower, still more preferably 10% or lower, and even still more preferably 5% or lower (7) A light transmittance at a wavelength of 800 nm is preferably 20% or lower, more preferably 15% or lower, still more preferably 10% or lower, and even still more preferably 5% or lower (8) A light transmittance at a wavelength of 850 nm is preferably 20% or lower, more preferably 15% or lower, still more preferably 10% or lower, and even still more preferably 5% or lower (9) A light transmittance at a wavelength of 900 nm is preferably 20% or lower, more preferably 15% or lower, still more preferably 10% or lower, and even still more preferably 5% or lower A light transmittance of the near infrared cut filter in a wavelength range of 400 to 550 nm is preferably 85% or higher, more preferably 90% or higher, and still more preferably 95% or higher. The higher the transmittance in a visible range, the better. It is preferable that the transmittance in a wavelength range of 400 to 550 nm is high. In addition, it is preferable that a light transmittance at least one point in a wavelength range of 700 to 800 nm is 20% or lower, and it is more preferable that a light transmittance in the entire wavelength range of 700 to 800 nm is 20% or lower.

The thickness of the near infrared cut filter can be appropriately selected according to the purpose. For example, the thickness is preferably 500 µm or less, more preferably 300 µm or less, still more preferably 250 µm or less, and even still more preferably 200 µm or less. For example, the lower limit of the thickness is preferably 0.1 µm or more, more preferably 0.2 µm or more, and still more preferably 0.5 µm or more.

In the near infrared cut filter according to the present invention, a change rate of an absorbance at a wavelength of 400 nm measured before and after heating at 180° C. for 1 minute is preferably 6% or lower and more preferably 3% or lower, the change rate being expressed by the following expression. In addition, a change rate of an absorbance at a wavelength of 800 nm measured before and after heating at 180° C. for 1 minute is preferably 6% or lower and more preferably 3% or lower, the change rate being expressed by the following expression. In a case where the change rate of the absorbance is in the above-described range, a near infrared cut filter having excellent heat resistance in which discoloration caused by heating is suppressed can be obtained.

Change Rate (%) of Absorbance at Wavelength of 400 nm=|(Absorbance at Wavelength of 400 nm before Test-Absorbance at Wavelength of 400 nm after Test)/Absorbance at Wavelength of 400 nm before Test|×100(%)

Change Rate (%) of Absorbance at Wavelength of 800 nm=|(Absorbance at Wavelength of 800 nm before Test-Absorbance at Wavelength of 800 nm after Test)/Absorbance at Wavelength of 800 nm before Test|×100(%)

In the near infrared cut filter according to the present invention, a change rate of an absorbance at a wavelength of 400 nm measured before and after heating at 85° C. for 1008 hours is preferably 6% or lower and more preferably 3% or lower, the change rate being expressed by the above-described expression. In addition, a change rate of an absorbance at a wavelength of 800 nm measured before and after heating at 85° C. for 1008 hours is preferably 6% or lower and more preferably 3% or lower, the change rate being expressed by the above-described expression.

In the near infrared cut filter according to the present invention, a change rate of an absorbance at a wavelength of 800 nm measured before and after dipping in methyl propylene glycol at 25° C. for 2 minutes is preferably 6% or lower and more preferably 3% or lower, the change rate being expressed by the following expression.

Change Rate (%) of Absorbance at Wavelength of 800 nm=|(Absorbance at Wavelength of 800 nm before Test-Absorbance at Wavelength of 800 nm after Test)/Absorbance at Wavelength of 800 nm before Test|×100(%)

The near infrared cut filter according to the present invention may further include an ultraviolet-infrared reflection film or an ultraviolet absorbing layer. By the near infrared cut filter including the ultraviolet-infrared reflection film, an effect of improving incidence angle dependency can be obtained. The details of the ultraviolet-infrared reflection film can be found in the description of a reflecting layer described in paragraphs "0033" to "0039" of JP2013-68688A and paragraphs "0110" to "0114" of WO2015/099060, the contents of which are incorporated herein by reference. By including the ultraviolet absorbing layer, a near infrared cut filter having excellent ultraviolet shielding properties can be obtained. The details of the ultraviolet absorbing layer can be found in the description of an absorbing layer described in paragraphs "0040" to "0070" and paragraphs "0119" of "0145" of WO2015/099060, the content of which is incorporated herein by reference.

The near infrared cut filter according to the present invention can be used, for example, as a lens that has a function of absorbing and cutting near infrared light (a camera lens for a digital camera, a mobile phone, or a vehicle-mounted camera, or an optical lens such as an a f-θ lens or a pickup lens), an optical filter for a semiconductor light receiving element, a near infrared absorbing film or a near infrared absorbing plate that shields heat rays for energy saving, an agricultural coating agent for selective use of sunlight, a recording medium using heat absorbed from near infrared light, a near infrared light for an electronic apparatus or a picture, an eye protector, sunglasses, a heat ray shielding film, a filter for reading and recording an optical character, a filter for preventing classified documents from being copied, an electrophotographic photoreceptor, or a filter for laser welding. In addition, the near infrared cut filter according to the present invention is also useful as a noise cut filter for a CCD camera or a filter for a CMOS image sensor.

<Method of Manufacturing Near Infrared Cut Filter>

The near infrared cut filter according to the present invention can be manufactured using the above-described near infrared absorbing composition according to the present invention. Specifically, the near infrared cut filter according to the present invention can be manufactured through a step of applying the near infrared absorbing composition according to the present invention to a support or the like to form a film and a step of drying the film. The thickness and a laminate structure are not particularly limited and can be appropriately selected depending on the purpose. In addition, a step of forming a pattern may be further performed.

In the step of forming the film, as a method of applying the near infrared absorbing composition, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using metal or the like; and a nanoimprint lithography method. The application method using an ink jet method is not particularly limited as long as the near infrared absorbing composition can be jetted using this method, and examples thereof include a method (in particular, pp. 115 to 133) described in "Extension of Use of Ink Jet —Infinite Possibilities in Patent-" (February, 2005, S.B. Research Co., Ltd.) and methods described in JP2003-262716A, JP2003-185831A, JP2003-261827A, JP2012-126830A, and JP2006-169325A in which a composition to be jetted is replaced with the near infrared absorbing composition according to the present invention.

In a case where the drop casting method is used, it is preferable that a drop range of the near infrared absorbing composition in which a photoresist is used as a partition wall is formed on the support such that a film having a predetermined uniform thickness can be obtained. A desired thickness can be obtained by adjusting the drop amount and concentration of solid contents of the near infrared absorbing composition and the area of the drop range. The thickness of the dried film is not particularly limited and can be appropriately selected depending on the purpose.

The support may be a transparent substrate such as glass. In addition, the support may be a solid image pickup element. In addition, the support may be another substrate that is provided on a light receiving side of a solid image pickup element. In addition, the support may be a planarizing layer or the like that is provided on a light receiving side of a solid image pickup element.

In the step of drying the film, drying conditions vary depending on the kinds of the respective components and the solvent, ratios therebetween, and the like. For example, it is preferable that the film is dried at a temperature of 60° C. to 150° C. for 30 seconds to 15 minutes.

Examples of a method used in the step of forming a pattern include a method including: a step of applying the near infrared absorbing composition according to the present invention to a support or the like to form a composition layer having a film shape; a step of exposing the composition layer in a pattern shape; and a step of forming a pattern by removing a non-exposed portion by development. In the step of forming a pattern, a pattern may be formed using a photolithography method or using a dry etching method. In a case where a pattern is formed using a photolithography method, an alkaline aqueous solution obtained by diluting an alkaline agent with pure water is preferably used as a developer. A concentration of the alkaline agent in the alkaline aqueous solution is preferably 0.001 to 10 mass % and more preferably 0.01 to 1 mass %. From the viewpoint of easiness of transport, storage, and the like, the developer may be obtained by temporarily preparing a concentrated solution and diluting the concentrated solution to a necessary dilution factor during use. The dilution factor is not particularly limited and, for example, can be set to be in a range of 2 to 50 times.

The method of manufacturing a near infrared cut filter may include other steps. The other steps are not particularly limited and can be appropriately selected depending on the purpose. Examples of the other steps include a substrate surface treatment step, a pre-heating step (pre-baking step), a curing step, and a post-heating step (post-baking step).

<<Pre-Heating Step and Post-Heating Step>>

A heating temperature in the pre-heating step and the post-heating step is preferably 80° C. to 200° C. The upper limit is preferably 150° C. or lower. The lower limit is preferably 90° C. or higher. In addition, a heating time in the pre-heating step and the post-heating step is preferably 30 seconds to 240 seconds. The upper limit is preferably 180 seconds or shorter. The lower limit is preferably 60 seconds or longer.

<<Curing Step>>

In the curing step, the formed film is optionally cured. By curing the film, the mechanical strength of the near infrared cut filter is improved. The curing step is not particularly limited and can be appropriately selected depending on the purpose. For example, an exposure treatment or a heating treatment is preferably used. Here, in the present invention, "exposure" denotes irradiation of not only light at various wavelengths but also radiation such as an electron beam or an X-ray.

It is preferable that exposure is performed by irradiation of radiation. As the radiation which can be used for exposure, ultraviolet light such as an electron beam, KrF, ArF, a g-ray, a h-ray, or an i-ray or visible light is preferably used. Examples of an exposure type include exposure using a stepper and exposure using a high-pressure mercury lamp. The exposure dose is preferably 5 to 3000 $mJ/cm^2$. The upper limit is preferably 2000 $mJ/cm^2$ or lower and more preferably 1000 $mJ/cm^2$ or lower. The lower limit is preferably 10 $mJ/cm^2$ or higher and more preferably 50 $mJ/cm^2$ or higher. Examples of an exposure method include a method of exposing the entire area of the formed film. In a case where the near infrared absorbing composition includes a photopolymerizable compound (for example, a compound having an ethylenically unsaturated group), due to the exposure of the entire area, the curing of the photopolymerizable compound is accelerated, the curing of the film is further accelerated, and mechanical strength and durability are improved. An exposure device is not particularly limited and can be appropriately selected depending on the purpose, and examples thereof include an ultraviolet exposure device such as an ultrahigh pressure mercury lamp.

Examples of a method for the heat treatment include a method of heating the entire area of the formed film. Due to the heat treatment, the film hardness of the pattern is improved. The heating temperature is preferably 100° C. to 260° C. The lower limit is preferably 120° C. or higher and more preferably 160° C. or higher. The upper limit is preferably 240° C. or lower and more preferably 220° C. or lower. In a case where the heating temperature is in the above-described range, a film having excellent strength is likely to be obtained. The heating time is preferably 1 to 180 minutes. The lower limit is preferably 3 minutes or longer. The upper limit is preferably 120 minutes or shorter. A heater can be appropriately selected from well-known devices without any particular limitation, and examples thereof include a dry oven, a hot plate, and an infrared heater.

<Solid Image Pickup Element and Camera Module>

A solid image pickup element according to the present invention includes the near infrared cut filter according to the present invention. In addition, a camera module according to the present invention includes the near infrared cut filter according to the present invention.

FIG. 1 is a schematic cross-sectional view showing a configuration of a camera module including a near infrared cut filter according to an embodiment of the present invention.

A camera module 10 shown in FIG. 1 includes: a solid image pickup element 11; a planarizing layer 12 that is provided on a main surface side (light receiving side) of the solid image pickup element; a near infrared cut filter 13; and a lens holder 15 that is disposed above the near infrared cut filter and has an imaging lens 14 in an internal surface. In the camera module 10, an incidence ray hv incident from the outside reaches an image pickup element portion of the solid image pickup element 11 after sequentially passing through the imaging lens 14, the near infrared cut filter 13, and the planarizing layer 12.

For example, the solid image pickup element 11 includes a photodiode, an interlayer insulator (not shown), a base layer (not shown), color filters 17, an overcoat (not shown), and microlenses 18 that are formed in this order on a main surface of a substrate 16. The color filters 17 (a red color filter, a green color filter, a blue color filter) and the microlenses 18 are disposed respectively corresponding to the solid image pickup element 11. In addition, instead of providing the near infrared cut filter 13 on the surface of the planarizing layer 12, the near infrared cut filter 13 may be formed on a surface of the microlenses 18, between the base layer and the color filters 17, or between the color filters 17 and the overcoat. For example, the near infrared cut filter 13 may be provided at a position at a distance of less than 2 mm (more preferably 1 mm) from the surfaces of the microlenses. By providing the near infrared cut filter at this position, the step of forming the near infrared cut filter can be simplified, and unnecessary near infrared light for the microlens can be sufficiently cut. Therefore, infrared shielding properties can be further improved.

The near infrared cut filter according to the present invention has excellent heat resistance and thus can be provided for a solder reflow step. By manufacturing a camera module through the solder reflow step, automatic packaging of an electronic component packaging substrate or the like where soldering is required to be performed can be realized, and thus productivity can be significantly improved compared to a case where the solder reflow step is not used. Further, since automatic packaging can be performed, the cost can be reduced. In a case where the near infrared cut filter according to the present invention is provided for the solder reflow step, the near infrared cut filter is exposed to a temperature of about 250° C. to 270° C. Therefore, it is preferable that the near infrared cut filter has enough heat resistance to withstand the solder reflow step (hereinafter, also referred to as "solder reflow resistance"). In this specification, "having solder reflow resistance" represents that the properties as the near infrared cut filter can be maintained before and after heating at 180° C. for 1 minute. It is preferable that the properties as the near infrared cut filter can be maintained before and after heating at 230° C. for 10 minutes. It is more preferable that the properties as the near infrared cut filter can be maintained before and after heating at 250° C. for 3 minutes. In a case where the near infrared cut filter does not have solder reflow resistance, when the near infrared cut filter is held under the above-described conditions, infrared shielding properties may deteriorate, or a function as a film may be insufficient.

The camera module according to the present invention may further include an ultraviolet absorbing layer. According to this aspect, ultraviolet shielding properties can be improved. The details of the ultraviolet absorbing layer can be found in paragraphs "0040" to "0070" and paragraphs "0119" of "0145" of WO2015/099060, the content of which is incorporated herein by reference. In addition, the camera module may further include an ultraviolet-infrared reflection film described below. Both the ultraviolet absorbing layer and the ultraviolet-infrared reflection film may be used in combination, or only one of the ultraviolet absorbing layer or the ultraviolet-infrared reflection film may be used.

Figure 2:
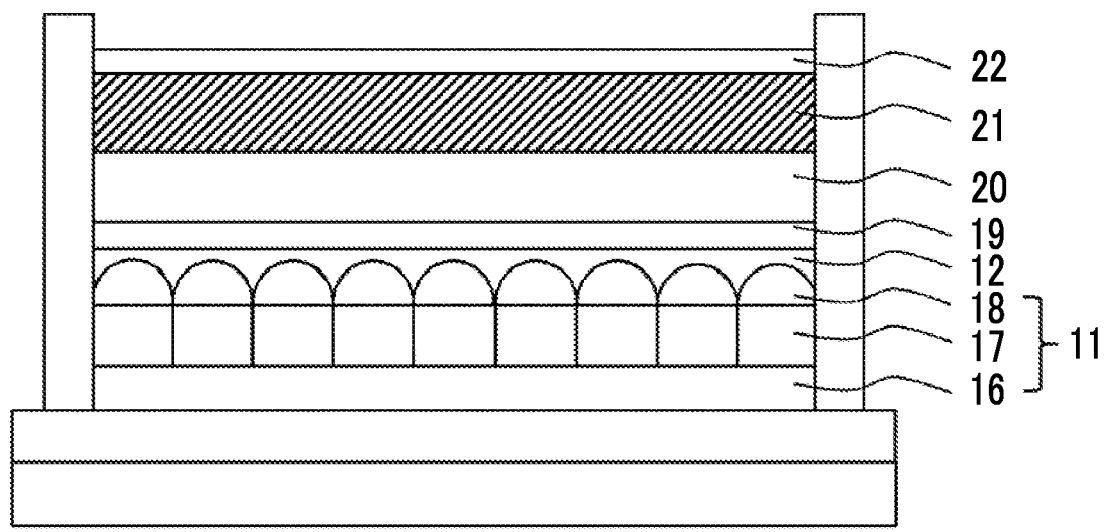
FIG. 2 is a schematic cross-sectional view showing an example of the vicinity of the near infrared cut filter in the camera module.
Figure 3:
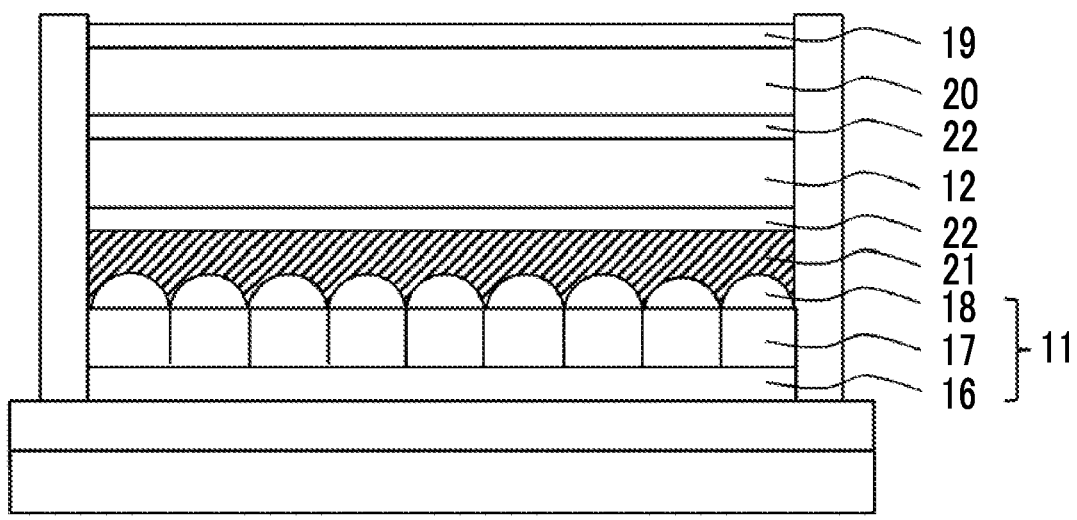
FIG. 3 is a schematic cross-sectional view showing an example of the vicinity of the near infrared cut filter in the camera module.
Figure 4:
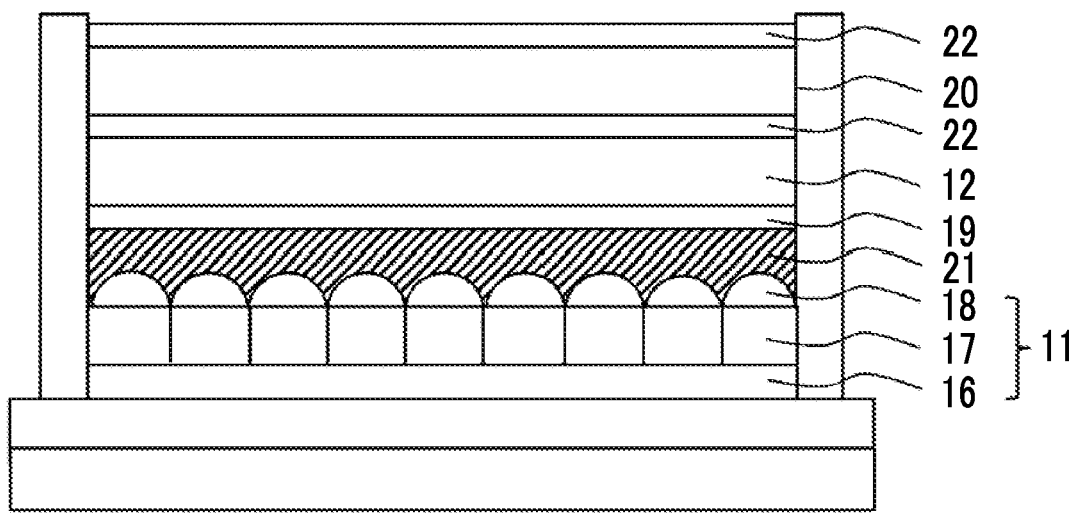
FIG. 4 is a schematic cross-sectional view showing an example of the vicinity of the near infrared cut filter in the camera module.

FIGS. 2 to 4 are schematic cross-sectional views showing an example of the vicinity of the near infrared cut filter in the camera module.

As shown in FIG. 2, the camera module includes the solid image pickup element 11, the planarizing layer 12, an ultraviolet-infrared reflection film 19, a transparent substrate 20, a near infrared light absorbing layer (near infrared cut filter) 21, and an antireflection layer 22 in this order. The ultraviolet-infrared reflection film 19 has an effect of imparting or improving a function of the near infrared cut filter. For example, the details of the ultraviolet-infrared reflection film 19 can be found in paragraphs "0033" to "0039" of JP2013-

68688A and paragraphs "0110" to "0114" of WO2015/099060, the content of which is incorporated herein by reference. The transparent substrate 20 allows transmission of light in a visible range. For example, the details of the transparent substrate 20 can be found in paragraphs "0026" to "0032" of JP2013-68688A, the content of which is incorporated herein by reference. The near infrared light absorbing layer 21 can be formed by applying the near infrared absorbing composition according to the present invention. The antireflection layer 22 has a function of preventing reflection of light incident on the near infrared cut filter to improve the transmittance and to effectively utilize the incidence ray. For example, the details of the antireflection layer 22 can be found in paragraph "0040" of JP2013-68688A, the content of which is incorporated herein by reference.

As shown in FIG. 3, the camera module may include the solid image pickup element 11, the near infrared light absorbing layer (near infrared cut filter) 21, the antireflection layer 22, the planarizing layer 12, the antireflection layer 22, the transparent substrate 20, and the ultraviolet-infrared reflection film 19 in this order.

As shown in FIG. 4, the camera module may include the solid image pickup element 11, the near infrared light absorbing layer (near infrared cut filter) 21, the ultraviolet-infrared reflection film 19, the planarizing layer 12, the antireflection layer 22, the transparent substrate 20, and an antireflection layer 22 in this order.

<Image Display Device>

An image display device according to the present invention includes the near infrared cut filter according to the present invention. The near infrared cut filter according to the present invention can also be used in an image display device such as a liquid crystal display device or an organic electroluminescence (organic EL) display device. For example, by using the near infrared cut filter in combination with the respective colored pixels (for example, red, green, blue), the near infrared cut filter can be used for the purpose of shielding infrared light included in light emitted from a backlight (for example, a white light emitting diode (white LED)) of a display device to prevent a malfunction of a peripheral device, or for the purpose of forming an infrared pixel in addition to the respective color display pixels.

The definition of a display device and the details of each display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques".

The image display device may include a white organic EL element. It is preferable that the white organic EL element has a tandem structure. The tandem structure of the organic EL element is described in, for example, JP2003-45676A, or pp. 326-328 of "Forefront of Organic EL Technology Development-Know-How Collection of High Brightness, High Accuracy, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

<Weight-Average Molecular Weight (Mw)>

The weight-average molecular weight (Mw) was a value measured by gel permeation chromatography (GPC) using the following method.

Device name: HLC-8220 GPC (manufactured by Tosoh Corporation)

Detector: a refractive Index (RI) detector

Column: a column in which a guard column HZ-L, Tsk gel Super HZM-M, TSK gel Super HZ4000, TSK gel Super HZ3000, and TSK gel Super HZ2000 (all of which are manufactured by Tosoh Corporation) connected to each other Eluent: tetrahydrofuran (including a stabilizer)

Column temperature: 40° C.

Injection volume: 10 μL

Analysis time: 26 min

Flow rate:

0.35 ml/min (sample pump)

0.20 mL/min (reference pump)

Calibration curve base resin: polystyrene

<Glass Transition Temperature of Resin>

The glass transition temperature of a resin was measured using a differential scanning calorimeter (DSC1000, manufactured by Seiko Instruments Inc.) after weighing 5 mg of a sample in a sample pan and heating the polymer from −20° C. to 200° C. at a temperature increase rate of 10° C./min in a nitrogen stream. The average value of a temperature at which the baseline starts to deviate and a temperature at which the curve returns to a new baseline was set as the glass transition temperature (Tg).

In a case where the resin has a crosslinking group, the glass transition temperature was measured using a resin (sample) having a structure in which the crosslinking group of the resin was substituted with a hydrogen atom.

<Preparation of Near Infrared Absorbing Composition>

Materials shown below were mixed in mixing amounts shown below in a table to prepare a near infrared absorbing composition. In Example 26, resins A-1 and A-8 were used at a ratio of A-1/A-8=50/50 (mass ratio). In addition, in Example 27, resins X-1 and A-8 were used at a ratio of X-1/A-8=50/50 (mass ratio). In Example 29, resins A-6 and A-8 were used at a ratio of A-6/A-8=50/50 (mass ratio).

(Composition 1)

Infrared absorber shown in the following table: 40 parts by mass

Resin shown in the following table: 44.95 parts by mass

Crosslinking compound shown in the following table: 10 parts by mass

Catalyst: aluminum tris(2,4-pentanedionate) (manufactured by Tokyo Chemical Industry Co., Ltd.): 0.05 parts by mass Heat stability imparting agent: IRGACURE OXE01 (manufactured by BASF SE): 5.0 parts by mass Solvent: cyclohexanone: 200 parts by mass (Composition 2)

Infrared absorber shown in the following table: 40 parts by mass

Resin shown in the following table: 54.95 parts by mass

Catalyst: aluminum tris(2,4-pentanedionate) (manufactured by Tokyo Chemical Industry Co., Ltd.): 0.05 parts by mass Heat stability imparting agent: IRGACURE OXE01 (manufactured by BASF SE): 5.0 parts by mass Solvent: cyclohexanone: 200 parts by mass (Composition 3)

Infrared absorber shown in the following table: 4 parts by mass

Resin shown in the following table: 90.95 parts by mass

Catalyst: aluminum tris(2,4-pentanedionate) (manufactured by Tokyo Chemical Industry Co., Ltd.): 0.05 parts by mass Heat stability imparting agent: IRGACURE OXE01 (manufactured by BASF SE): 5.0 parts by mass Solvent: cyclohexanone: 200 parts by mass (Composition 4)

Infrared absorber shown in the following table: 40 parts by mass

Resin shown in the following table: 54.95 parts by mass

Catalyst: aluminum tris(2,4-pentanedionate) (manufactured by Tokyo Chemical Industry Co., Ltd.): 0.05 parts by mass Heat stability imparting agent: IRGACURE OXE01 (manufactured by BASF SE): 5.0 parts by mass Solvent: butyl acetate: 200 parts by mass

TABLE 1

|  | | Resin | | Near Infrared Absorbing | Cross-linking |
|---|---|---|---|---|---|
|  | Composition | No. | Tg | Colorant | Agent |
| Example 1 | Composition 1 | A-1 | D | B-1 | M-2 |
| Example 2 | Composition 1 | A-2 | A | B-1 | M-2 |
| Example 3 | Composition 2 | A-3 | A | B-1 | None |
| Example 4 | Composition 2 | A-4 | B | B-1 | None |
| Example 5 | Composition 2 | A-5 | B | B-1 | None |
| Example 6 | Composition 2 | A-6 | A | B-1 | None |
| Example 7 | Composition 2 | A-7 | A | B-1 | None |
| Example 8 | Composition 2 | A-8 | B | B-1 | None |
| Example 9 | Composition 2 | A-9 | B | B-1 | None |
| Example 10 | Composition 2 | A-10 | A | B-1 | None |
| Example 11 | Composition 2 | A-11 | C | B-1 | None |
| Example 12 | Composition 2 | A-12 | A | B-1 | None |
| Example 13 | Composition 2 | A-13 | D | B-1 | None |
| Example 14 | Composition 2 | A-7 | A | B-2 | None |
| Example 15 | Composition 2 | A-7 | A | B-3 | None |
| Example 16 | Composition 3 | A-7 | A | B-4 | None |
| Example 17 | Composition 3 | A-7 | A | B-5 | None |
| Example 18 | Composition 3 | A-7 | A | B-6 | None |
| Example 19 | Composition 3 | A-7 | A | B-7 | None |
| Example 20 | Composition 3 | A-7 | A | B-8 | None |
| Example 21 | Composition 3 | A-7 | A | B-9 | None |
| Example 22 | Composition 1 | A-7 | A | B-1 | M-1 |
| Example 23 | Composition 1 | A-7 | A | B-1 | M-2 |
| Example 24 | Composition 1 | A-7 | A | B-1 | M-3 |
| Example 25 | Composition 1 | A-7 | A | B-1 | M-4 |
| Example 26 | Composition 1 | A-1/A-8 | D/B | B-1 | M-3 |
| Example 27 | Composition 1 | X-1/A-8 | E/B | B-1 | M-3 |
| Example 28 | Composition 4 | A-8 | B | B-1 | None |
| Example 29 | Composition 1 | A-6/A-8 | A/B | B-1 | M-3 |

TABLE 1-continued

|  | | Resin | | Near Infrared Absorbing | Cross-linking |
|---|---|---|---|---|---|
|  | Composition | No. | Tg | Colorant | Agent |
| Comparative Example 1 | Composition 2 | X-1 | E | B-2 | None |
| Comparative Example 2 | Composition 2 | X-2 | E | B-2 | None |

Materials shown in the table are as follows. In the following resins, numerical values added to main chains represent mass ratios.

(Resin)

A-1: the following structure (Mw=15000, Tg=D)
A-2: the following structure (Mw=15000, Tg=A)
A-3: the following structure (Mw=16000, Tg=A)
A-4: the following structure (Mw=15000, Tg=B)
A-5: the following structure (Mw=15000, Tg=B)
A-6: the following structure (Mw=15000, Tg=A)
A-7: the following structure (Mw=15000, Tg=A)
A-8: the following structure (Mw=18000, Tg=B)
A-9: the following structure (Mw=15000, Tg=B)
A-10: the following structure (Mw=15000, Tg=A)
A-10: the following structure (Mw=15000, Tg-C)
A-12: the following structure (Mw=15000, Tg=A)
A-13: the following structure (Mw=15000, Tg=D)
X-1: the following structure (Mw=15000, Tg=E)
X-2: the following structure (Mw=15000, Tg=E)

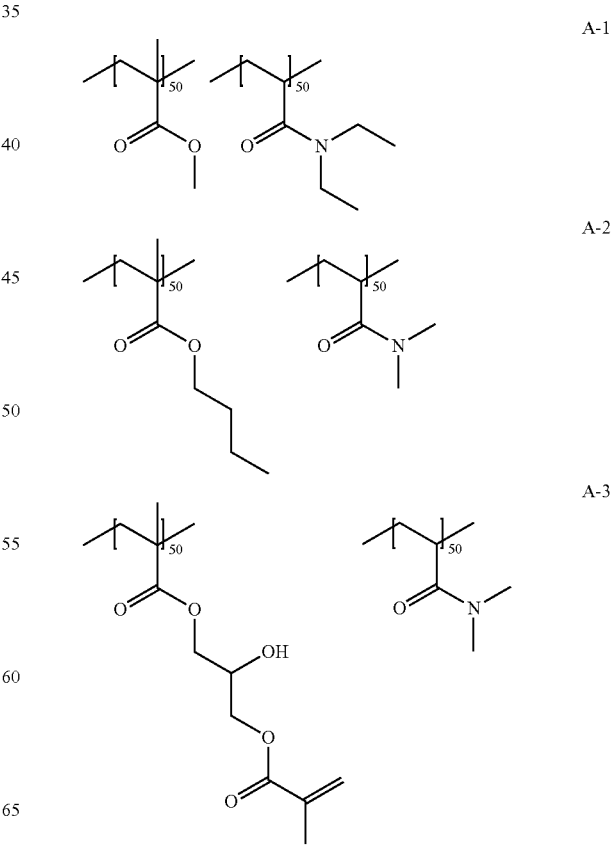

A-4
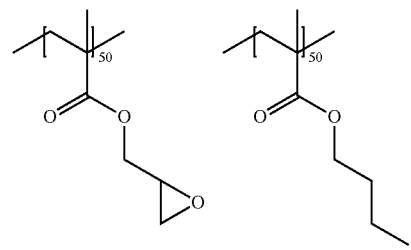
A-5
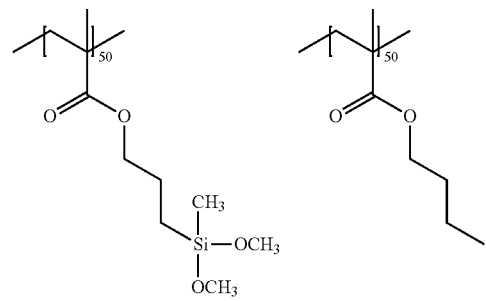
A-6
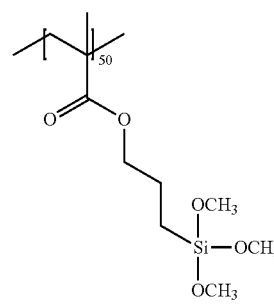
A-7
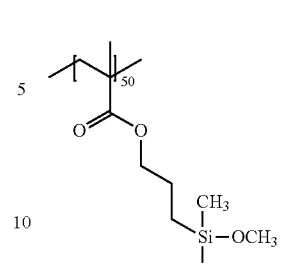
A-8
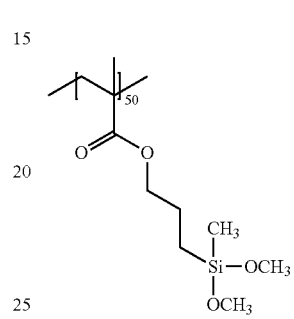
A-9
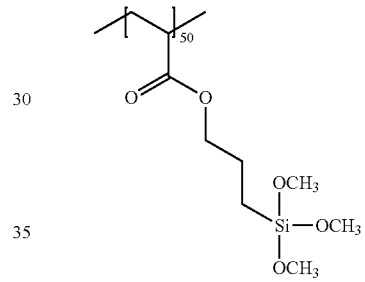
A-10
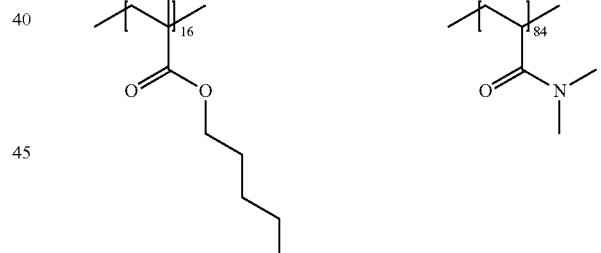
A-11
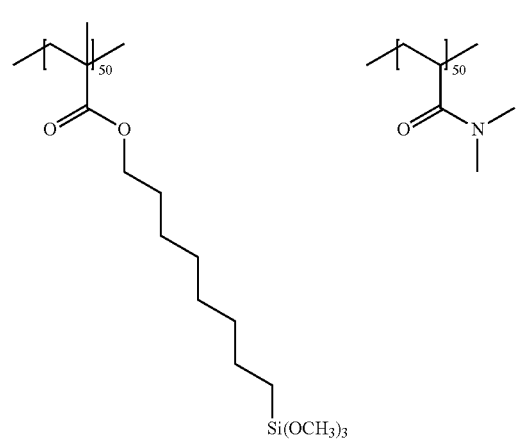
A-12
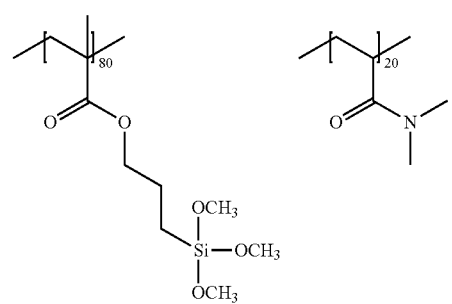
A-13

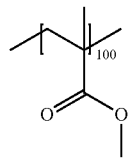
X-1

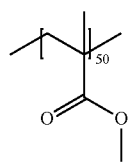 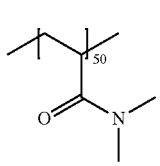
X-2

The glass transition temperature of a resin was measured using a differential scanning calorimeter (DSC1000, manufactured by Seiko Instruments Inc.) after weighing 5 mg of a sample in a sample pan and heating the polymer from −20° C. to 200° C. at a temperature increase rate of 10° C./min in a nitrogen stream. The average value of a temperature at which the baseline starts to deviate and a temperature at which the curve returns to a new baseline was set as the glass transition temperature (Tg).

In the resins A-3 to A-13 having a crosslinking group, the glass temperatures were measured using the following resins A-3a to A-13a as samples. That is, Tg of the resins A-3a to A-13a were defined as Tg of the resins A-3 to A-13.

In addition, in the resins A-1, A-2, X-1, and X-2 not having a crosslinking group, Tg was measured using the resins as samples

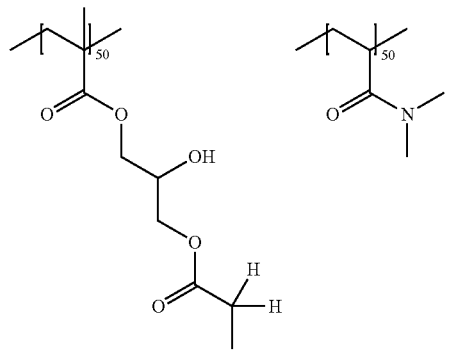
A-3a

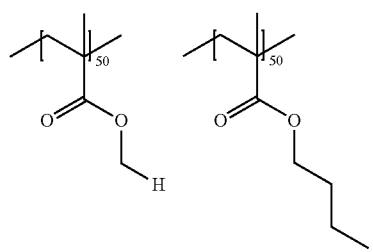
A-4a

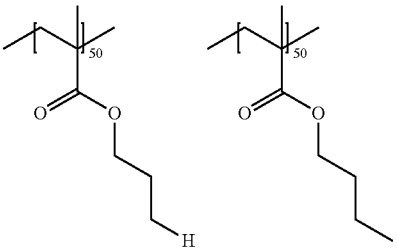
A-5a

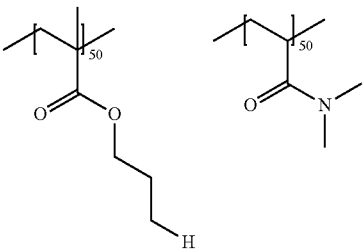
A-6a

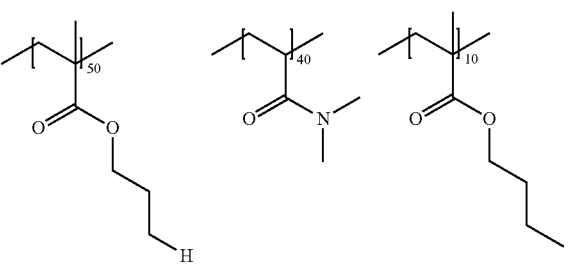
A-7a

A-8a

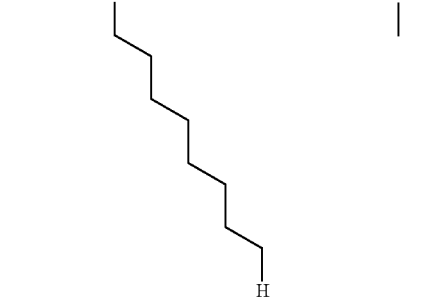

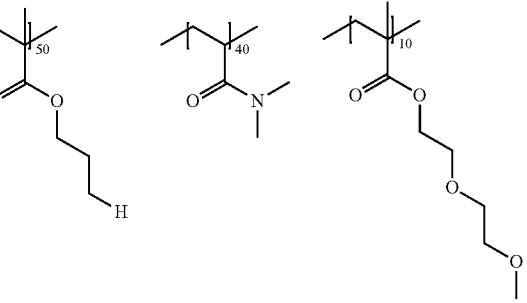
A-9a

-continued

A-10a
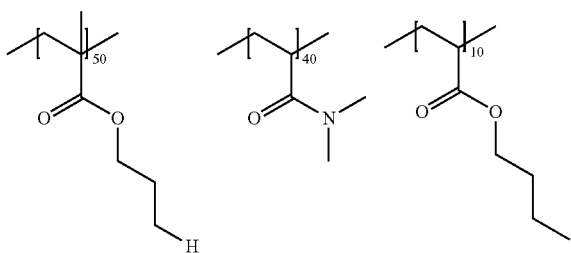

A-11a
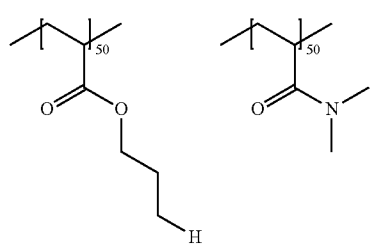

A-12a
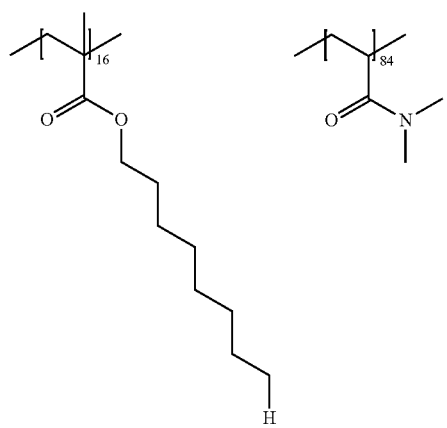

A-13a
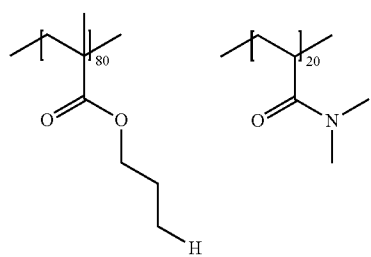

The Tg ranges of the resins are as follows.
A: 50° C. to 75° C.
B: 20° C. or higher and lower than 50° C.
C: 0° C. or higher and lower than 20° C.
D: higher than 75° C. and lower than 100° C.
E: 100° C. or higher (Infrared Absorber)

B-1: the following structure (copper complex)

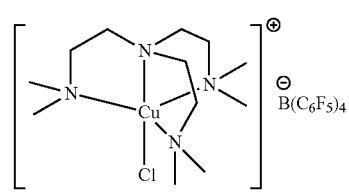

The following compound (A2-14) and copper (II) chloride dihydrate (manufactured by Wako Pure Chemical Industries, Ltd.) were mixed with each other in methanol at a molar ratio of 1:1 and were stirred for 10 minutes. This reaction solution was dried under a reduced pressure to obtain solid matter. The obtained solid matter was dissolved in water, and an excess amount of a lithium tetrakis(pentafluorophenyl)borate (manufactured by Tokyo Chemical Industry Co., Ltd.) aqueous solution was added while stirring them. The precipitated solid was collected by filtration. As a result, B-1 was obtained.

(A2-14)

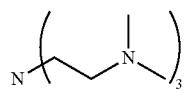

B-2: a copper complex including the following compound as a ligand

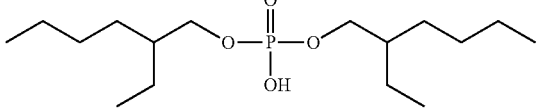

B-3: a copper complex including the following compound as a ligand

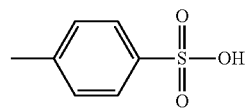

B-4: the following compound
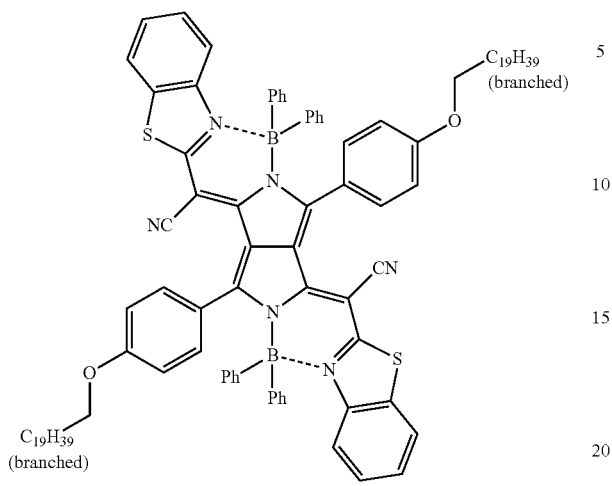
The compound B-4 was synthesized according to the following scheme.
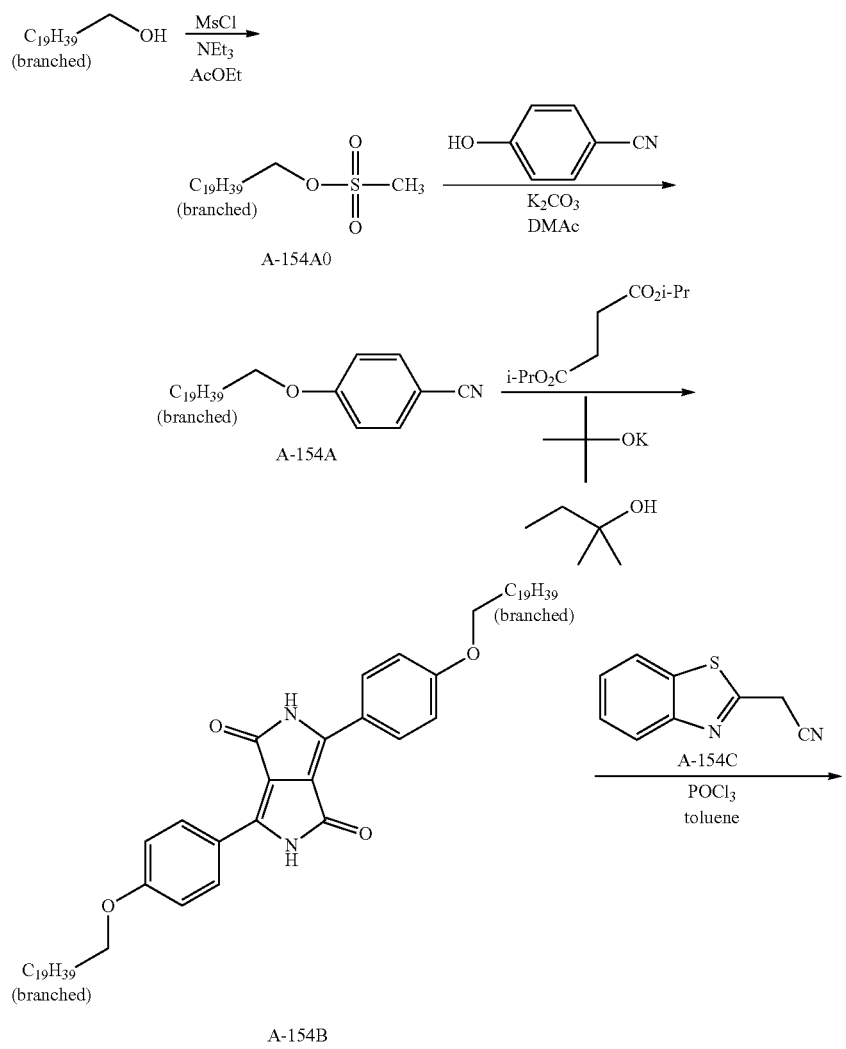

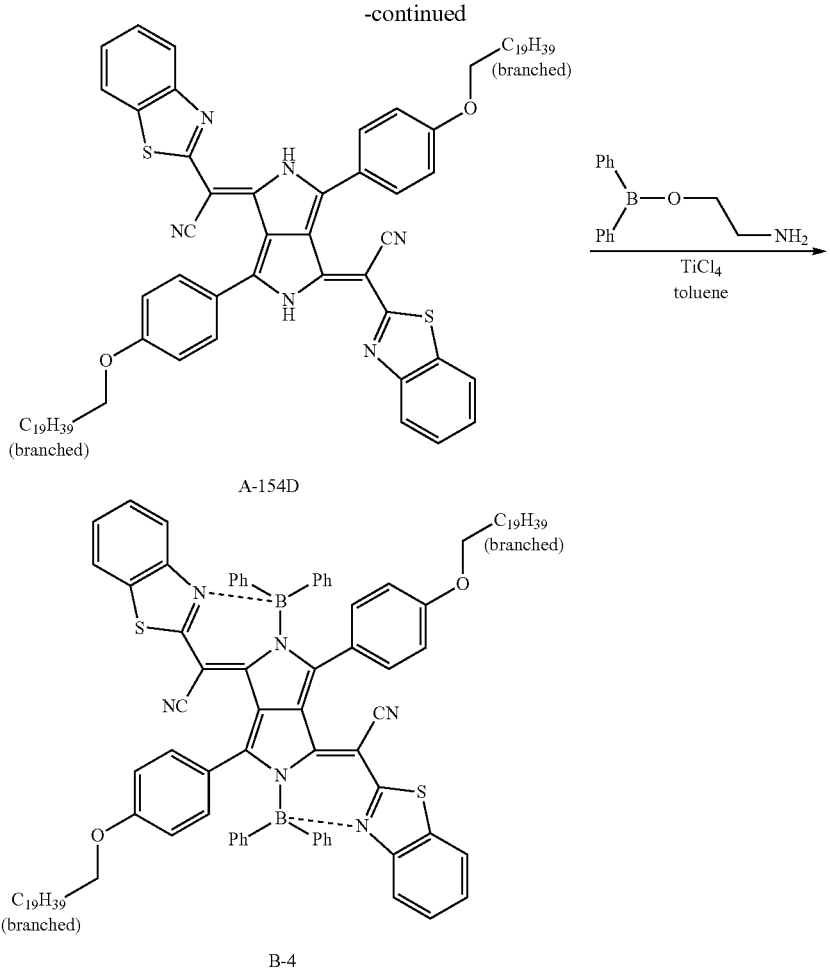

A-154D

B-4

20.0 parts by mass of isoeicosanol (FINEOXOCOL 2000, manufactured by Nissan Chemical Industries Ltd.) and 8.13 parts by mass of triethylamine were stirred in 40 parts by mass of ethyl acetate, and 8.44 parts by mass of methanesulfonyl chloride was added dropwise at −10° C. After completion of the dropwise addition, a reaction was caused to occur at 30° C. for 2 hours. The organic layer was extracted by liquid separation operation, and the solvent was removed under reduced pressure. As a result, 25.5 parts by mass of a light yellow liquid (A-154A0 form) was obtained.

7.82 parts by mass of 4-cyanophenol and 10.1 parts by mass of potassium carbonate were stirred in 25 parts by mass of dimethylacetamide, 25.5 parts by mass of the synthesized D-154A0 form was added, and a reaction was caused to occur at 100° C. for 6 hours. The organic layer was extracted by liquid separation operation, the organic layer was washed with a sodium hydroxide aqueous solution, and the solvent was removed under reduced pressure. As a result, 25.8 parts by mass of a light yellow liquid (A-154A form) was obtained.

$^1$H-NMR (CDCl$_3$): δ0.55-0.96 (m, 18H), 0.96-2.10 (m, 21H), 3.88 (m, 2H), 6.93 (d, 2H), 7.56 (d, 2H)

A diketo pyrrolo pyrrole compound (A-154B form) was synthesized from 13.1 parts by mass of the synthesized A-154A form using a method described in U.S. Pat. No. 5,969,154A. As a result, 7.33 parts by mass of an orange solid (A-154B form) was obtained.

$^1$H-NMR (CDCl$_3$): δ0.55-0.96 (m, 36H), 0.96-2.10 (m, 42H), 3.95 (m, 4H), 7.06 (d, 4H), 8.30 (d, 4H), 8.99 (brs, 2H)

7.2 parts by mass of the A-154B form and 3.42 parts by mass of 2-(2-benzothiazolyl)acetonitrile were stirred in 30 parts by mass of toluene, 10.0 parts by mass of phosphorus oxychloride was added, and the components were heated to reflux for 5 hours. The organic layer was extracted by liquid separation operation, the organic layer was washed with a sodium bicarbonate aqueous solution, and the solvent was removed under reduced pressure.

The obtained crude product was purified by silica gel column chromatography (solvent: chloroform) and was recrystallized using a chloroform/acetonitrile solution. As a result, 5.73 parts by mass of a green solid (A-154D form) was obtained.

$^1$H-NMR (CDCl$_3$): δ0.55-1.00 (m, 36H), 1.00-2.10 (m, 42H), 3.97 (m, 4H), 7.11 (d, 4H), 7.28 (t, 2H), 7.43 (t, 2H), 7.67-7.75 (m, 6H), 7.80 (d, 2H), 13.16 (s, 2H)

2.53 parts by mass of diphenylborinic acid 2-aminoethyl ester and 70 parts by mass of toluene were stirred at 40° C., 3.56 parts by mass of titanium chloride was added, and a reaction was caused to occur for 30 minutes. 5.60 parts by mass of the A-154D form was added, and the solution was heated to reflux at an outside temperature of 130° C. for 1 hour. The solution was cooled to room temperature, 80 parts by mass of methanol was added to precipitate crystals, and the precipitated crystals were separated by filtration. The obtained crude crystals were purified by silica gel column chromatography (solvent: chloroform) and were recrystallized using a toluene/methanol solution. As a result, 3.87 parts by mass of green crystals (B-4) as a target compound were obtained.

λmax of B-4 in chloroform was 780 nm. The molar absorption coefficient in chloroform was $2.21 \times 10^5$ dm$^3$/mol·cm.

$^1$H-NMR (CDCl$_3$): δ0.55-1.01 (m, 36H), 1.01-2.10 (m, 42H), 3.82 (m, 4H), 6.46 (s, 8H), 6.90-7.05 (m, 6H), 7.07-7.19 (m, 12H), 7.21-7.29 (m, 8H), 7.32 (d, 2H)

B-5 to B-9: the following compounds As B-5, B-8, and B-9, compounds which were commercially available from Tokyo Chemical Industry Co., Ltd. were used. B-6 was synthesized using a method described in JP2002-194040A. B-7 was synthesized using a method described in JP2008-528706A.

B-5

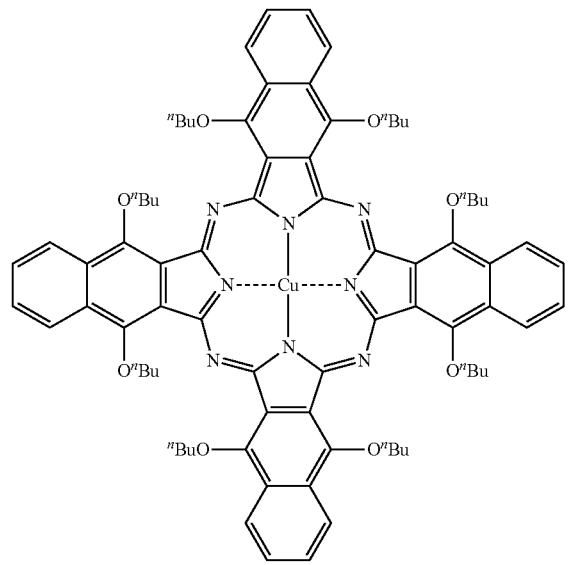

B-6

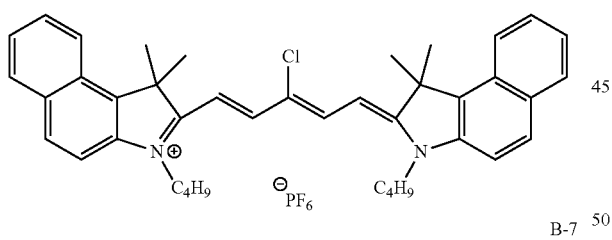

B-7

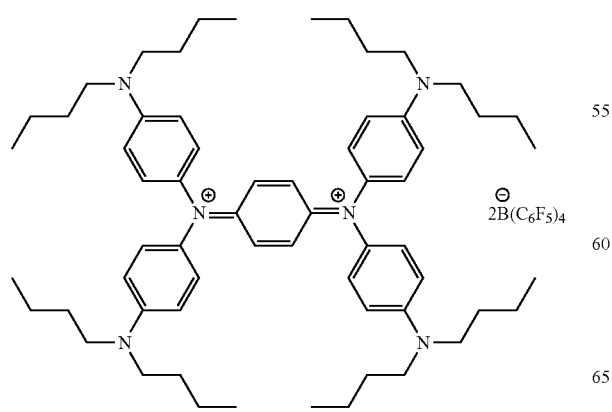

B-8

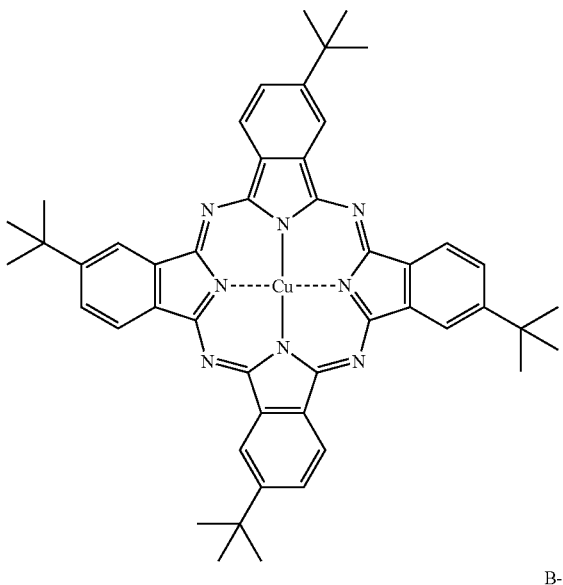

B-9

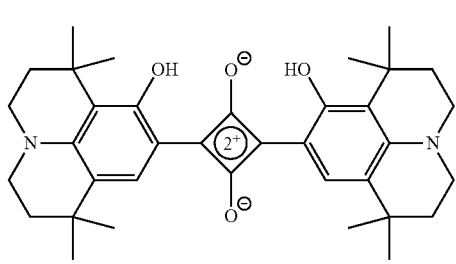

(Crosslinking Compound)

M-1: the following structure (a mixture of a compound represented by the left formula and a compound represented by the right formula at a mass ratio of 7:3)

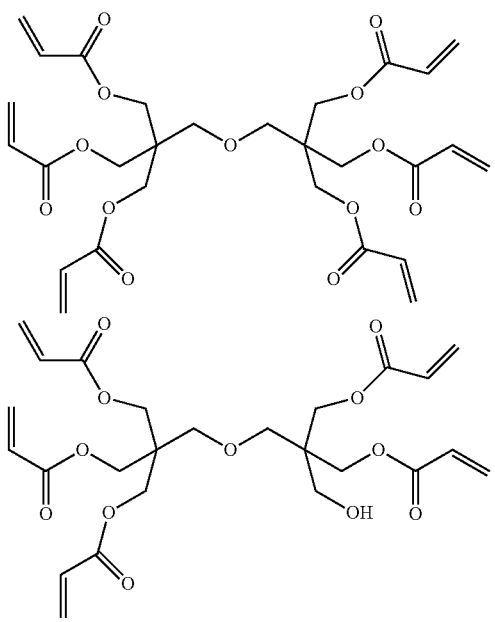

M-2: the following structure (EHPE 3150, manufactured by Daicel Corporation)

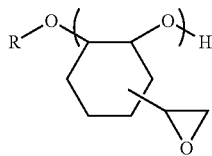

M-3: the following structure (KBM-3066, manufactured by Shin-Etsu Chemical Co., Ltd.)

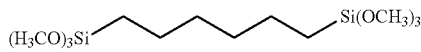

M-4: the following structure (KBM-9659, manufactured by Shin-Etsu Chemical Co., Ltd.)

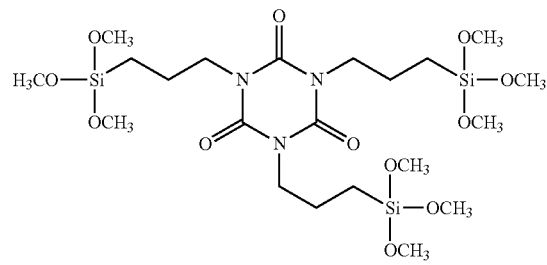 [SMILES: CO[Si](CCCn1c(=O)n(CCC[Si](OC)(OC)OC)c(=O)n(CCC[Si](OC)(OC)OC)c1=O)(OC)OC]

<Preparation of Near Infrared Cut Filter>

A near infrared cut filter was prepared using the near infrared absorbing composition.

The obtained near infrared absorbing composition was applied to a glass wafer using a spin coater such that the thickness of the dried coating film was 100 µm, and then was heated using a hot plate at 150° C. for 1.5 hours. As a result, a near infrared cut filter was manufactured.

<Evaluation of Performance>

(Thermal Shock Resistance)

The near infrared cut filter was put into a freezer at 40° C. for 5 minutes, was extracted from the freezer, and then was put into an oven at 100° C. for 5 minutes. This operation was repeated (−40° C. to 100° C.) until a film surface defect occurred. The number of repetitions was set as an index indicating the thermal shock resistance, and the thermal shock resistance was evaluated based on the following criteria. The film surface defect represents cracking, fogging, or peeling.

A: 100 times or more
B: 80 times or more and less than 100 times
C: 50 times or more and less than 80 times
D: less than 50 times (Compatibility)

In the manufactured near infrared cut filter, the degree of precipitates was evaluated by visual inspection.

A: no precipitates were found
B: precipitates accounted for higher than 0% and 10% or lower with respect to the total area of the composition applied to a glass wafer
C: precipitates accounted for higher than 10% and 30% or lower with respect to the total area of the composition applied to a glass wafer
D: precipitates accounted for higher than 30% with respect to the total area of the composition applied to a glass wafer (Heat Resistance)

The near infrared cut filter was left to stand at 180° C. for 1 minute. Before and after heating, the absorbance of the near infrared cut filter at a wavelength of 400 nm and the absorbance of the near infrared cut filter at a wavelength of 800 nm were measured, a change rate of the absorbance at each of the wavelengths was obtained from the following expression, and the heat resistance was evaluated based on the following criteria. In order to measure the absorbance, a spectrophotometer U-4100 (manufactured by Hitachi High-Technologies Corporation) was used.

Change Rate (%) of Absorbance at Wavelength of 400 nm=|(Absorbance at Wavelength of 400 nm before Heating−Absorbance at Wavelength of 400 nm after Heating)/Absorbance at Wavelength of 400 nm before Heating|×100(%)

Change Rate (%) of Absorbance at Wavelength of 800 nm=|(Absorbance at Wavelength of 800 nm before Heating−Absorbance at Wavelength of 800 nm after Heating)/Absorbance at Wavelength of 800 nm before Heating|×100(%)

A: Change Rate of Absorbance≤3%
B: 3%<Change Rate of Absorbance≤6%
C: 6%<Change Rate of Absorbance≤10%
D: 10%<Change Rate of Absorbance <Low-Temperature Heat Resistance>

The near infrared cut filter was left to stand at 85° C. for 1008 hours. Before and after heating, the absorbance of the near infrared cut filter at a wavelength of 400 nm and the absorbance of the near infrared cut filter at a wavelength of 800 nm were measured, a change rate of the absorbance at each of the wavelengths was obtained from the following expression, and the low-temperature heat resistance was evaluated based on the following criteria. In order to measure the absorbance, a spectrophotometer U-4100 (manufactured by Hitachi High-Technologies Corporation) was used.

Change Rate (%) of Absorbance at Wavelength of 400 nm=|(Absorbance at Wavelength of 400 nm before Heating−Absorbance at Wavelength of 400 nm after Heating)/Absorbance at Wavelength of 400 nm before Heating|×100(%)

Change Rate (%) of Absorbance at Wavelength of 800 nm=|(Absorbance at Wavelength of 800 nm before Heating−Absorbance at Wavelength of 800 nm after Heating)/Absorbance at Wavelength of 800 nm before Heating|×100(%)

A: Change Rate of Absorbance≤3%
B: 3%<Change Rate of Absorbance≤6%
C: 6%<Change Rate of Absorbance≤10%
D: 10%<Change Rate of Absorbance (Solvent Resistance)

Each of the near infrared cut filters was dipped in methyl propylene glycol (MFG) at 25° C. for 2 minutes. Before and after the solvent resistance test, the absorbance of the near infrared cut filter at a wavelength of 800 nm was measured, a change rate of the absorbance at a wavelength of 800 nm was obtained from the following expression, and the solvent resistance was evaluated based on the following criteria. In order to measure the absorbance, a spectrophotometer U-4100 (manufactured by Hitachi High-Technologies Corporation) was used.

Change Rate (%) of Absorbance at Wavelength of 800 nm=|(Absorbance at Wavelength of 800 nm before Test-Absorbance at Wavelength of 800 nm after Test)/Absorbance at Wavelength of 800 nm before Test|×100(%)

A: Change Rate of Absorbance≤3%
B: 3%<Change Rate of Absorbance≤6%
C: 6%<Change Rate of Absorbance≤10%
D: 10%<Change Rate of Absorbance

TABLE 2

| | Evaluation of Performance | | | | | |
|---|---|---|---|---|---|---|
| | Thermal Shock Resistance | Compatibility | Heat Resistance (400 nm) | Heat Resistance (800 nm) | Solvent Resistance | Low-Temperature Heat Resistance |
| Example 1 | C | C | B | B | C | C |
| Example 2 | C | A | A | A | C | C |
| Example 3 | B | A | A | A | B | C |
| Example 4 | B | C | B | B | B | B |
| Example 5 | A | C | B | B | A | A |
| Example 6 | B | A | A | A | A | A |
| Example 7 | A | A | A | A | A | A |
| Example 8 | A | A | A | A | A | A |
| Example 9 | A | A | A | A | A | A |
| Example 10 | A | A | B | B | A | A |
| Example 11 | B | A | B | B | A | A |
| Example 12 | B | A | B | B | B | B |
| Example 13 | B | B | B | B | A | A |
| Example 14 | A | A | A | A | A | A |
| Example 15 | A | A | A | A | A | A |
| Example 16 | A | A | B | A | A | A |
| Example 17 | A | A | B | A | A | A |
| Example 18 | A | A | B | A | A | A |
| Example 19 | A | A | B | A | A | A |
| Example 20 | A | A | B | A | A | A |
| Example 21 | A | A | B | B | A | A |
| Example 22 | B | A | A | A | B | B |
| Example 23 | B | A | A | A | B | B |
| Example 24 | A | A | A | A | A | A |
| Example 25 | A | A | A | A | A | A |
| Example 26 | A | A | A | A | B | B |
| Example 27 | B | A | B | B | B | B |
| Example 28 | A | A | A | A | A | A |
| Example 29 | A | A | A | A | A | A |
| Comparative Example 1 | D | D | D | D | D | D |
| Comparative Example 2 | D | C | C | C | D | D |

As can be seen from Table 2, in Examples, thermal shock resistance was excellent. Further, heat resistance and solvent resistance were also excellent. On the other hand, in Comparative Examples, thermal shock resistance was poor.

Even in a case where B-1 was replaced with the following copper complex B-10 or B-11 in Examples 1 to 13 and 22 to 29, the same effects as those of Examples 1 to 13 and 22 to 29 were obtained.

Even in a case where half amount of B-1 was replaced with one of B-2 to B-11 in Example 7, the same effects as those of Example 7 were obtained.

Even in a case where half amount of M-2 was replaced with M-1, M-3, or M-4 in Example 7, the same effects as those of Example 7 were obtained.

Even in a case where half amount of cyclohexanone was replaced with propylene glycol monomethyl ether acetate in Example 7, the same effects as those of Example 7 were obtained.

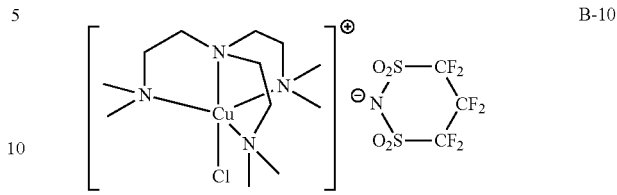

B-10

-continued

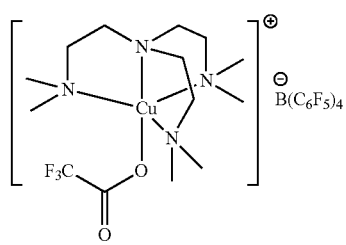

B-11

Synthesis of B-10

A copper complex B-10 was synthesized using the same method as that of B-1, except that potassium 1,1,2,2,3,3-hexafluoropropane-1,3-bis(sulfonyl)imide (manufactured by Mitsubishi Materials Corporation) was used instead of lithium tetrakis(pentafluorophenyl)borate. By adding water dropwise after the reaction, the solid sufficiently precipitated. Therefore, the solution was concentrated under a reduced pressure at 70° C. and was cooled to 0° C. As a result, crystals of B-10 were obtained.

Synthesis of B-11

0.60 g of basic copper carbonate (copper content: 56.2%, manufactured by Kanto Chemical Co., Inc.) and 15 mL of water were put into a three-neck flask, 1.24 g of trifluoroacetic acid was added dropwise while stirring them at room temperature, 5 mL of methanol was added, and the solution was stirred at 60° C. for 30 minutes. 1.34 g of tris[2-(dimethylamino)ethyl]amine (manufactured by Tokyo Chemical Industry Co., Ltd.) was added dropwise to the solution, 5 mL of methanol was added, the solution was stirred at 0° C. for 30 minutes, and 50 mL of methanol was further added. 3.56 g of lithium tetrakis(pentafluorophenyl) borate (water content: 8.0 wt %, manufactured by Tosoh Finechem Corporation) was dissolved in 10 mL of methanol, this solution was added dropwise to the reaction solution, and the solution was stirred at 60° C. for 30 minutes. 35 mL of water was added dropwise to the obtained solution, and the precipitated solid was collected by filtration. As a result, B-11 was obtained as a blue solid.

EXPLANATION OF REFERENCES

10: camera module
11: solid image pickup element
12: planarizing layer
13: near infrared cut filter
14: imaging lens
15: lens holder
16: silicon substrate
17: color filter
18: microlens
19: ultraviolet-infrared reflection film
20: transparent substrate
21: near infrared light absorbing layer
22: antireflection layer

What is claimed is:

1. A near infrared absorbing composition comprising:
a resin A that satisfies the following condition a1;
an infrared absorber B; and
a solvent D,
wherein the resin A comprises a repeating unit having a crosslinking group, and the content of the repeating unit having a crosslinking group in the resin A is 10 to 90 mass % with respect to the total mass of all the repeating units of the resin A,
condition a1: a glass transition temperature of a resin having a structure in which a portion which forms a crosslinking bond in the crosslinking group of the resin A is substituted with a hydrogen atom is 0° C. to 100° C., the glass transition temperature being measured by differential scanning calorimetry.

2. The near infrared absorbing composition according to claim 1,
wherein the resin A includes a repeating unit derived from a monomer component; and a homopolymer of the monomer has a glass transition temperature of 70° C. or lower.

3. The near infrared absorbing composition according to claim 1,
wherein the crosslinking group is at least one selected from the group consisting of a group having an ethylenically unsaturated bond, a cyclic ether group, and an alkoxysilyl group.

4. The near infrared absorbing composition according to claim 1,
wherein the crosslinking group is an alkoxysilyl group.

5. The near infrared absorbing composition according to claim 1,
wherein a weight-average molecular weight of the resin A is 1,000 to 300,000.

6. The near infrared absorbing composition according to claim 1,
wherein the resin A has an alkoxysilyl group, and
a silicon valence of the resin A is 1.0 to 3.0 mmol/g.

7. The near infrared absorbing composition according to claim 1,
wherein the near infrared absorbing composition comprises the compound C,
the compound C is a compound having an alkoxysilyl group, and
a silicon valence of the compound C is 3.0 to 8.0 mmol/g.

8. The near infrared absorbing composition according to claim 1,
wherein a content of the compound C is 1 to 60 parts by mass with respect to 100 parts by mass of the resin A.

9. The near infrared absorbing composition according to claim 1,
wherein the infrared absorber B is at least one selected from the group consisting of a copper compound, a cyanine compound, a pyrrolopyrrole compound, a squarylium compound, a phthalocyanine compound, and a naphthalocyanine compound.

10. The near infrared absorbing composition according to claim 1,
wherein the infrared absorber B is a copper compound, and
the copper compound is a copper complex which includes a compound having four or five sites coordinating to copper as a ligand.

11. The near infrared absorbing composition according to claim 1, which is a composition for forming a near infrared cut filter.

12. A near infrared cut filter which is obtained by using the near infrared absorbing composition according to claim 1.

13. A method of manufacturing a near infrared cut filter, the method comprising:
applying the near infrared absorbing composition according to claim 1 to a support to form a film, and
drying the film.

14. A solid image pickup element comprising:
the near infrared cut filter according to claim 12.

15. A camera module comprising:
the near infrared cut filter according to claim 12.

16. An image display device comprising:
the near infrared cut filter according to claim 12.

17. The near infrared absorbing composition according to claim 1,
wherein the content of the infrared absorber is 30 to 85 mass % with respect to the total solid content of the near infrared absorbing composition.

18. The near infrared absorbing composition according to claim 1,
wherein the infrared absorber B is a copper compound, and
wherein the resin A comprises the repeating unit having a crosslinking group and a repeating unit represented by Formula (A1-3);

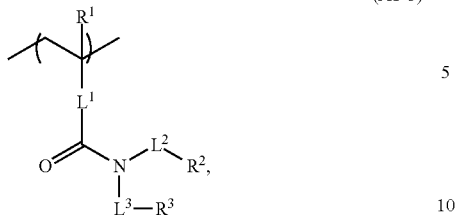
(A1-3)
wherein $R^1$ represents a hydrogen atom or an alkyl group, $L^1$ to $L^3$ each independently represents a single bond or a divalent linking group, $R^2$ and $R^3$ each independently represents a hydrogen atom, an aliphatic hydrocarbon group, or an aromatic group.
* * * * *